United States Patent [19]

Kobayashi et al.

[11] Patent Number: 5,146,259
[45] Date of Patent: Sep. 8, 1992

[54] ELECTRONICALLY CONTROLLED CAMERA INCLUDING AUTOMATIC SHUTTER SPEED CHANGING APPARATUS

[75] Inventors: Takeo Kobayashi; Takao Nishida; Yasushi Tabata; Norio Numako; Katsutoshi Nagai, all of Tokyo, Japan

[73] Assignee: Asahi Kogaku Kogyo Kabushiki Kaisha, Tokyo, Japan

[21] Appl. No.: 478,350

[22] Filed: Feb. 12, 1990

Related U.S. Application Data

[63] Continuation-in-part of Ser. No. 374,346, Jun. 30, 1989, abandoned.

[30] Foreign Application Priority Data

| Jun. 30, 1988 | [JP] | Japan | 63-87118 |
| Jun. 30, 1988 | [JP] | Japan | 63-87119 |
| Jun. 30, 1988 | [JP] | Japan | 63-87120 |
| Jun. 30, 1988 | [JP] | Japan | 63-163895 |
| Jun. 30, 1988 | [JP] | Japan | 63-163896 |
| Jun. 30, 1988 | [JP] | Japan | 63-163897 |
| Jun. 30, 1988 | [JP] | Japan | 63-163898 |
| Jun. 30, 1988 | [JP] | Japan | 63-163899 |
| Feb. 10, 1989 | [JP] | Japan | 1-31315 |
| Feb. 10, 1989 | [JP] | Japan | 1-31319 |

[51] Int. Cl.$^5$ .............................. G03B 7/00
[52] U.S. Cl. ................. 354/456; 354/195.1
[58] Field of Search ............. 354/435–440, 354/456–464, 258.1, 234.1, 235.1, 195.1, 195.12, 410, 444, 441, 442, 443, 445, 145.1, 455

[56] References Cited

U.S. PATENT DOCUMENTS

| Re. 29,599 | 3/1978 | Ogawa | 354/400 |
| 3,555,984 | 1/1971 | Rentschler | 354/456 X |
| 3,917,395 | 11/1975 | Ogawa | 354/402 |
| 4,179,201 | 12/1979 | Kurei et al. | 354/444 |
| 4,191,460 | 3/1980 | Fujiki | 354/409 |
| 4,285,585 | 8/1981 | Numata | 354/456 |
| 4,329,029 | 5/1982 | Haskell | 354/443 |
| 4,398,127 | 8/1983 | Bahn et al. | 354/145.1 X |
| 4,402,586 | 9/1983 | Ichiyanagi | 354/402 |
| 4,482,234 | 11/1984 | Takagi | 354/402 |
| 4,544,249 | 10/1985 | Maemori | 354/195.12 |
| 4,777,508 | 10/1988 | Aoshima et al. | 354/195.1 X |
| 4,970,541 | 11/1990 | Nakai et al. | 354/455 X |

FOREIGN PATENT DOCUMENTS

| 189981 | 8/1986 | European Pat. Off. |
| 203747 | 12/1986 | European Pat. Off. |
| 981228 | 1/1965 | United Kingdom |
| 1417214 | 12/1975 | United Kingdom |
| 1494011 | 12/1977 | United Kingdom |
| 2020051 | 11/1979 | United Kingdom |
| 2080557 | 2/1982 | United Kingdom |
| 8102067 | 7/1981 | World Int. Prop. O. |

*Primary Examiner*—W. B. Perkey
*Attorney, Agent, or Firm*—Sandler, Greenblum, & Bernstein

[57] ABSTRACT

An electronically controlled camera having a zoom function for changing a focal length of a taking lens and a manual function which is able to select the shutter speed by the manual operation when the camera is in a manual mode, shutter speed automatic changing apparatus automatically changes the shutter speed in the direction for reducing the changing amount of the Full-open Aperture F-number which is changed in accordance with the change of the focal length so that the exposure value becomes a predetermined value in accordance with the reference shutter speed at a time when said reference shutter speed is selected in the manual mode and said focal length is changed by said zoom function.

10 Claims, 38 Drawing Sheets

FIG. 8

| exposure system (indication) | MODE A | shooting system (indication) | MODE B |
|---|---|---|---|
| auto | 0 | frame by frame shooting | 0 |
| strobe ON ⚡ | 1 | rapid-sequence shooting | 1 |
| strobe OFF | 2 | self timer | 2 |
| exposure correction | 3 | double self timer | 3 |
| bulb B | 4 | multiplex shooting ME | 4 |
| bulb & strobe ON B ⚡ | 5 | interval INT | 5 |

Switch OFF Judge 1 : SWS, SWR, WIDE, TELE, MDA, MDB, MDC, MCRO all off ? When OFF, FBWOFF←1, used on mode setting.

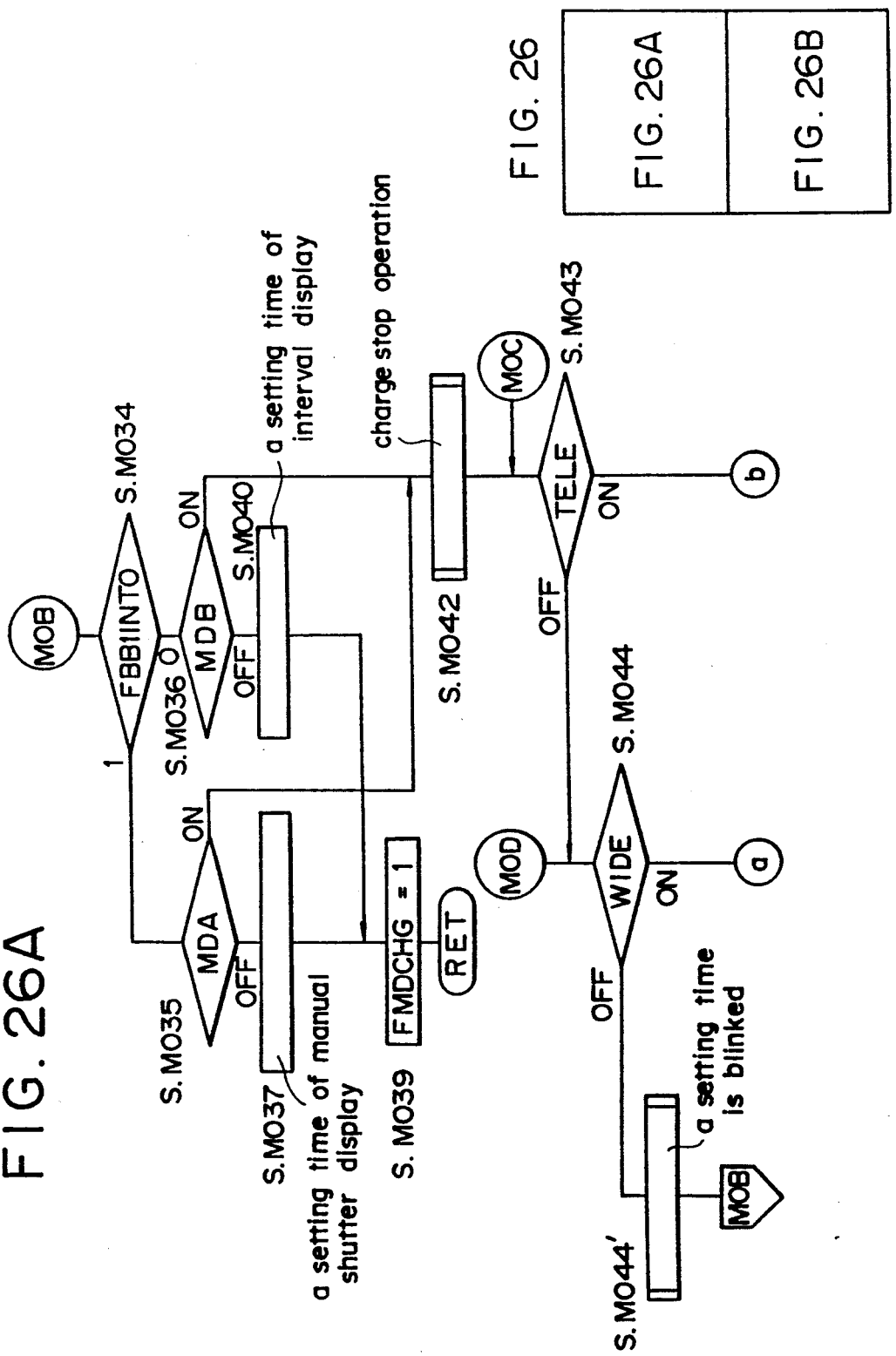

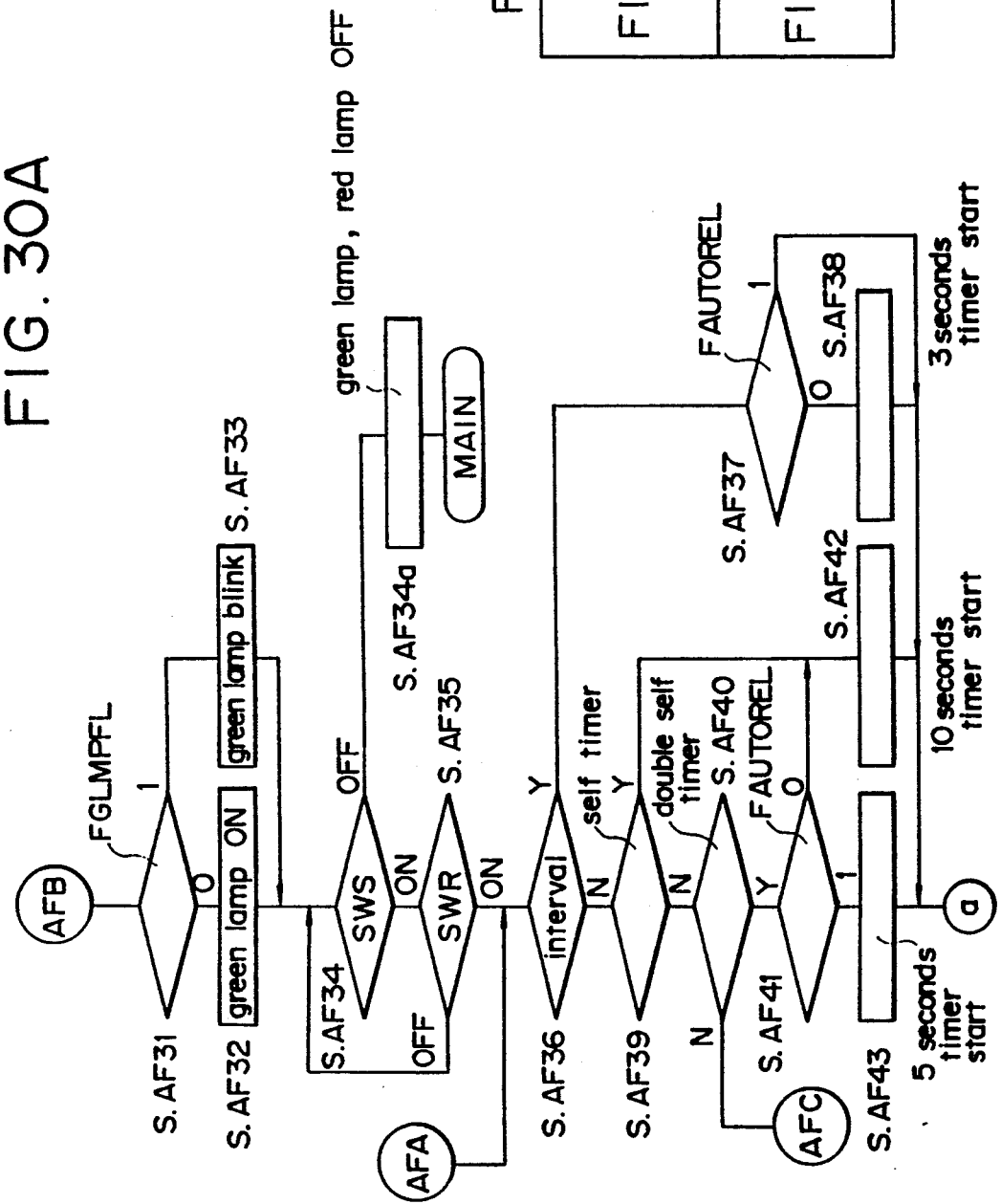

ELECTRONICALLY CONTROLLED CAMERA INCLUDING AUTOMATIC SHUTTER SPEED CHANGING APPARATUS

This is a continuation-in-part application of U.S. patent application Ser. No. 07/374,346, filed on June 30, 1989, now abandoned, and entitled "Electronically Controlled Camera Having Macro and Normal Operational Modes", which is hereby expressly incorporated by reference in its entirety.

BACKGROUND OF THE INVENTION

This invention relates to an improvement for an electronically controlled camera having a zoom function for changing a focal length of a taking lens and a manual function that is able to select the shutter speed of the camera by a manual operation when the camera is in a manual mode.

PRIOR ART OF THE INVENTION

In recent times, an electronically controlled camera, which has a mode button for changing the mode of the camera, and which displays a mode mark showing a mode established by the mode button on a display portion, has been developed.

A camera of this type is designed such that a picture can be taken under various types of exposure modes and taking modes. This ability is very desirable.

One known electronically controlled camera has a zoom function and a manual function. In this electronically controlled camera, if the focal length is changed with the zoom mode after a reference shutter speed has been selected in the manual operation, a Full-open Aperture F-number is changed in accordance with the change of the focal length, and the exposure value corresponding to the reference shutter speed is changed in accordance with the change of the Full-open Aperture F-number. Therefore, in such an electronically controlled camera, even if an exposure value is established at a certain focal length by selecting the reference shutter speed through the manual operation, once the focal length is changed by a zoom operation, the exposure value corresponding to the reference shutter speed is changed. As a result, photograph having an intended brightness is unobtainable.

When photographs are taken by frequently changing the focal length, it is necessary to change the shutter speed every time the focal length is changed in order to obtain photographs of an intended brightness. However, it is almost impossible to realize this when a combination of a manual shutter speed with a taking lens is taken into consideration.

SUMMARY OF THE INVENTION

An object of the present invention is to provide an electronically controlled camera in which even if the focal length is changed later changed by a zoom operation after the manual shutter speed has been selected in a manual mode, the shutter speed is automatically changed in a direction for reducing the changing amount of a Full-open Aperture F-number in the zoom mode so that the exposure value becomes a predetermined value corresponding to the reference shutter speed selected by the manual mode, thereby enabling one to obtain a photograph having an intended desired brightness.

A feature of the present invention is the provision of a shutter speed automatic changing apparatus for automatically changing the shutter speed in the direction for reducing the changing amount of the Full-open Aperture F-number which is changed in accordance with the change of the focal length so that the exposure value becomes a predetermined value in accordance with the reference shutter speed at a time when the reference shutter speed is selected in the manual mode and the focal length is changed by the zoom function.

BRIEF DESCRIPTION OF THE DRAWINGS

FIG. 8 is a view for explaining a mode setting;
FIGS. 26A and 26B are flowcharts showing a MODE SETTING Operation;
FIGS. 30A and 30B are flowcharts showing an AEAF(AUTO EXPOSURE and AUTO FOCUS) CONTROL Operation;
FIG. 33 comprising

DETAILED DESCRIPTION OF THE EMBODIMENTS

In FIGS. 1-38, an embodiment of a camera constructed according to the present invention is illustrated.

Figure 1:
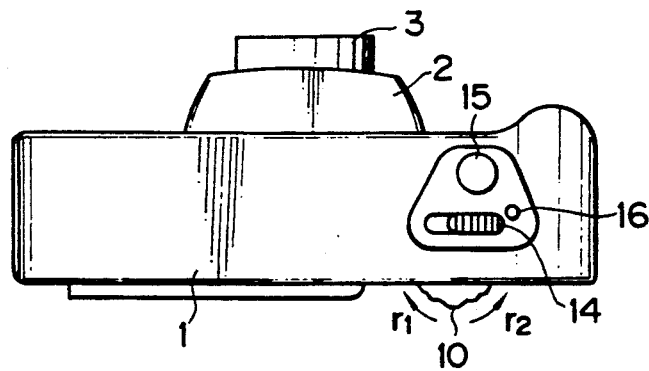
FIG. 1 is a plan view of a camera.
Figure 2:
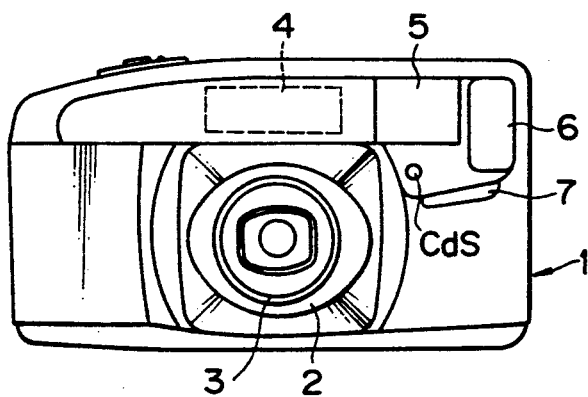
FIG. 2 is a front view of the camera.
Figure 3:
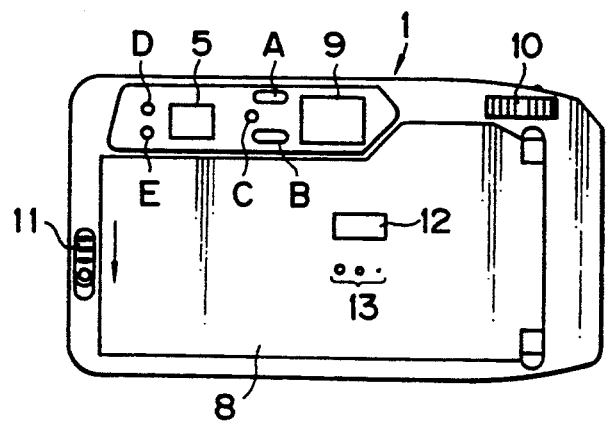
FIG. 3 is a rear view of the camera.
Figure 4:
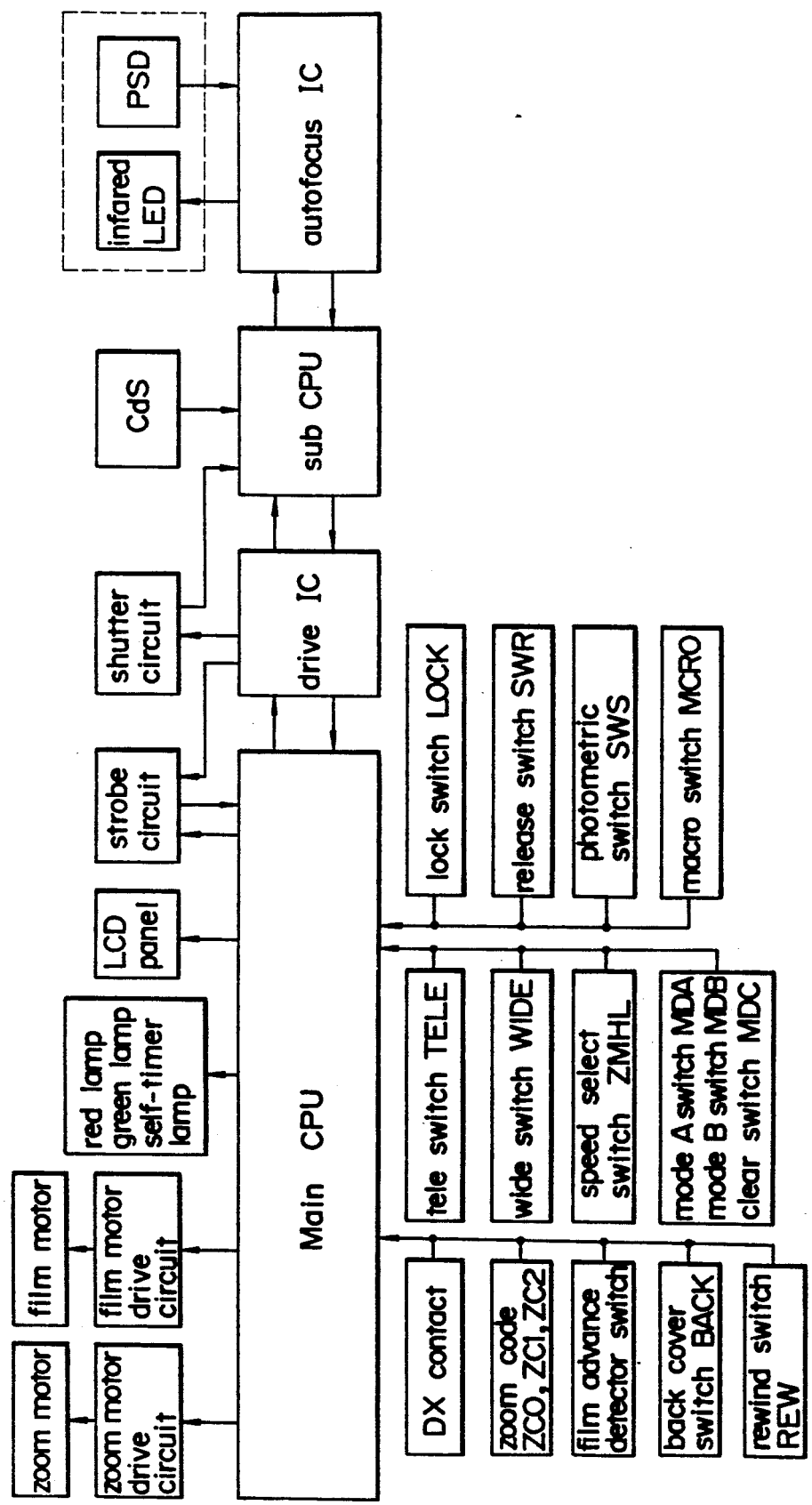
FIG. 4 is a block diagram of a control circuit.

A camera body 1 has a stationary barrel 2 and a moving barrel 3, as shown in FIG. 1. As shown in FIG. 2, the front of the camera body 1 contains a distance measurement section 4, a finder window 5, a strobe 6, a photometric element, such as a CdS (not numbered), and self-timer lamp 7. The back of the camera body 1, as shown in FIG. 3, contains a back cover 8, an LCD indicator 9, a first mode button A, a second mode button B, a clear button C, a zoom lever 10, a green lamp indicator (LED) D, a red lamp indicator (LED) E, a back cover release lever 11, a date display section 12 and a date switch 13.

When the back cover release lever 11 is moved from an upward stop position to a downward stop position, the back cover 8 opens. When the back cover 8 is opened, the back cover release lever 11 is in the downward stop position, while when the back cover 8 is closed, the back cover release lever 11 returns to its upward stop position.

A rewind button (not shown), is located on the bottom of the camera body 1.

The upper section of the camera body 1, as shown in FIG. 1, contains a lock lever 14, a shutter button 15 and a macro button 16. Lock lever 14 is slidable between an ON and OFF position.

Zoom lever 10 can be moved in a first (normal) direction, as indicated by arrow r1 in FIG. 1 and a second (reverse) direction, as indicated by arrow r2. The zoom lever 10 permits the camera lens to be moved between a wide extremity and a tele extremity. The zoom lever 10 is used to change both the manual shutter time and interval time, as will be discussed below. The light projecting angle of the strobe 6 is changed according to an angle of view which is changed by zooming of the taking lens.

The camera contains a control circuit comprising a main CPU, to which a sub CPU is connected which performs shutter-related processing in association with a drive IC. A single custom integrated circuit has been designed which contains the main CPU, sub CPU, drive IC, autofocus IC and other electronics.

The main CPU performs the following functions in response to input signals provided in the camera:

(1) Control the zoom motor and a film motor via a motor drive circuit;

(2) Control the illumination and blinding of the green lamp indicator D which provides distance measurement-related indication, a red lamp indicator E which provides a strobe-related indication, and a self-timer lamp which provides a self-timer related indication;

(3) Control the indication on the LCD 9; and (4) Control the charging of the stroke circuit.

Information is inputted to the main CPU by the following:

(1) Lock switch LOCK, which is set to ON when the lock lever 14 is set in its ON Position;

(2) Photometry switch SWS, which is set to ON when the shutter button 15 is depressed halfway;

(3) Release switch SWR, which is set to ON when the shutter button 15 is fully depressed;

(4) MACRO switch MCRO, which is set to ON when the macro button 16 is depressed;

(5) Zoom tele switch TELE, which is set to ON when the zoom lever 10 is displaced from a center, neutral position toward a tele side r2;

(6) Zoom wide switch WIDE, which is set to ON when the zoom lever 10 is displaced from a center, neutral position towards a wide side r1;

(7) Speed switch ZMHL, which is set to ON when the angle of the zoom lever 10 is displaced a small amount from the center, neutral position and is set to OFF when the zoom lever 10 is displaced from the center, neutral position by a large amount;

(8) Mode A switch MDA, mode B switch MDB and clear switch MDC, which are set to ON when the mode buttons A, B, C, respectively, are depressed;

(9) DX contact point, which reads a DX code printed on a film patron(cartridge).

(10) Zoom code inputs ZC0, CZ1, and ZC2, which are discussed in detail below;

(11) Back cover switch BACK, which is set to OFF when the back cover release lever 11 is pressed down and set to ON when the back cover 8 is closed and the lever returns to its lock position; and

(12) Rewind switch REW, which is set to ON when the rewind button is pressed.

Figure 5:
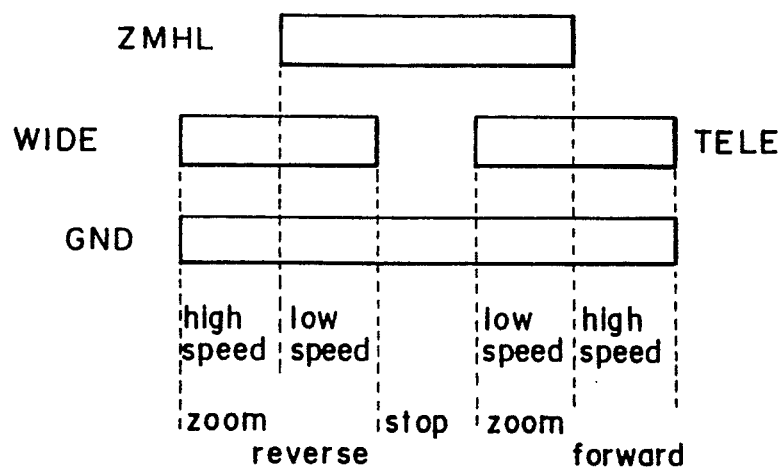
FIG. 5 is a view for explaining the construction of a contact of a zoom switch.

Three zoom-related switches TELE, WIDE and ZMHL are controlled by one zoom lever, the contact point layout being shown in FIG. 5. With these combinations, five conditions are inputted to the main CPU. The data is used for the zoom operation or mode setting. For example, when performing the zoom operation, the information for the normal or reverse speed is inputted to the main CPU.

The sub CPU controls the range finder, which comprises the infrared LED and position sensor PSD via an autofocus IC. The sub CPU transfers the distance measurement data from the autofocus IC and photometry data (according to the CdS) to the main CPU.

The drive IC controls the shutter circuit according to commands from the sub CPU and outputs a trigger signal to the strobe circuit.

Figure 6:
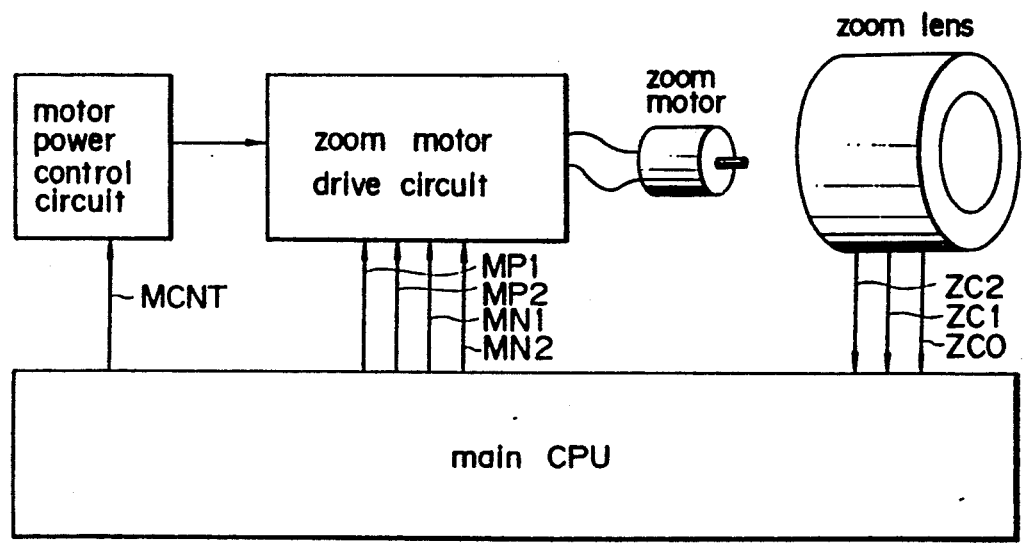
FIG. 6 is a block diagram of a zoom motor system.

Referring to FIG. 6, the main CPU outputs commands for the normal or reverse rotation of the zoom motor via four signal lines (MP1, MP2, MN1 and MN2) to the motor drive circuit.

A motor power control circuit, which supplies power to the motor drive circuit, switches between a high and low supply voltage according to the speed command input from the main CPU via signal line MCNT when MCNT is OFF, the battery voltage is supplied directly to the zoom motor drive circuit while, when MCNT is ON, the battery voltage is supplied after lowering the voltage to a specified value.

The details of these commands are shown in Table 1 below.

The zoom motor lets the focal length of a lens change to the tele extremity by shifting the moving barrel 3 in a direction so that it protrudes from the camera body via the cam ring when the normal rotation is executed. When the reverse rotation is executed, it lets the focal length of the taking lens change to the wide extremity by operating the moving barrel 3 in a reverse direction.

For this camera, the information which is indicative of the change in the focal length of the taking lens, changes by Fmin (Full-Open Aperture F-number) according to the change of the lens in the wide extremity, tele extremity, macro position, or lock position, etc., is automatically detected and each kind of controls are performed according to this information.

For this purpose, a code plate is attached to the surface of the cam ring of the lens and four brushes (ZC0, ZC1, ZC2, GND) contact the code plate. GND is a common terminal while the other three brushes are used for code detection.

Figure 7:
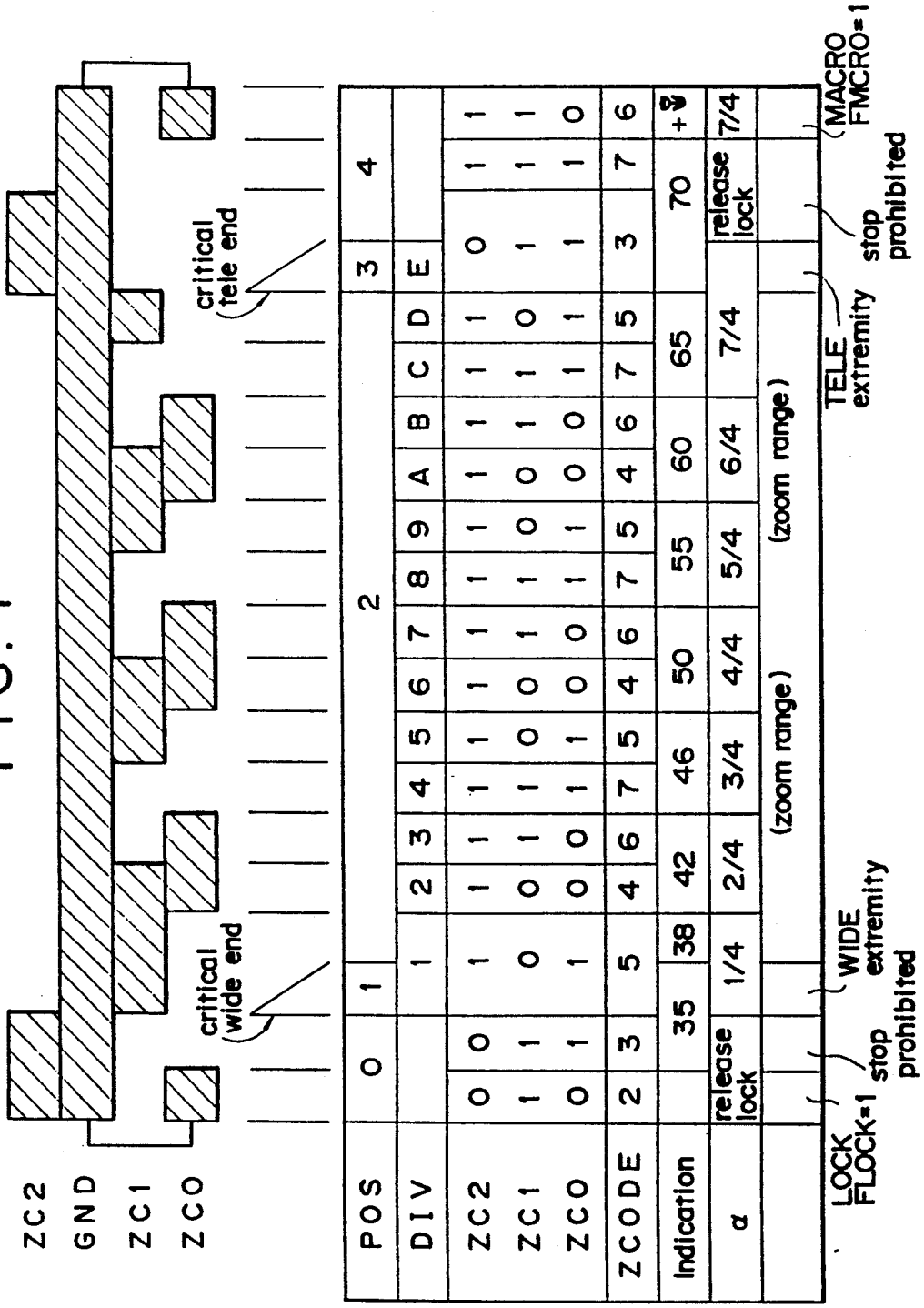
FIG. 7 is a developed view of a code plate showing the corresponding relation between the code plate and each code.

FIG. 7 shows a diagram of the code plate and each code produced when terminals ZC0, ZC1 and ZC2 are in contact with a continuity portion (also known as "traces") of the code plate shown by the oblique lines in the figure, wherein a signal "0" indicates a portion of the conductive trace is removed, while a signal of "1" indicates a portion of the conductive trace is not removed. In this description, a three-bit information code detected by the continuity relation between these terminals is known as a zoom code ZCODE.

A position code POS and division code DIV are defined according to the above-mentioned zoom code so as to control zooming.

The position code POS is used to distinguish five conditions of the taking lens in the position between the wide extremity and the lock position, the position of the wide extremity or tele extremity in the zoom area, and the position between the tele extremity and the macro position. The division code DIV is used to identify the lens position by dividing the zoom range into fourteen areas.

In FIG. 7, the portion where POS equals "1" and "3" is shown with a fixed width. POS equaling "1" is obtained when the lens is set to the wide extremity, namely, only at the moment that ZC1 is set from 1 to 0 (from OFF to ON). When the lens does not stop at the wide extremity, POS is switched from "0" to "2".

The lens is forbidden to stop in the area between the lock position and zoom area, as well as in the area between the zone area and macro extremity. However, when a terminal which is properly ON is detected as OFF, due to a bad contact between one brush and the code plate, the zoom motor may possibly stop in the forbidden area. Therefore, the code plate and software are constructed so that the change from OFF to ON of the specified terminals are used when detecting these borders. If this configuration is used, stopping in the forbidden area can be avoided, even if a brush floats because the terminal is OFF.

On the other hand, On the zoom area, fourteen divisions are used for the focal length of the lens, as mentioned above. In addition, terminal ZC2 is used to detect the tele extremity in the zoom area.

Thus, it is necessary to divide thirteen steps by two bits. In this example, the relative code configuration which is employed uses zoom codes ZCODE "4", "5", ""6", or "7", respectively, to correspond to division codes DIV of "1H"-"EH".

When this configuration is used, it is impossible to uniquely specify a division code that corresponds to the focal length of the lens only by the use of the zoom code ZCODE. Therefore, the division code is fixed by successively rewriting the division code stored in memory as changes in the zoom code from the end points are detected.

The function of the mode buttons A and B will now be explained. Mode button A is provided with the function of setting the exposure mode. The exposure mode includes an auto mode (automatic strobe emission mode), strobe ON mode (forced strobe emission mode), strobe OFF mode (strobe emission forbidding mode), exposure compensation mode, bulb mode, and bulb and strobe ON mode. In this specification, "bulb mode" includes "manual shutter mode".

In FIG. 8, the indication marks corresponding to each exposure mode are shown. In the auto mode, no indication is shown, to "0" corresponds to auto, "1" corresponds to strobe ON, "2" corresponds to strobe OFF, "3" corresponds to an exposure correction, "4" corresponds to bulb, and "5" corresponds to bulb and strobe. When the mode button A is operated, the setting is changed.

The mode button B functions to select the taking mode. Six kinds of taking modes are available: one-frame photographing, continuous photographing, self-timer, double self-timer, multi-photographing, and interval photography. The indication marks corresponding to each taking mode is shown in FIG. 8. However, for one-frame photographing, no indication is shown. MODE B is prepared to correspond to the taking mode, wherein "0" corresponds to one-frame photographing, "1" corresponds to continuous photographing, "2" corresponds to self-timer, "3" corresponds to double self-timer, "4" corresponds to multi-photographing and "5" corresponds to interval photography.

When mode button B is operated, the setting of MODE B is changed. The LCD indication is shown according to the contents of MODE A and B, the indication of the controls for photographing are also shown according to these contents as well.

For the bulb or the bulb and strobe ON taking mode, the manual shutter time shown in Table 2 is prepared. Eight kinds of manual shutter speeds are available and one, MODBLB is prepared for these eight kinds of manual shutter speeds. "0" corresponds to bulb, while "1" to "7" corresponding to each manual shutter speed from 1 to 60 sec. The contents of MODBLB are changed in the mode setting flow mentioned below by operating zoom lever 10 in the condition that mode button A is kept pressed after changing to the bulb or the bulb and strobe ON mode by pressing mode button A. Also, it is changed by again pressing mode button A and operating zoom lever 10 when the manual shutter speed is not shown in the bulb or the bulb and strobe ON mode.

For the interval taking mode, the interval time shown in Table 3 is prepared. Sixteen interval times are permitted; one mode interval value MODINT being provided for each of the sixteen interval times. "0" to "15" correspond to each time interval from 10 seconds to 60 minutes. The contents of MODINT are changed by operating the zoom lever 10 so that the mode button B is kept pressed after changing to the interval mode by pressing the mode button B. These are also changed by pressing the mode button B and operating the zoom lever 10 when the interval time is not shown in the interval mode. The initial value of the MODBLB is equal to "0" corresponding to the bulb, while the initial value of the MODINT is "5", corresponding to 60 seconds. These initial values are automatically set by setting the mode initialization or the clear button to ON.

The details of the LCD indicator 9 are explained with reference to FIG. 9. The mode marks for mode button A and B are shown in each indication area according to each mode. As the meaning of each mark has already been explained, the remaining marks are described below.

Figure 9:
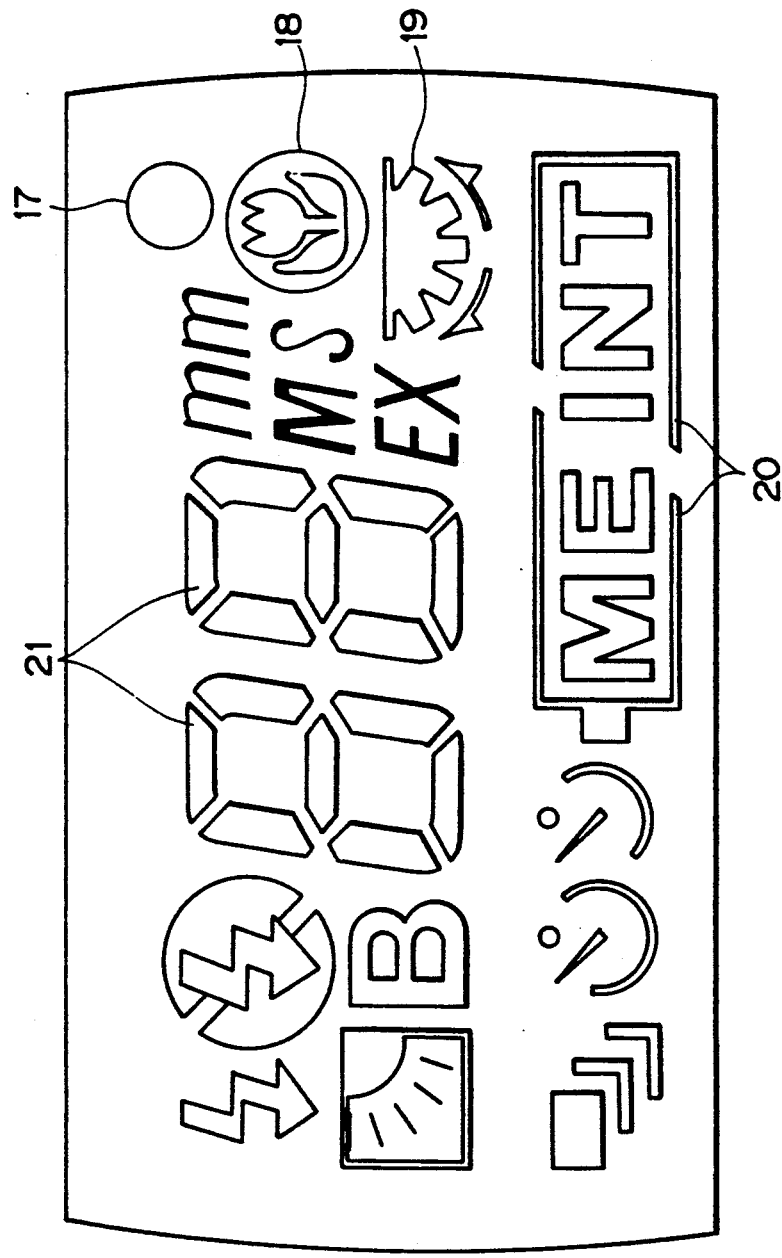
FIG. 9 is a view for explaining a segment displayed on an LCD.

FIG. 9 illustrates that the LCD indicator 9 contains a shutter button mark 17, a macro mark 18, a zoom lever mark 19, a battery mark 17, a macro mark 18, a zoom lever mark 21. The unit mark "mm" is illuminated when the focal length of the zoom lens is displaced; the unit marks "M" or "S" are displayed when the manual shutter speed and interval time are displayed; and the unit mark "EX" is displayed when showing the frame number of the film.

Shutter button mark 17 is shown when the shutter button 15 is operable. Macro mark 18 is displayed when macro photography is possible, after having pressed the macro button 16 to make the taking lens move to the macro extremity. The macro mark blinks when it is necessary to switch to the zoom photographing position in response to a distance measurement. Zoom lever mark 19 is continuously illuminated or blinking when the zoom lever 10 is activated, while the battery mark 20 lights when the camera battery is discharged. The seven-segment display section 21 indicates the frame number of the film, the focal length of the lens, the manual shutter speed or the interval time for taking pictures. With respect to the unit marks, "M" indicates minutes while "S" indicates seconds. "M" or "S" corresponds to the time set for the manual shutter speed or interval time.

The program stored in the main CPU will now be described with reference to FIGS. 10 to 38. The letter "S" denoted in the FIGS. are represented in the following text by the use of the word "step".

TABLE 1

|  | MCNT | MP1 | MP2 | MN1 | MN2 |
|---|---|---|---|---|---|
| MOTOR HIGH SPEED NORMAL ROTATION |  | ON |  |  | ON |
| MOTOR HIGH SPEED REVERSE ROTATION |  |  | ON | ON |  |
| MOTOR LOW SPEED NORMAL ROTATION | ON | ON |  |  | ON |
| MOTOR LOW SPEED REVERSE ROTATION | ON |  | ON | ON |  |
| MOTOR BRAKE |  |  |  | ON | ON |

TABLE 2

| MANUAL SHUTTER TIME | MODBLB |
|---|---|
| BULB | 0 |
| 1 SECOND | 1 |
| 2 SECONDS | 2 |
| 4 SECONDS | 3 |
| 8 SECONDS | 4 |
| 15 SECONDS | 5 |
| 30 SECONDS | 6 |
| 60 SECONDS | 7 |

TABLE 3

| INTERVAL TIME | MODINT |
|---|---|
| 10 SECONDS | 0 |
| 20 SECONDS | 1 |
| 30 SECONDS | 2 |
| 40 SECONDS | 3 |
| 50 SECONDS | 4 |
| 60 SECONDS | 5 |
| 2 MINUTES | 6 |
| 3 MINUTES | 7 |
| 4 MINUTES | 8 |
| 5 MINUTES | 9 |
| 10 MINUTES | 10 |
| 20 MINUTES | 11 |
| 30 MINUTES | 12 |
| 40 MINUTES | 13 |
| 50 MINUTES | 14 |
| 60 MINUTES | 15 |

RESET Program and MAIN Operation

The RESET program and associated MAIN operation will be described first, with reference to FIGS. 10 and 11. The MAIN operation describes the basic operation of the camera. Other functions are performed by branching from or being controlled from the MAIN operation according to various conditions.

Figure 10:
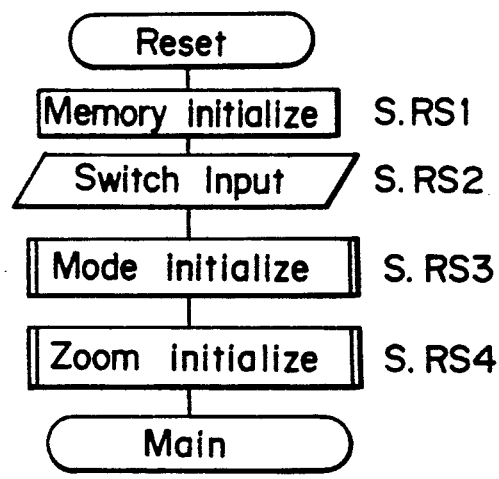
FIG. 10 is a flowchart showing a RESET Program.
Figure 11:
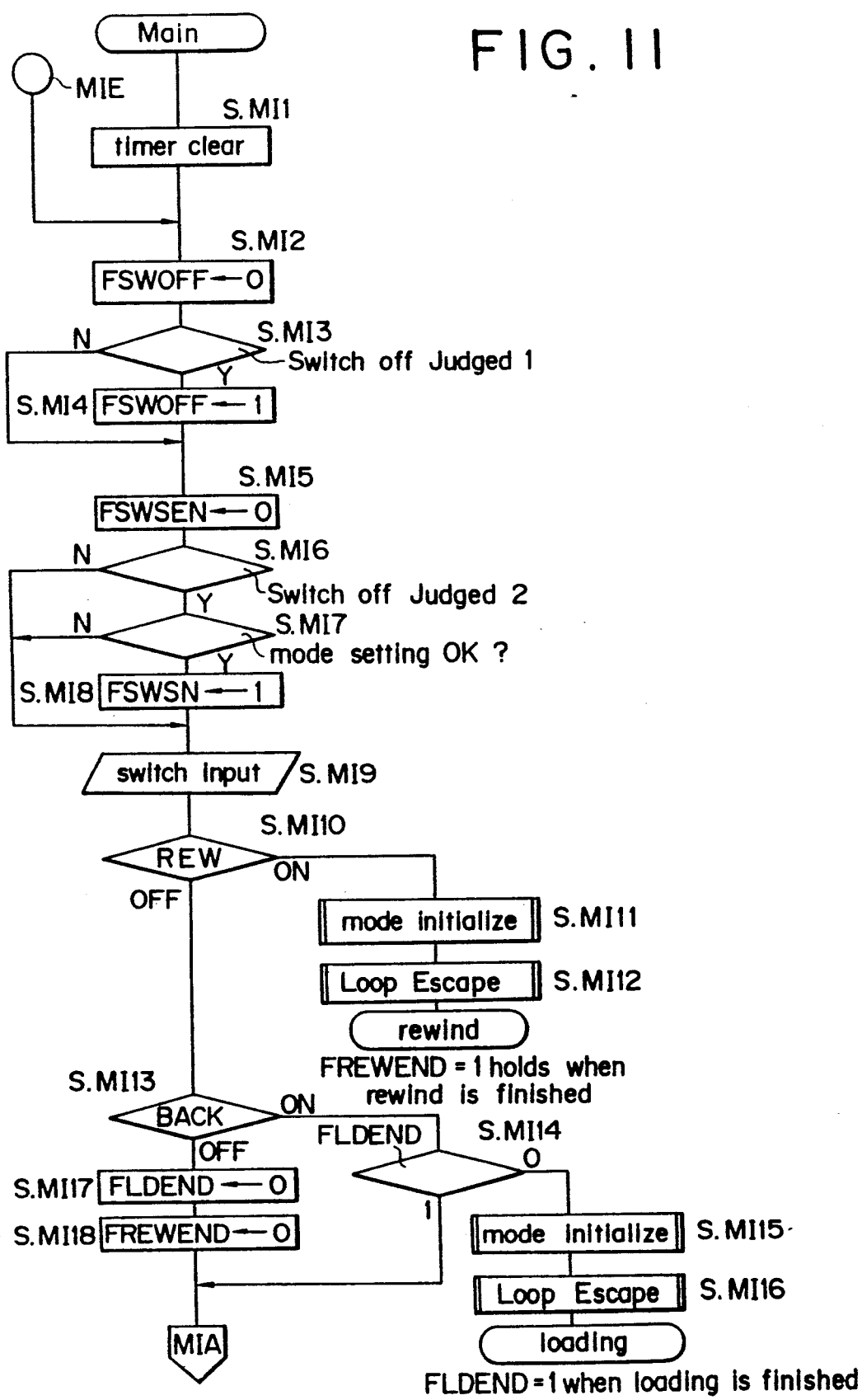
FIGS. 11, 13, 14 and 15 are flowcharts showing a MAIN Operation.
Figure 13:
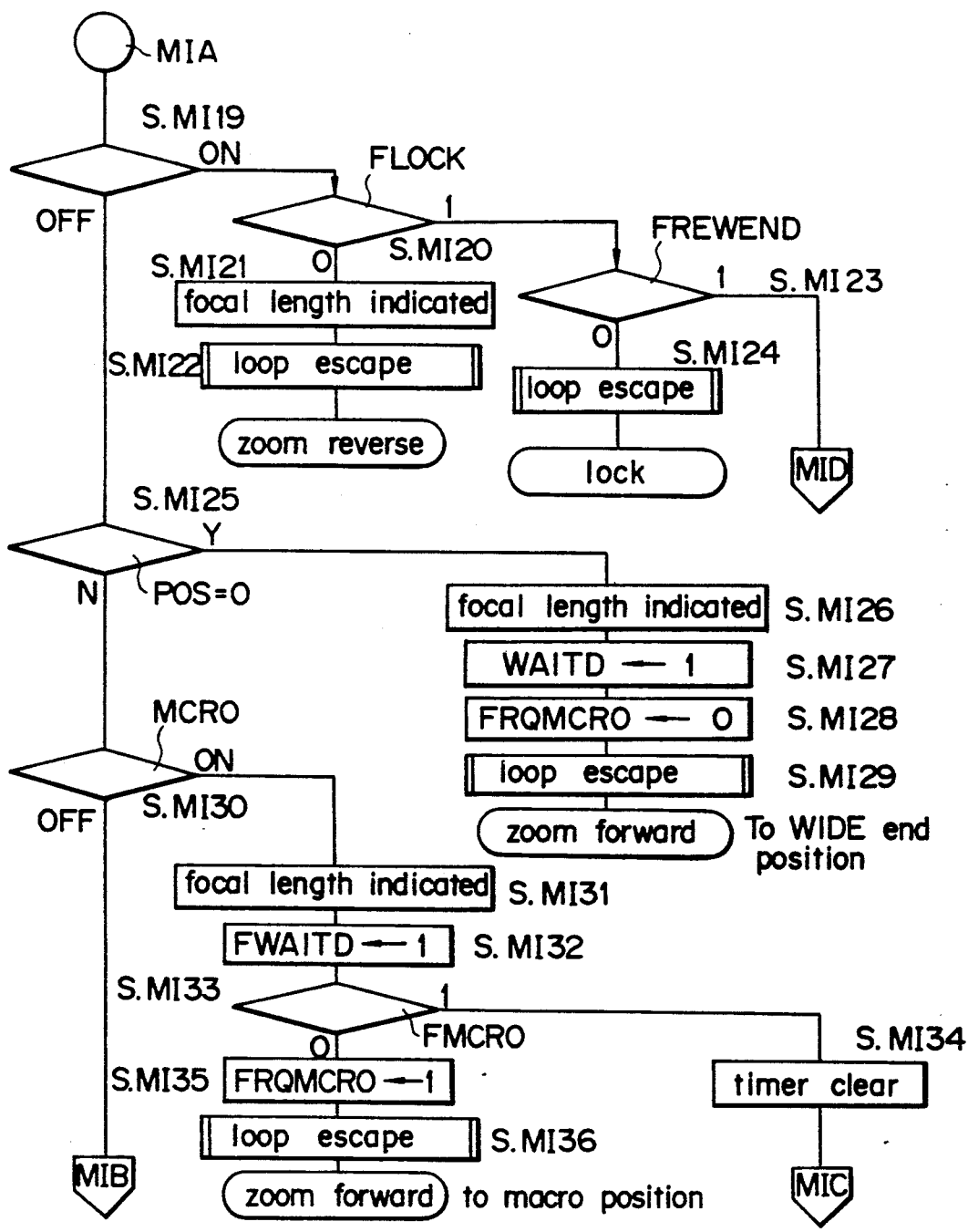
Figure 14:
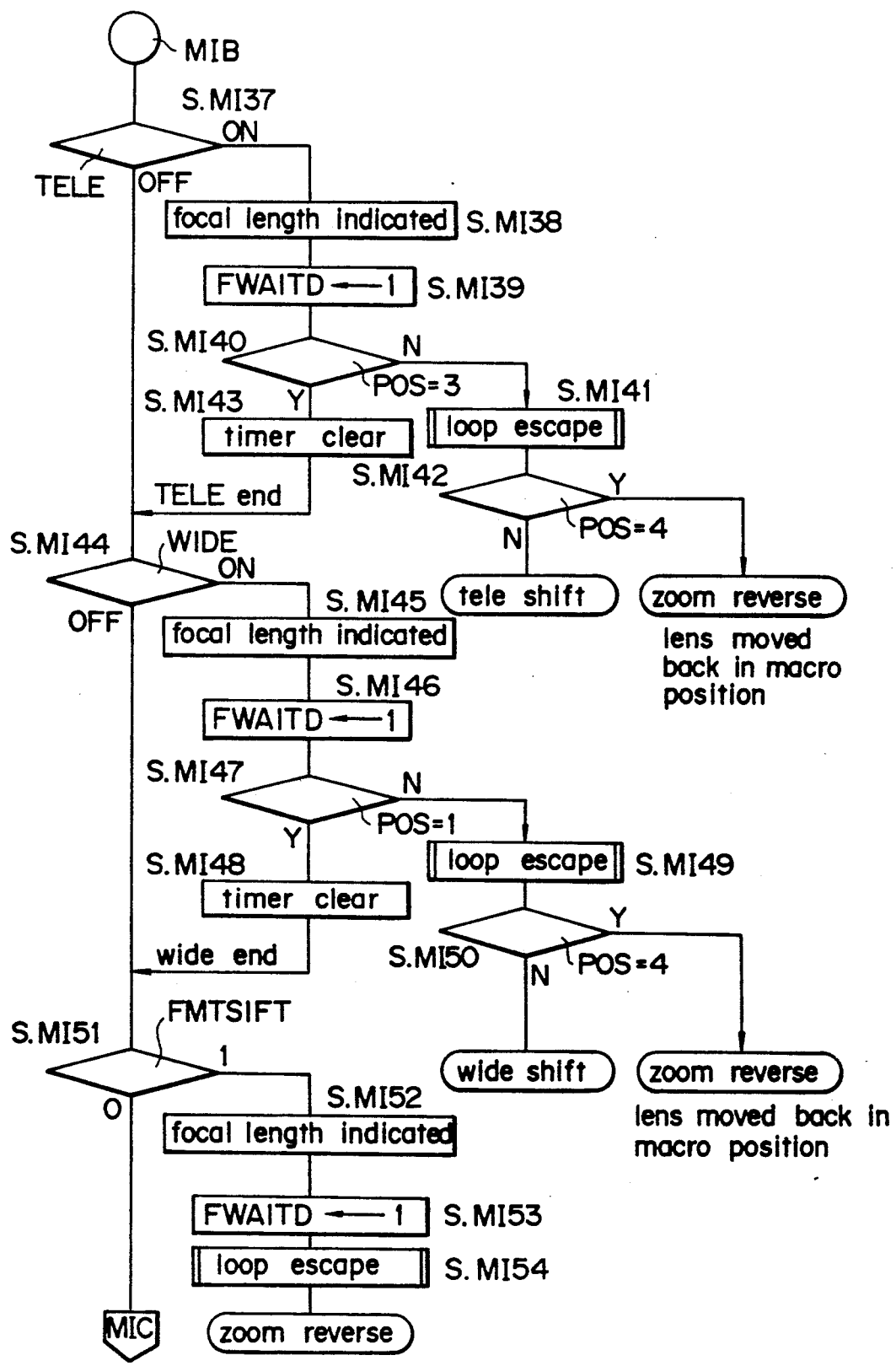

When power is turned ON, the main CPU is reset and the processing shown in FIG. 10 starts. The main CPU initializes the camera memory and inputs switch data (steps RS1 and RS2) before performing a MODE INITIALIZATION subroutine in step RS3 and a ZOOM INITIALIZATION subroutine (shown in FIG. 16) in step RS4. Then, processing diverges to a series of instructions that comprise the MAIN operation, shown in FIG. 11. The MODE INITIALIZATION Subroutine resets various mode settings to initial values to set the automatic strobe emission and one-frame taking mode.

In the MAIN operation, a 1-second timer, used for an indication hold, is cleared in step MI1.

In steps MI2 to MI4, the photometry switch SWS, release switch SWR, wide switch WIDE, tele switch TELE, mode switch MDA, mode switch MDB clear switch MDC and macro switch MCRO are set to OFF and switch judgment flag FSWOFF is set to 1.

In steps MI5 to MI8, when the photometry switch SWS, release switch SWR, wide switch WIDE and tele switch TELE are set to OFF And a forbidden photographing combination mode is not selected, the photometry switch effective flag FSWSEN is set to 1. When some of the switches are set to ON, or a forbidden combination mode is set, a value of 0 is set in flag FSWSEN.

In step MI9, the status of each of the above-mentioned switches are inputted and processing is executed according to the inputted switch data.

Figure 12:
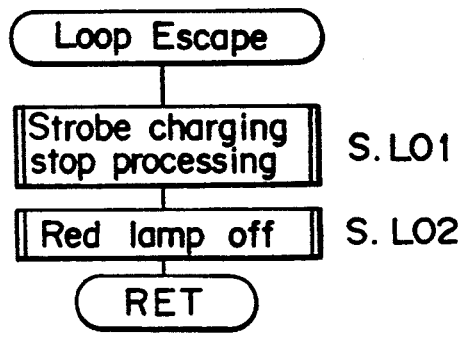

When rewind switch REW is judged to be ON (step MI10), the MODE INITIALIZATION subroutine is performed (step MI11). A LOOP ESCAPE subroutine, shown in FIG. 12, is then executed in step MI12. This subroutine comprises two steps, of which step L01 stops the charging of the strobe circuit and step L02 turns OFF the red lamp charge indication before other processing branches from the MAIN operation.

When the LOOP ESCAPE subroutine is completed, the MAIN operation diverges to a series of instructions that comprise a REWIND operation. When the REWIND operation has completed rewinding the film in the camera, a rewind complete flag FREWEND is set to 1 and processing is advanced by jumping to the beginning of the main operation.

When the back cover 8 is closed (turning ON back switch BACK), step MI14 is performed to determine whether the film has finished loading. This is performed by checking flag FLDEND. If the film has not finished loading, the flag is set to 0, and processing continues to step MI15, wherein the MODE INITIALIZATION subroutine is performed once more. Then, at step MI16, the LOOP ESCAPE subroutines performed so as diverge to a series of instructions that comprise a LOADING operation. When the LOADING operation has finished loading the film, flag FLDEND is set to 1 and processing goes to step MI19. Thus, the next time step MI13 is executed, the program will proceed to step MI17 because FLDEND will be set to 1.

When the back cover 8 is open, both FLDEND and FREWEND are reset to 0 (steps MI17 and MI18). In steps MI19 to MI24 (FIG. 13), a determination is made as to whether lock switch LOCK has been turned ON from its OFF position. That is, a test is made to see if the lock lever has been switched from the OFF position to the ON position. If the lens is not in the lock position, according to the lock position flag FLOCK, the display changes from indicating the film frame number to indicating the focal length of the lens (step MI21). Then, the LOOP ESCAPE subroutine (step MI22) is executed, as described above. Thereafter, processing diverges to a series of instructions that comprise a ZOOM REVERSE Operation, shown FIG. 19 and to be discussed below, so that the lens is pulled back to the lock position.

Figure 24:
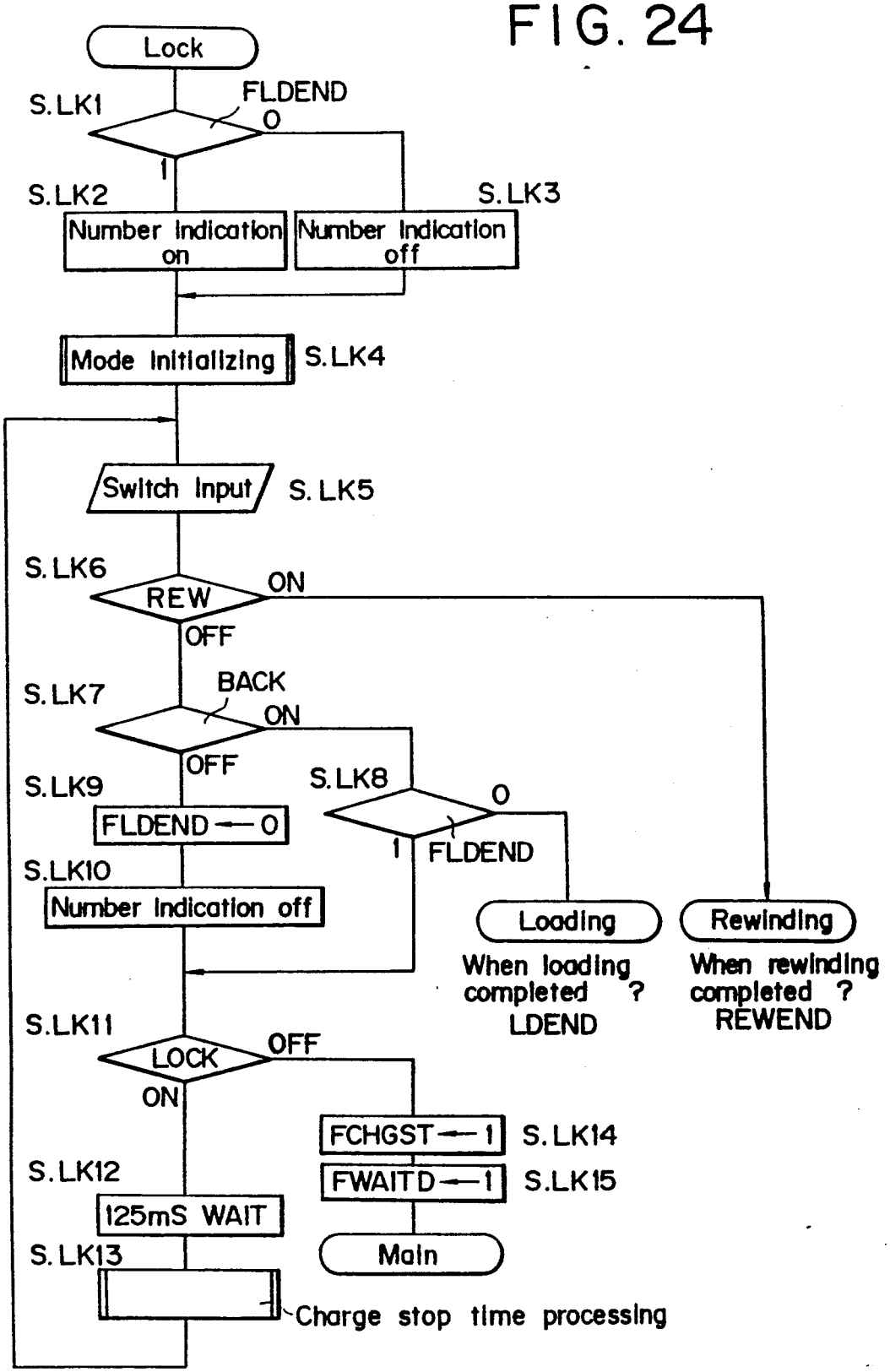
FIG. 24 is a flowchart showing a LOCK Operation.

When the lens is already in the lock position and the REWIND operation has not finished, processing goes to step MI24 so as to execute the LOOP ESCAPE subroutine so that processing can diverge to a series of instructions that comprise a LOCK operation (FIG. 24). If the REWIND operation has finished, processing is advanced by jumping to step MI56, shown in FIG. 15.

When the lock switch LOCK is in the OFF position and the lens is positioned between the lock position and the wide extremity (i.e., POS equals "0"), as determined by steps MI19 and MI25, the focal length of the lens is indicated to the photographer (step MI26) for a period of one second (step MI27) by setting an indication hold flag FWAITD to 1. Thereafter, macro command flag FRQMCR is set to 0 (step MI28) and the LOOP ESCAPE subroutine is performed (step MI29) so that processing can diverge to a series of instructions that comprise a ZOOM FORWARD operation, shown in FIG. 21. In this operation, the zoom lens is moved at a normal rotation speed towards the wide extremity. Processing then returns to the MAIN OPERATION.

In step MI30, a determination is made as to whether the macro switch MCRO is ON. If it is ON, steps MI31-MI36 are performed so as to indicate the focal length of the zoom lens and set the indication hold flag FWAITD to 1. A test is then made to determine whether the zoom lens is in the macro position by checking the condition of the macro position flag FMCRO (step MI33). If it is in the macro position, the indication hold timer is cleared (step MI34) and restarted. Processing then advances to step MI55, shown in FIG. 15. If the lens is not in the macro position, the macro command flag FRQMCRO is set to 1 and processing diverges to the ZOOM FORWARD subroutine at a normal rotation speed so that the lens moves towards the macro extremity. After the ZOOM FORWARD subroutine has completed its execution, processing returns to the MAIN operation.

If the macro switch MCRO is in the OFF position, steps MI37-MI43 (FIG. 14) are performed to determine the setting of the tele switch TELE. When the tele switch TELE is ON, an indication of the focal length of the lens is displayed to the operator. When the lens is not in the tele extremity (i.e., POS equals "3"), a test is performed to determine if the lens is between the tele extremity and the macro extremity (i.e., POS equals "4") or the wide extremity (i.e., POS does not equal "4"). When the lens is in the position between the tele extremity and the wide extremity in the zoom area, processing diverges to a series of steps that comprise a TELE SHIFT (ZOOM to TELE) operation, to be described below, to move the lens to the tele extremity. If the lens is in the position between the tele extremity and the macro extremity, processing diverges to the ZOOM REVERSE operation so as to move the lens towards the tele extremity.

When the lens is already at the tele extremity (i.e., POS equals "3"), the display indication timer is cleared and one second count is started again.

In steps MI44-MI50, when the wide switch WIDE is ON, the display is switched to indicate the focal length of the lens, set the indication hold flag FWAITD to 1 and perform a test to determine if the lens is at the wide extremity. If the lens is at the wide extremity, the display indication timer is cleared and restarted (in step MI48). If the lens ins not at the wide extremity, a test is made to determine whether the lens is in the wide extremity or the macro extremity (i.e., whether POS is equal to "4").

If the lens is in the wide extremity, processing branches to a WIDE SHIFT (ZOOM to WIDE) Operation to move the lens to the wide extremity. If it is in the macro extremity, processing diverges to the ZOOM REVERSE operation to move the zoom lens to the tele extremity. When the wide switch WIDE is kept activated, even if the zoom lens reaches the tele extremity, processing diverges from the ZOOM REVERSE operation to a series of instructions that comprise a WIDE operation as to continuously move the lens.

Therefore, when the macro switch is ON, the zoom lens is set to the macro position. Thus, to retract the lens from the macro position to the zoom area, the zoom lever should be moved from its center, neutral position towards either r1 or r2.

Steps MI51-MI54 are provided to test macro tele shift flag FMTSIFT to determine if it is necessary to shift the lens. If the flag is set to 1, the focal length of the lens is displayed (step MI52) and the indication hold flag FWAITD is set to 1. Thereafter, processing diverges to the ZOOM REVERSE operation to shift the lens to the tele extremity.

In the embodiment constructed according to this invention, the distance limit for taking macro photographs is approximately 1 meter (m). Thus, when the lens is in the macro position and the distance measurement indicates a distance greater than 1 m, it is impossible to take an in-focus photograph when the shutter button is depressed. However, by setting the release lock, the lens is controlled to be shifted to the tele extremity from the macro position.

The flag FMTSIFT is set in a LENS LATCH (LL) subroutine (shown in FIG. 32) that is called by a series of steps that comprise an AUTOMATIC EXPOSURE/AUTOMATIC FOCUS (AEAF) CONTROL subroutine, shown in FIG. 29 and to be discussed below, that diverges from the MAIN operation after step MI65 is performed.

In step MI55, the condition of rewind complete flag FREWEND is examined. If the rewind operation has finished, step MI56 is performed to display "00 EX" on the LCD panel. If the rewind operation is not finished (as indicated by FREWIND being set to 0), a MODE SETTING subroutine is performed (step MI57).

After the switch judgment flag FSWOFF has been set in steps MI2-MI4, the MODE SETTING subroutine is executed only when all switches are set to OFF by the previous inputs.

If some switches are set to ON, the subroutine returns to the MAIN operation without changing any settings.

If there is a change in a mode setting, a mode change flag FMDCHG (step MI58) is set to 1, while if there is no change it is set to 0.

When processing returns to the MAIN operation, the condition of flag FMDCHG is examined (step MI58). If there is a mode change, the indication hold flag is set to 1 in step MI59 before the program jumps to the beginning of the MAIN operation.

When there are no changes, photometry switch SWS and photometry switch effective flag FSWSEN are examined in steps MI61 and MI62. When the specified conditions are satisfied, an indication of the focal length of the lens is displayed (steps MI63-MI65) and the indication hold flag is cleared. Processing then diverges to the AEAF CONTROL operation so as to control the camera shutter.

In AEAF CONTROL operation is executed when the photometry switch SWS is changed from OFF to ON, every switch data stored in each memory of the SWS, SWR, TELE and WIDE are OFF and the mode that allows a photograph to be taken is set. That is, the AEAF CONTROL operation is performed only when the SWS is switched from OFF to ON. Therefore, if the zoom lever is operated, the MAIN operation continues without the AEAF CONTROL operation being performed.

In step MI66, a CHARGE CONTROL subroutine, which controls the strobe flash circuit, is called. This subroutine causes an indication switch to be set in steps MI67-MI71. The presently shown indication is displayed for a period of one second. When the holding of the display indication is not required, or one second has passed, the film frame number is re-displayed and the indication hold flag FWAITD is cleared. Thus, the indication of the film frame number is given preference over other indications, unless the other data to be shown in only temporarily displayed.

After pausing for 125 ms at step MI72, a CHARGE PROHIBITING TIME subroutine is called. Processing then jumps to step MI2 (FIG. 11) to repeat the above outlined procedure.

Various subroutines and operations that are executed will now be discussed.

ZOOM INITIALIZATION SUBROUTINE

Figure 16:
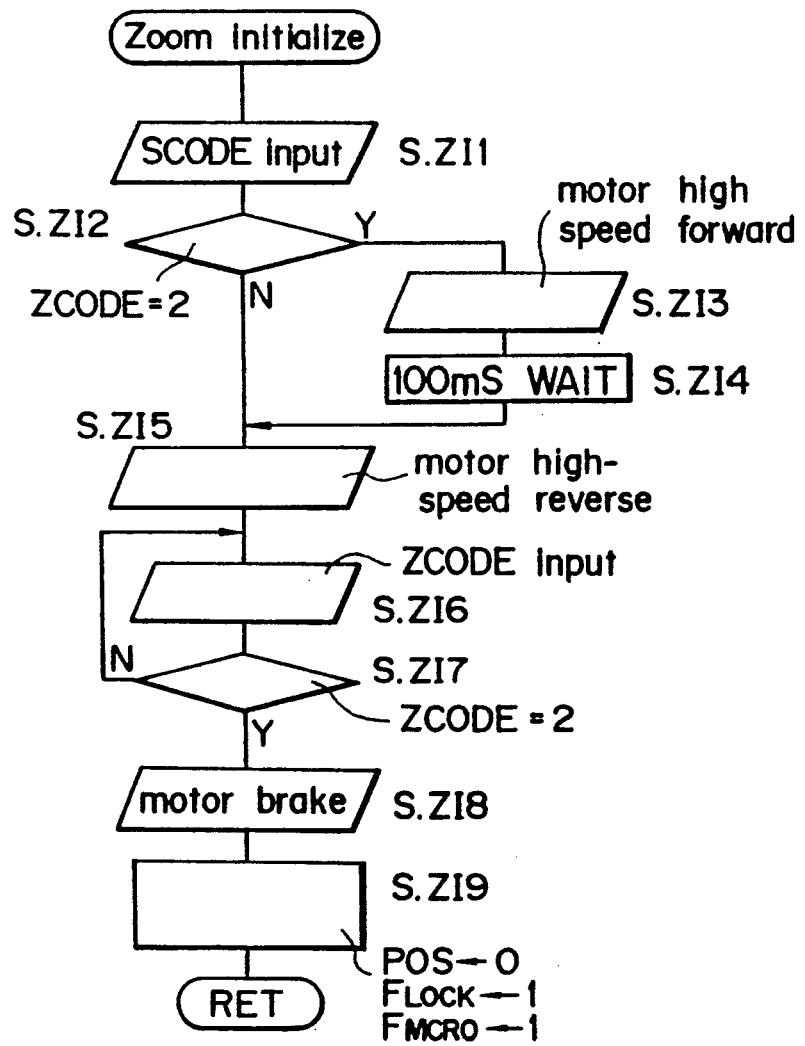
FIG. 16 is a flowchart showing a ZOOM INITIALIZATION subroutine.

FIG. 16 illustrates the flowchart of the ZOOM INITIALIZATION subroutine that is called in step RS4 of the RESET program.

As mentioned above, the camera according to the present invention uses a relative code for the zoom code. Accordingly, when the camera battery is removed and data in the memory is canceled, the camera cannot identify the position of the lens. The ZOOM INITIALIZATION subroutine shifts the lens to the lock position in such a case.

First, a zoom code ZCODE is inputted in step ZI1, as determined by the terminal brushes that are contacting the code plate. A test is then performed to determine whether the lens is in the lock position (step ZI2). If the lens is not in the lock position, step ZI5 is performed to reversibly rotate the motor at a high speed. If the lens is in the lock position, steps ZI3 and ZI4 are performed to rotate the zoom motor in a forward direction for 100 ms before going to step ZI5 and performing the high speed motor reverse instruction to bring the lens to the lock position.

This subroutine results in the position code POS being set to "0", a lock position flag FLOCK being set to 1 and the macro position flag FMCRO being set to 0 before the subroutine returns to the point from which the subroutine was called.

CODE CHECK subroutine

Figure 17:
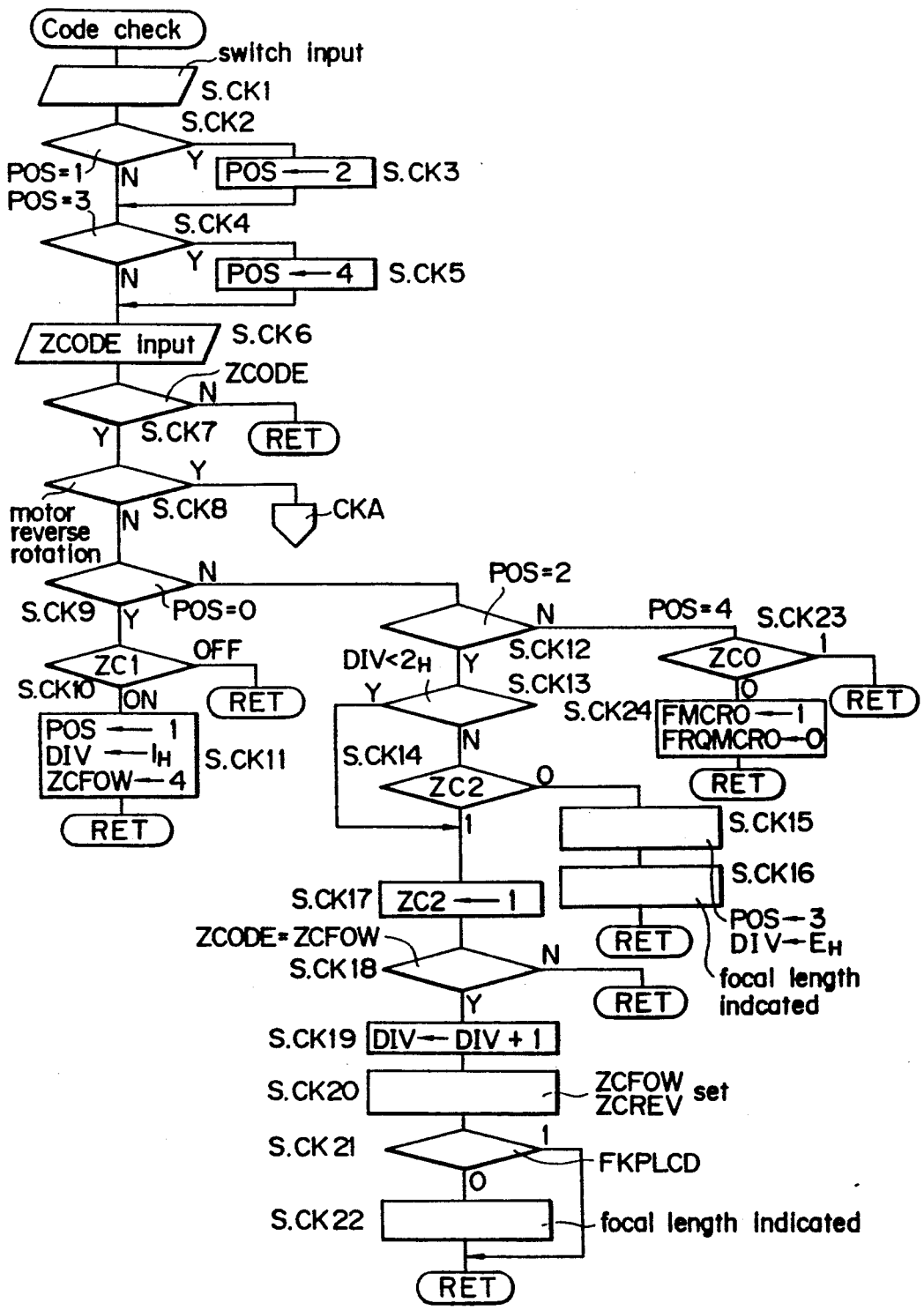
FIGS. 17 and 18 are flowcharts showing a CODE CHECK subroutine.
Figure 18:
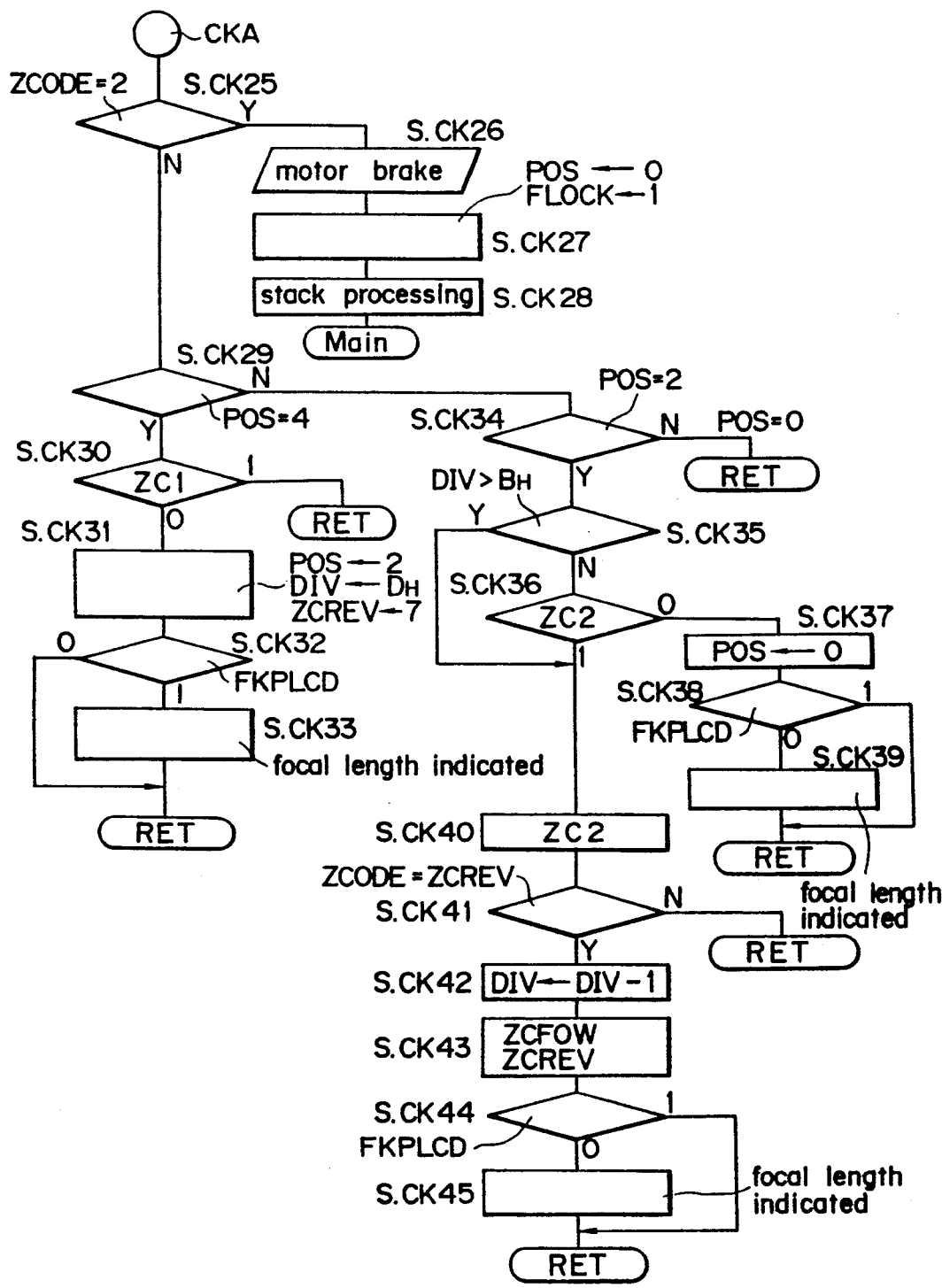

FIGS. 17 and 18 illustrate the CODE CHECK subroutine.

As mentioned above, a relative code is employed for determining the position of the zoom lens. However, it is impossible to specify one position code or division code which corresponds to the focal length of the length of the lens by only using the detected zoom code. Therefore, in the CODE CHECK subroutine, the position code POS and division code DIV, which are stored in memory, are successively rewritten while the zoom code changes from the lock position (where the ZCODE equals "2") in which the zoom code is an absolute code, which is dynamically detected.

When this subroutine begins, data is inputted with respect to the lock switch LOCK, macro switch MCRO, wide switch WIDE, tele switch TELE and speed switch ZMHL (step CK1). When the CODE CHECK subroutine is called by a ZOOM to TELE subroutine or a ZOOM TO WIDE subroutine, the inputted switch data is used after the processing of the subroutine is finished.

In steps CK2-CK5, when the position code POS shows that the lens is at the wide extremity (POS equals "1") or the tele extremity (POS equals "3"), the position code POS is forcibly set to the codes that show the zoom area (POS equals "2") and the position between the tele extremity and macro position (POS equals "4"). Then, the zoom code ZCODE is inputted CK6. If there is no change in the value of the zoom code, processing returns to the point in the MAIN operation from which this subroutine was called.

When there is a change in the value of the zoom code, the processing that is performed depends upon the rotation direction of the zoom motor. If the motor rotates normally, processing advances from step CK8 to step CK9, while if the motor rotates in a reverse direction, the processing advances to step CK25 (shown in FIG. 18). The following explanation pertains to the normal rotation case. The position code POS will be either "0, 2 or 4" after steps CK2-CK5 CK5 are performed.

When the lens is between the wide extremity and the lock position (POS equals "0"), processing continues to step CK10, until brush terminal ZC1 is set to ON with respect to the code plate; that is, the lens is set to the wide extremity. When ZC1 is ON, the position code POS is set to "1" and the division code DIV is set to "$1_H$" (step CK11) and, if the zoom motor rotates normally, zoom code value ZCFOW, which will be used after the next change (change predictor in the normal rotation of the zoom code), is set to a value of "4".

The change predictor is fixed, according to the table of FIG. 7. When the lens is in the zoom area (that is, the position code POS equals "2"), processing advances from step CK12 to step CK13 to determine whether the division code DIV is smaller than "$2_H$". If DIV is larger than "2H", a determination is made as to whether terminal ZC2 has changed.

The ZC2 terminal becomes 1 when the zoom lens is rotated to where the position code POS is equal to "2". That is, the ZC2 terminal is equal to 0 only when the zoom lens approaches the CRITICAL TELE END or CRITICAL WIDE END, as shown FIG. 7. The ZC2 terminal is always equal to 1 when the zoom lens is in the zoom range. Therefore, by examining the status of the ZC2 terminal, it is possible to determine whether the zoom lens is at the tele extremity without performing step CK13.

However, it could happen that ZC2 becomes 0 and ZC1 becomes 1 because of a structure error in the code plate. Therefore, a test is made in step CK13 so that the tele extremity can be detected only by the signal of the ZC2 terminal, even if such an error occurs. When the tele extremity is detected, the position code POS is set to "3", while the division code DIV is set to "$E_M$" (Steps CK15 and CK16). This change the LCD panel to always indicate the tele extremity focal length (i.e., 70 mm) and the CODE CHECK subroutine is existed.

If the tele extremity has not been reached, the terminal brush ZC2 is considered to be equal to 1 (step CK17) and step CK18 is performed to compare the zoom code ZCODE with the change predictor ZCFOW. When they are the same, the division code DIV is counted and a new change predictor is set in steps (CK19 to CK22. If the indication keep flag (indication change permission flag) FKPLCD is set to 0, the subroutine performs the steps necessary to indicate the focal length of the lens that corresponds to the new division code DIV and hen the CODE CHECK subroutine is existed.

When steps CK9 and CK12 determine that POS is not equal to "0" or "2", it means that the lens is between the tele extremity and macro extremity (POS equals "4"). Thus, an examination is made of brush terminal ZC0, in step CK23, to determine if it is equal to 0. If it is equal to 0, the macro position flag FMCR0 is set to 1 in step CK24, macro command flag FRQMCR0 is cleared (that is, set to 0) and the CODE CHECK subroutine returns.

When the zoom motor rotates in the reverse direction, the CODE CHECK subroutine jumps from CK8 to step CK25 (shown in FIG. 18). When the zoom code ZCODE being is equal to "2" representing the absolute code, the lens is in the lock position. In this case, step CK26 is executed to stop the rotation of the zoom motor. Then, POS is set to "0", while lock position flag FLOCK is set to 1. Thereafter, processing jumps to the start of the MAIN operation after CPU stack register processing has occurred (step CK28).

When the lens is in the position between the tele extremity and the macro extremity (POS equals "4"), processing advances from step CK29 to step CK30. If terminal ZC1 is 1, control is returned to the point in the MAIN operation from which the CODE CHECK subroutine was called.

When the ZC1 terminal is 0, it means that the lens has entered the zoom area. As a result, the position code POS is set to "2", the division code DIV is set to "$D_H$" and change predictor ZCREV is set to a value of "7" (step CK31).

Flag FKPLCD is then examined to determine if it is 1 or 0. If the flag is set to 1, the focal length of the lens is displayed (step CK33) on the LCD panel to show the new value (i.e., 65 mm). If the flag is equal to 0, the focal length indication step is skipped. Regardless of whether the focal length of the lens is displayed or not, the next step is to return to the point from which the CODE CHECK subroutine was called.

If the position code POS is not equal to "4" in step CK29, processing is separated into the case where the position code POS equals "2" and where the position code POS equals "0" (step CK34). When the lens is in the position between the wide extremity and the lock position (POS equals "0"), the subroutine returns to the point from which it was called.

When the lens is in the zoom area where the position code POS equals "2", a judgment is made (in step CK36) as to whether terminal ZC2 is ON (that is, having a value of 0) or OFF (that is, having a value of 1) if the division code DIV was judged to be less than "$B_H$". If the terminal ZC2 has a value of 0, the position code POS is set to "0" before judging whether the lens is in the position between the wide extremity and the lock position. The indication change is permitted when flag FKPLCD is set to 0, so that the subroutine changes the focal length indication that is displayed on the LCD panel, prior to existing the CODE CHECK subroutine. If ZC2 is $B_1$, steps CK40 and CK41 are executed, in which the ZC2 terminal is set to a value of 1 and the zoom code ZCODE is compared to the predictor ZCREV to determine if they are equal to each other.

When they are not the same, processing returns to the MAIN operation, while when they are equal to each other, steps CK42-CK45 are performed. In these steps, new change predictors ZCFOW and ZCREV are set by subtracting 1 from the division code DIV. Then, if the value of the indication flag FKPLCD is 0 (in step CK44), the new focal length of the lens is displayed, prior to existing from the CODE CHECK subroutine. If the value of the indication flag is 1, the focal length indication step is skipped.

As mentioned above, the setting for the lock position, macro position, tele extremity and wide extremity is detected by the change from OFF (1) to ON (0) of the terminals ZC0, ZC1 and ZC2. With the above arrangement, detection errors due to bad contacts between the brushes and the code plate are prevented. Thus, the situation in which the zoom motor stops in a forbidden position is avoided.

ZOOM REVERSE Operation

Figure 19:
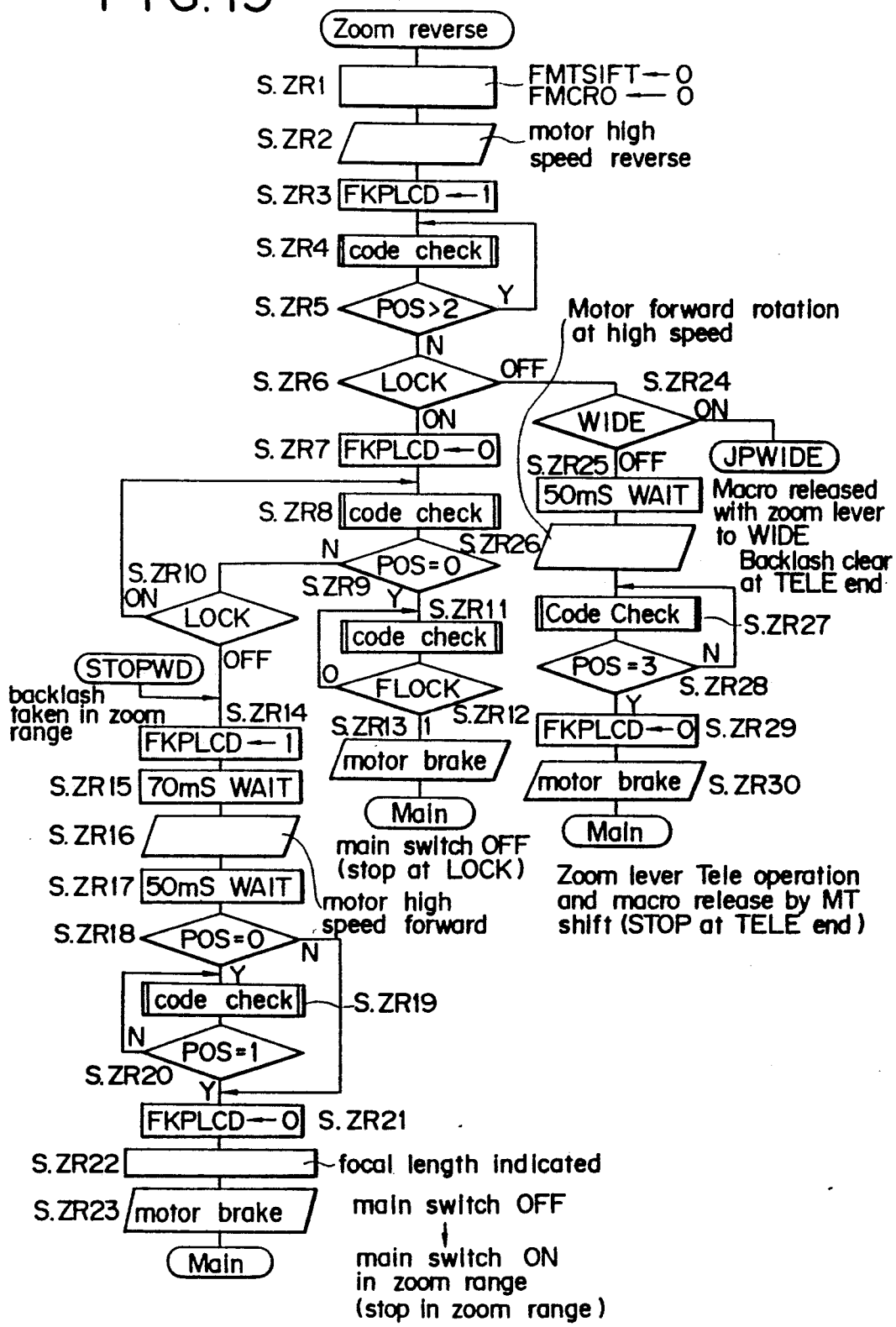
FIG. 19 is a flowchart showing a ZOOM REVERSE Operation.

FIG. 19 shows the flowchart for the ZOOM REVERSE ROTATION operation that diverges from the MAIN operation at steps MI22, MI50 and MI54. This operation is executed to shift the lens to the lock position and shift the lens from the macro position to the zoom area. When the lens stops within the zoom range, a normal rotation operation takes place to prevent backlash. When the MAIN operation diverges to this operation, it is a first necessary (in steps ZR1 and ZR2) to clear the macro tele shift flag FMTSIFT and the macro position flag FMCR0 and set them to 0, prior to rotating the zoom motor in a reverse direction at a high rate of speed.

In step ZR3, the focal length of the lens is prevented from being displayed by setting the indication keep flag FKPLKCD to 1. In steps ZR4 and ZR5, the CODE CHECK subroutine (FIGS. 17 and 18) is called. Then, a test is performed to determined to determine whether the value of the position code POS is greater than "2". If it is, meaning that the lens is positioned between the tele extremity and the macro extremity, the CODE CHECK subroutine is repeated.

When the position code is determined not to be greater than "$2_H$", meaning that the lens is between the tele extremity and the zoom area or the lens has entered the zoom area, step ZR6 is performed to determine if this lock switch LOCK is ON or OFF. When the lock switch is ON, the indication keep flag FKPLCD is cleared in step ZR7. In step ZR8-ZR13, the zoom motor is rotated in a reverse direction until the lens reaches the lock position or the lock switch is set to OFF. When it reaches the lock position, the motor is stopped. The subroutine then jumps to the beginning of the MAIN operation. This movement is shown by character "a" in FIG. 20.

When the lock switch is set to OFF before the lens moves to the wide extremity (due to the reverse rotation of the zoom motor), the zoom motor is reversibly rotated for a period of 70 ms (ZR15) from when the lock switch was set to OFF. The zoom lens is then rotated in a forward direction at a high rate of speed for a period of 50 ms. If the lens is in the zoom area, it is stopped (as shown by character "b" in FIG. 20). If the lens is between the wide extremity and the lock position after the normal rotation, the motor is kept rotating to the wide extremity and is stopped after the lens is at the wide extremity (shown by character "c" in FIG. 20). In either case, processing jumps to the head of the MAIN operation after the focal length of the lens is displayed.

On the other hand, if the lock switch has been set to OFF beforehand, processing advances from step ZR6 to step ZR24. If the wide switch is set to ON, processing advances to a series of steps that comprise a JPWIDE operation. This operation is essentially equivalent to a ZOOM to WIDE operation (shown in FIG. 23 and which will be discussed below) without the zoom motor initially being rotated in a reverse direction at a high speed. If the lock switch is set to OFF, steps ZR25-ZR30 are performed, wherein the zoom motor is rotated in the forward direction at a high rate of speed after a delay of 50 ms has passed from the time when the lens has entered the zoom area to set the lens to the tele extremity. Then, processing jumps to the MAIN operation (as shown by character "d" in FIG. 20).

In the ZOOM REVERSE subroutine, when the reverse rotation processing is switched over from terminal "STOPWD" for the wide movement processing, to remove backlash, the motor is rotated in the forward direction for 50 ms after the motor has stopped its reverse rotation. Therefore, if the focal length indication is not prevented from being displayed, the indication of the short focal length is changed just when the lens enters the division code DIV area of the wide extremity. Then, the indication of the focal length of the lens may be shown when the lens enters the division code DIV area of the tele extremity by reversing the rotation. Such an indication change may give the photographer the impression that the shifting of the lens has malfunctioned by shifting to the tele extremity, in spite of the fact that it is supposed to switch the focal length of the wide extremity.

Therefore, the indication keep flag FKPLCD is set to 1 temporarily prevent the focal length changes from being displayed until the time when the zoom motor stops.

ZOOM FORWARD Operation

Figure 21:
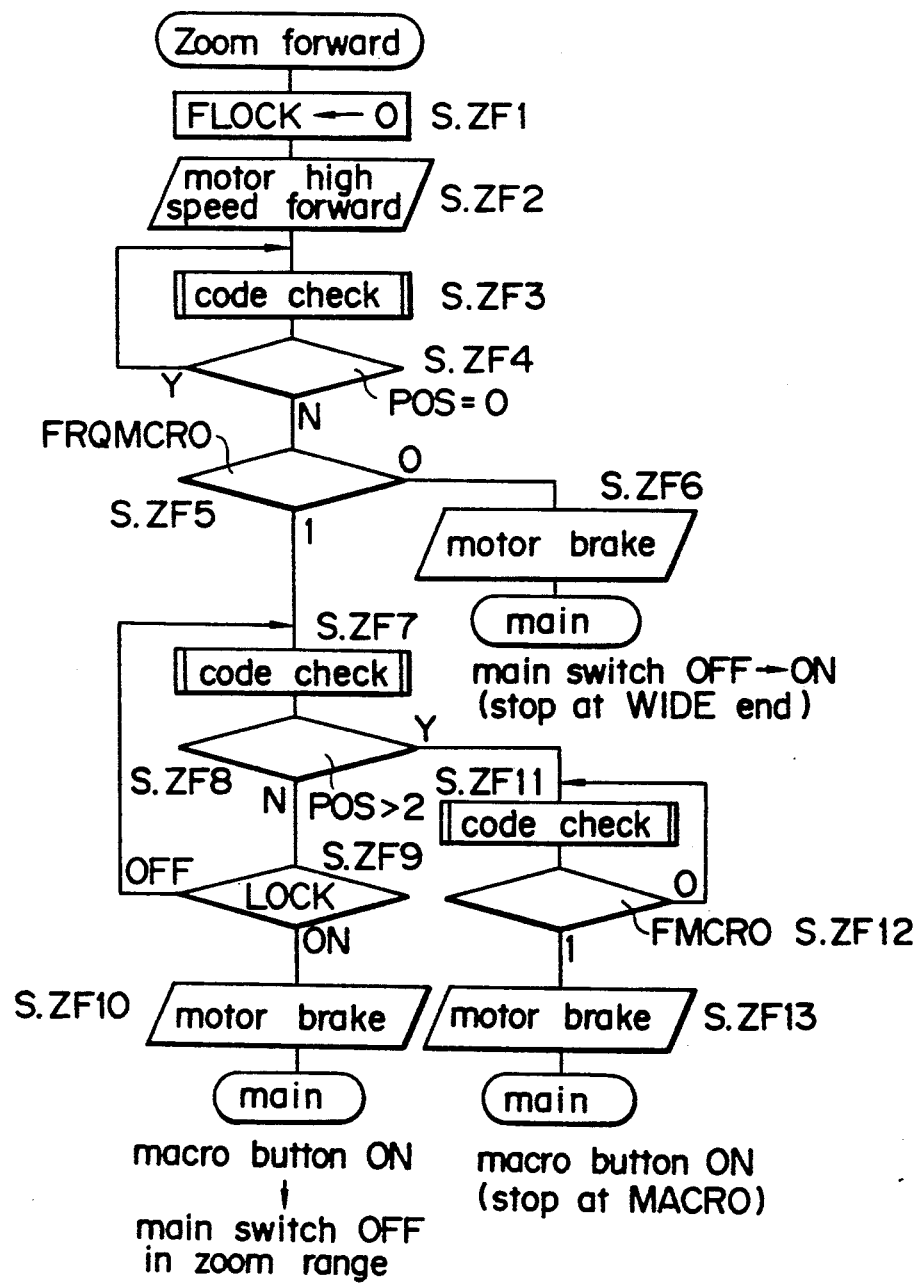
FIG. 21 is a flowchart showing a ZOOM FORWARD Operation.

FIG. 21 is the flowchart showing the ZOOM FORWARD operation. This operation moves the lens from the lock position to the wide extremity or the zoom area to the macro position.

When the ZOOM FORWARD operation begins, lock position flag FLOCK is cleared (step ZF1) and at step ZF2, the zoom motor is caused to rotate at a high speed. The lens is then checked to ensure that it is in a position between the wide extremity and the zoom area (step ZF3, ZF4).

If the macro command flag FRQMCRO (step ZF5) is set to 0, the motor is stopped and processing jumps to the MAIN operation. These steps move the lens from the lock position to the wide extremity when the lock lever is set to its OFF position, as shown by character "e" in FIG. 20.

When the macro command flag is set to 1, steps ZF7-ZF9 ZF9 are performed, in which the operation waits until the lens passes the tele extremity in the zoom area. When the lock switch is set to ON, in step ZF10, the motor is stopped (as shown by character "f" in FIG. 20). Then, the operation returns to the MAIN operation. If the lens passes the tele extremity, steps ZF11-ZF13 are performed, in which the operation waits until the macro position flag FMCR0 is set to 1, at which point the motor is stopped and processing returns to the MAIN operation. Steps ZF11-ZF13 are executed when the macro button 16 is pressed and the lock lever is in the OFF position (lock switch OFF).

According to the above discussion for the ZOOM REVERSE operation and ZOOM FORWARD operation, all lens operations by the main switch 14 or the macro button 16 are performed by the zoom motor operating at a high rate of speed.

ZOOM TO TELE Operation

Figure 22:
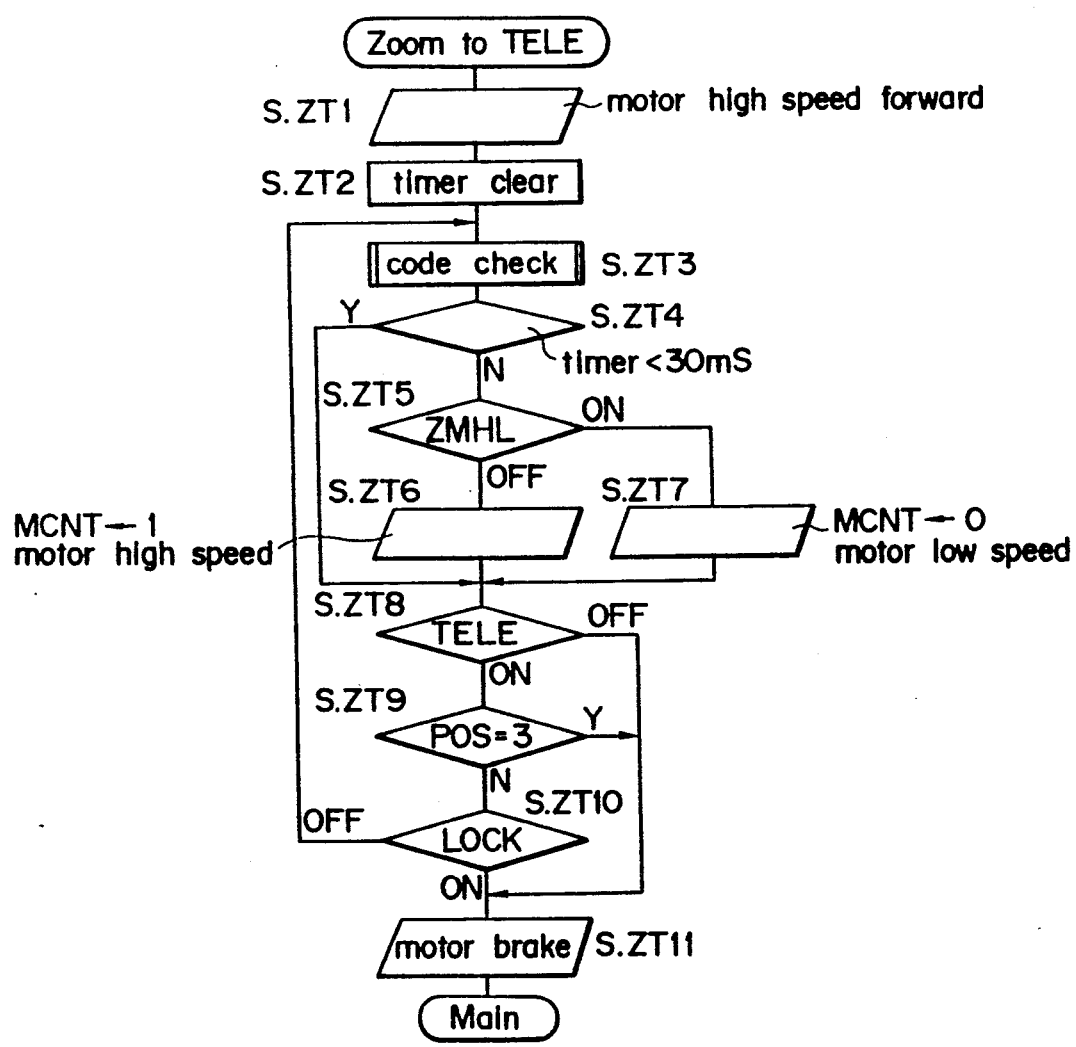
FIG. 22 is a flowchart showing a ZOOM TO TELE Operation.

FIG. 22 shows the flowchart of the ZOOM to TELE operation that diverges from step MI42 of the MAIN operation.

This operation is executed by setting the tele switch TELE to the ON position, with the lens set to the zoom area. It is common to the above-mentioned ZOOM FORWARD operation that the lens is moved by normally rotating the zoom motor. However, this operation is different from the above-mentioned operation in that the zooming speed can be switched between a high speed and a low speed.

When this operation starts, the zoom motor is rotated in a forward direction at a high speed before the timer for switching the zoom motor speed is reset.

If the tele swich is set to ON, the lens does not reach the tele extremity (i.e., POS does not equal "3"). Thus, the lock switch is set to OFF and the motor is rotated at a high speed for 30 ms before the rotation speed is changed to the low speed (if applicable). Otherwise, it remains in the high rotation speed, based upon the setting of a speed switch.

Figure 20:
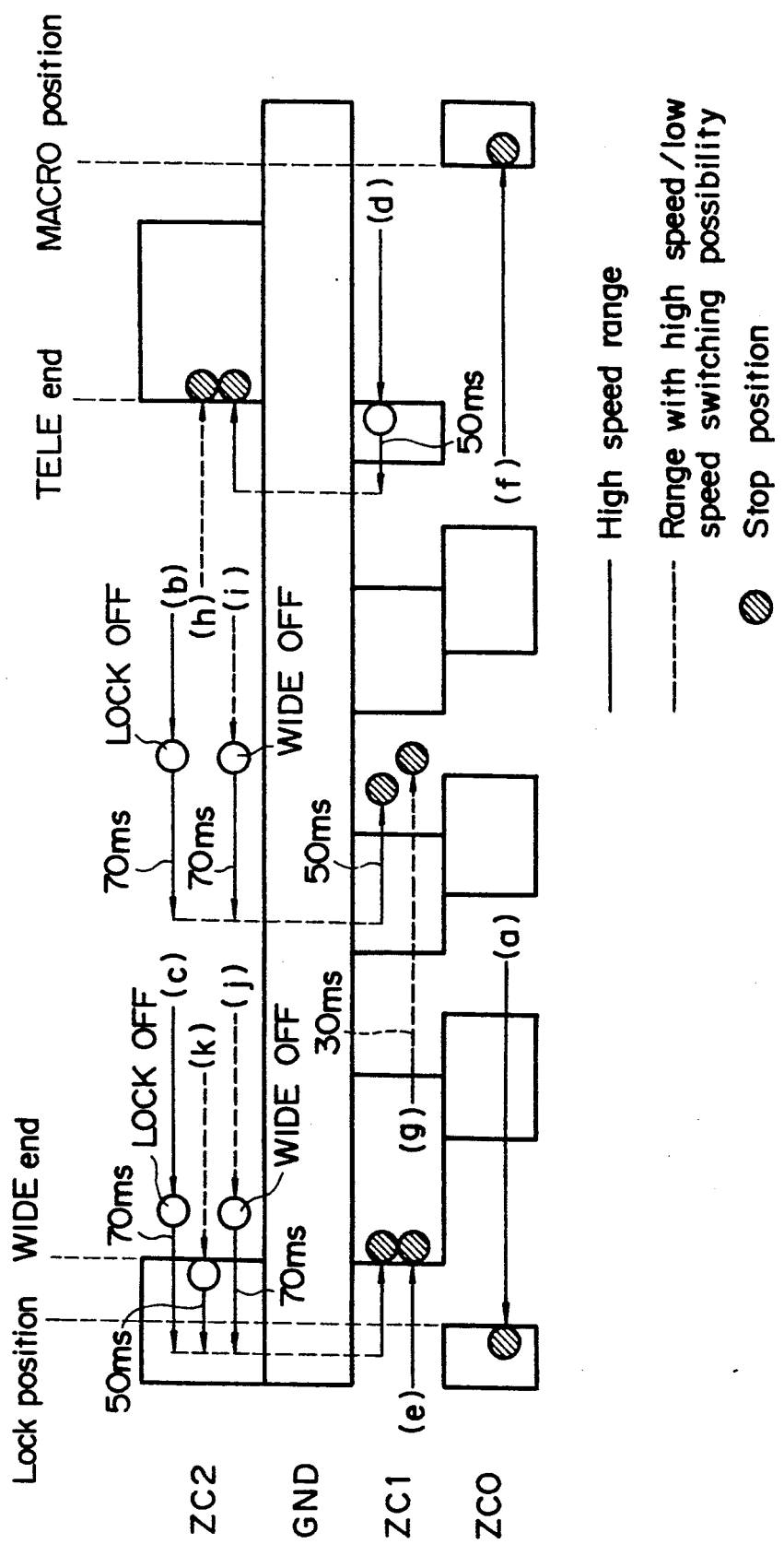
FIG. 20 is a view for explaining a zooming action

In the zoom area, when the tele switch TELE is set to OFF, the operation is shown by the character "g" in FIG. 20. The operation when the lens reaches the tele extremity is shown by the character "h" in FIG. 20.

At the some point lock switch will be set to ON. When this happens, the zoom motor is stopped in step ZT11, so that control returns to the MAIN operation.

ZOOM TO WIDE Operation

Figure 23:
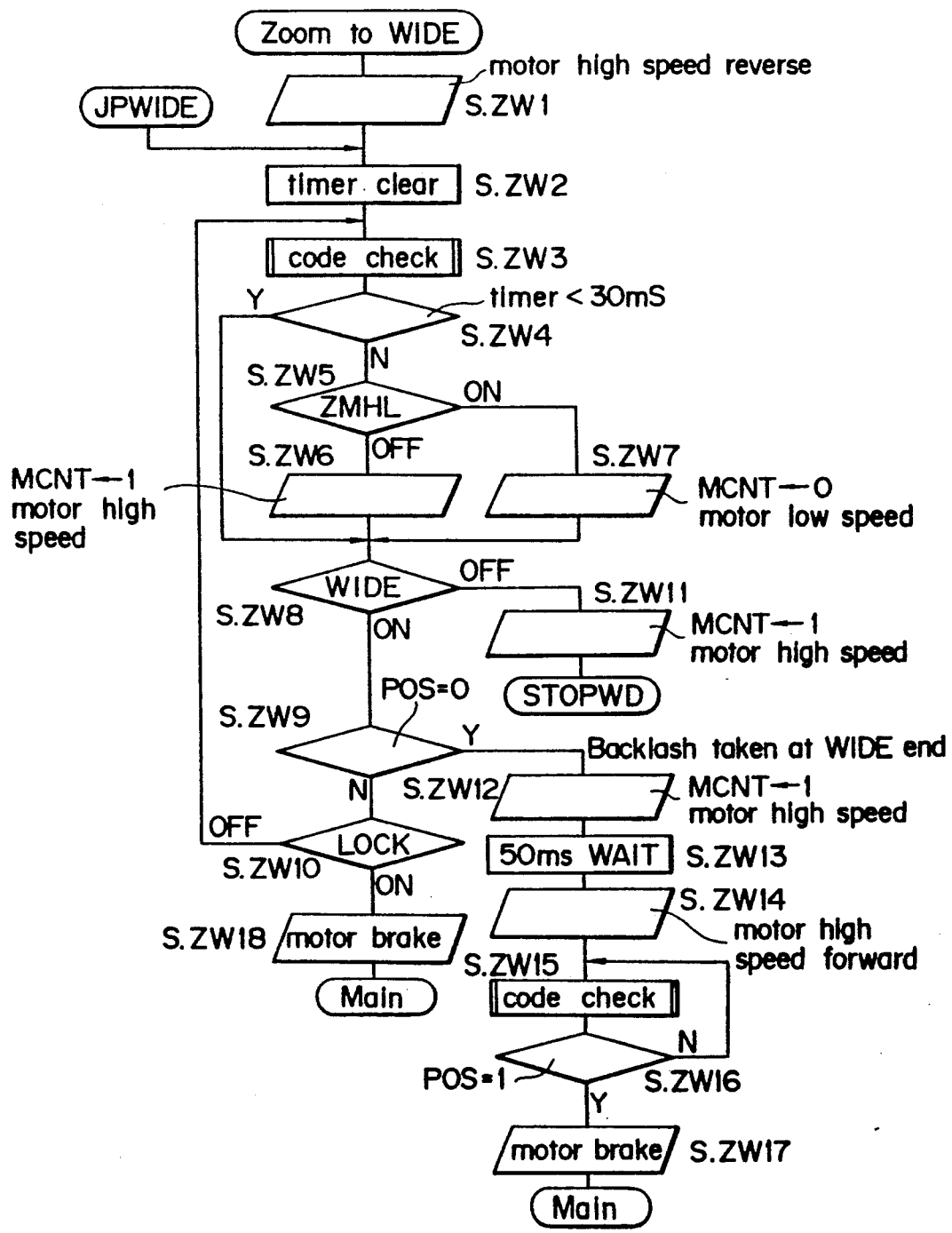
FIG. 23 is a flowchart showing a ZOOM TO WIDE Operation.

FIG. 23 shows the flowchart of the ZOOM TO WIDE Operation that diverges from step MI50 of the MAIN operation.

This operation is executed when the lens is in the zoom area and the wide switch WIDE is set to ON. It happens in the above mentioned ZOOM REVERSE operation that the lens is moved in a storage direction.

When the WIDE MOVEMENT operation starts, the zoom lens is rotated in a reverse direction and the timer is reset. However, if this operation is called from step ZR24 of the ZOOM REVERSE operation, these two steps are not performed.

In steps ZW3-ZW10, if the wide switch is set to ON, the lens does not enter the position between the wide extremity and the lock position (that is, POS does not equal "0") and the lock switch is set to OFF, the zoom motor operates at a high speed for 30 as before it starts to rotate is the reverse direction, switching from the high or low speed, based upon the setting of the speed switch.

When the wide switch WIDE is set to OFF, and the motor rotation speed is set to the high speed, the operation branches to step ZR14 of the ZOOM REVERSE operation to eliminate any possible backlash that may occur. (This movement is shown by character "i" in FIG. 20).

When the wide switch WIDE is set to OFF in the zoom area and the above-mentioned 70 ms normal rotation and 50 ms reverse rotation are finished, the lens comes out of the wide extremity, as shown by character "j" in FIG. 20 and the zoom motor stops rotating.

When the lens enters the lock position from the wide extremity after the motor is set to the high speed in step ZW12, the zoom motor is rotated in a reverse direction for a period of 50 ms (steps ZW13–ZW17). Next, the lens is set to the wide extremity and the motor is stopped (the movement shown by character "k" in FIG. 20), removing backlash, before the MAIN operation is re-entered.

When the lock switch is set to ON, step ZW18 is executed, which stops the zoom motor rotation prior to returning to the MAIN operation. In this case, the operation branches from the MAIN operation to the ZOOM REVERSE operation and the lens is shifted back to the lock position.

LOCK Operation

FIG. 24 shows the flowchart for the LOCK operation that is called in step MI24 of the MAIN operation. This operation is executed when the lens is stored in the lock position, after the lock switch is switched to ON.

When this operation begins, the number indicator in the LCD is lit or extinguished, according to the condition of the loading end flag FLDEND (steps LK1–LK4), which sets the initial mode.

A programming loop, comprising steps LK5–LK13, is repeated every 125 ms until the rewind switch REW is turned to ON, the back cover switch BACK is ON and the film is not fully loaded, or the lock switch is OFF.

In step LK13, the CHARGE PROHIBITING TIME subroutine is called. This is the same subroutine called in step MI73 of the MAIN operation.

When the rewind switch REW is set to ON, processing diverges from step LK6 to the above-mentioned REWIND operation.

When the back cover is closed and the film is loaded, steps LK9 and LK10 are skipped, while when the back cover is open, the loading end flag is cleared (step LK19) and the indication of the frame number of the film is turned OFF. In the next loop, when the back cover is closed, processing diverges from step LK14 to the above-mentioned loading routine.

Lastly, when the lock switch LOCK is set to OFF, the operation sets charge start flag FCHGST and the indication hold flag FWAITD to 1 (steps LK14 and LK15) prior to returning to the MAIN operation.

As has been described above, if a subject to be photographed is too far away when the camera is set to the macro mode, a release lock is effected to prohibit photographing. As soon as the shutter button is released, the lens is shifted from the macro mode to the zoom mode, permitting a photograph to be taken without manually shifting the lens.

MODE SETTING Operation

Next, a mode setting operation will be described.

Figure 15:
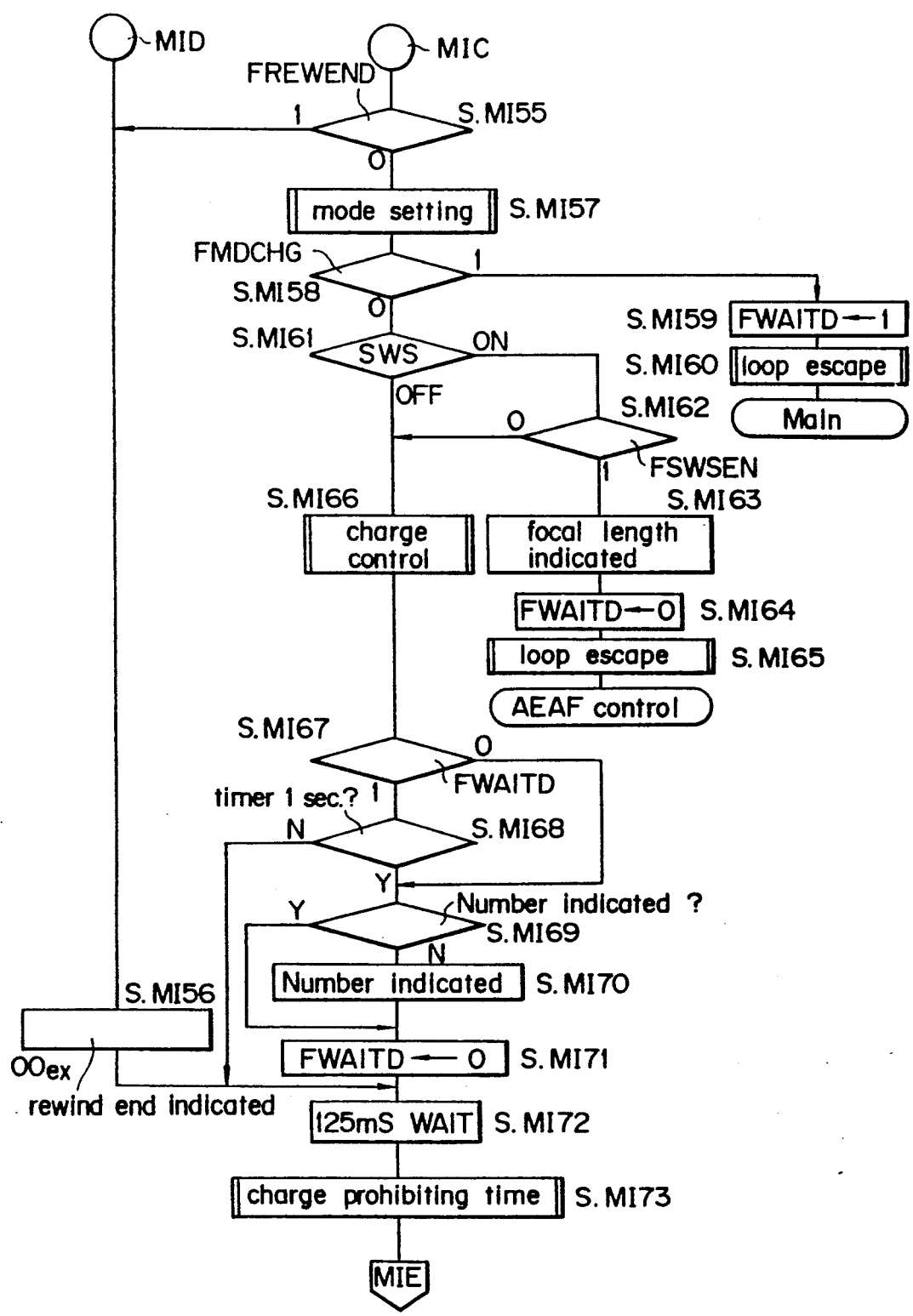
Figure 25A:
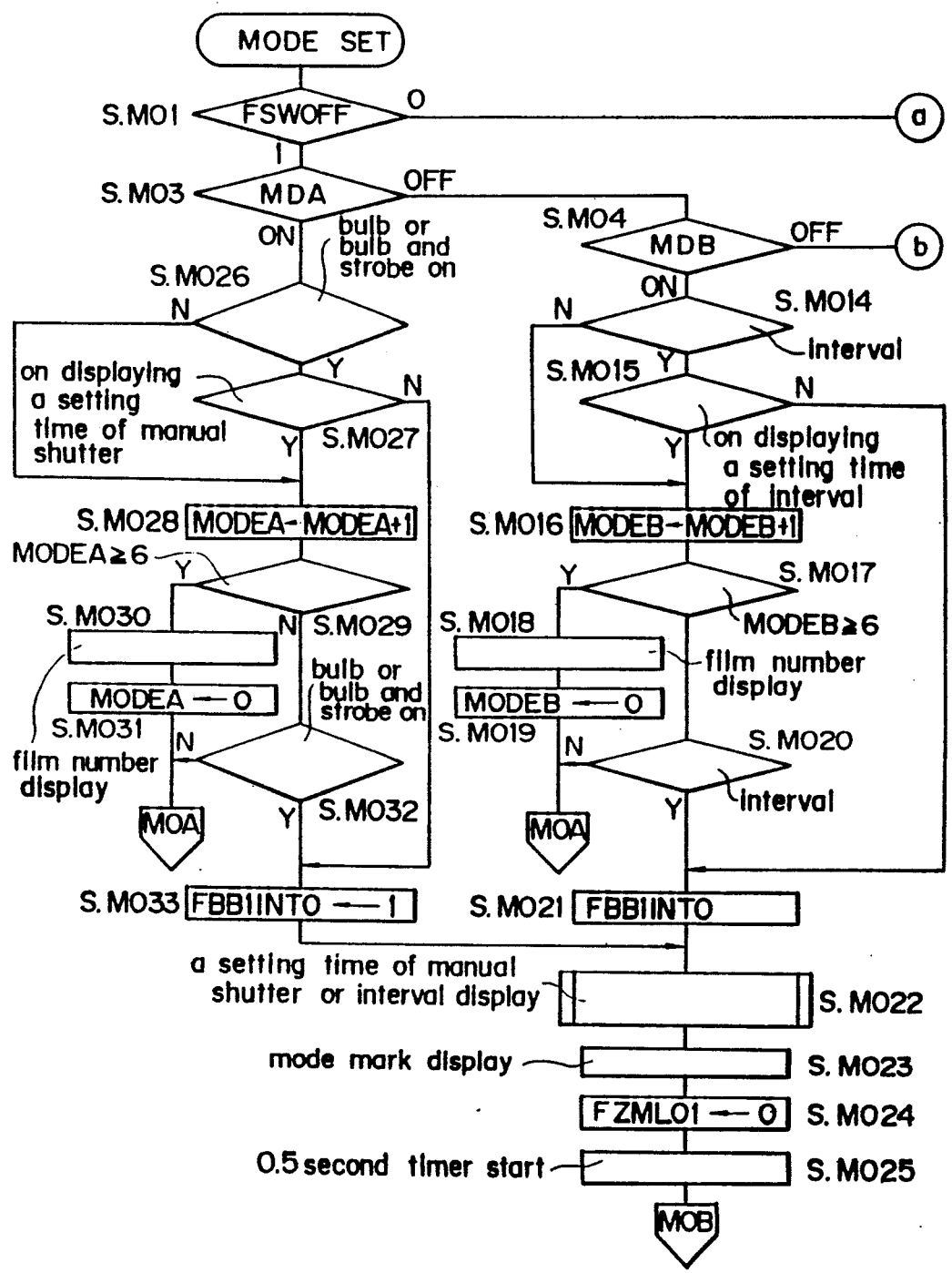
FIG. 25 comprising FIGS. 25A and FIG. 25B and FIG. 26 comprising
Figure 25B:
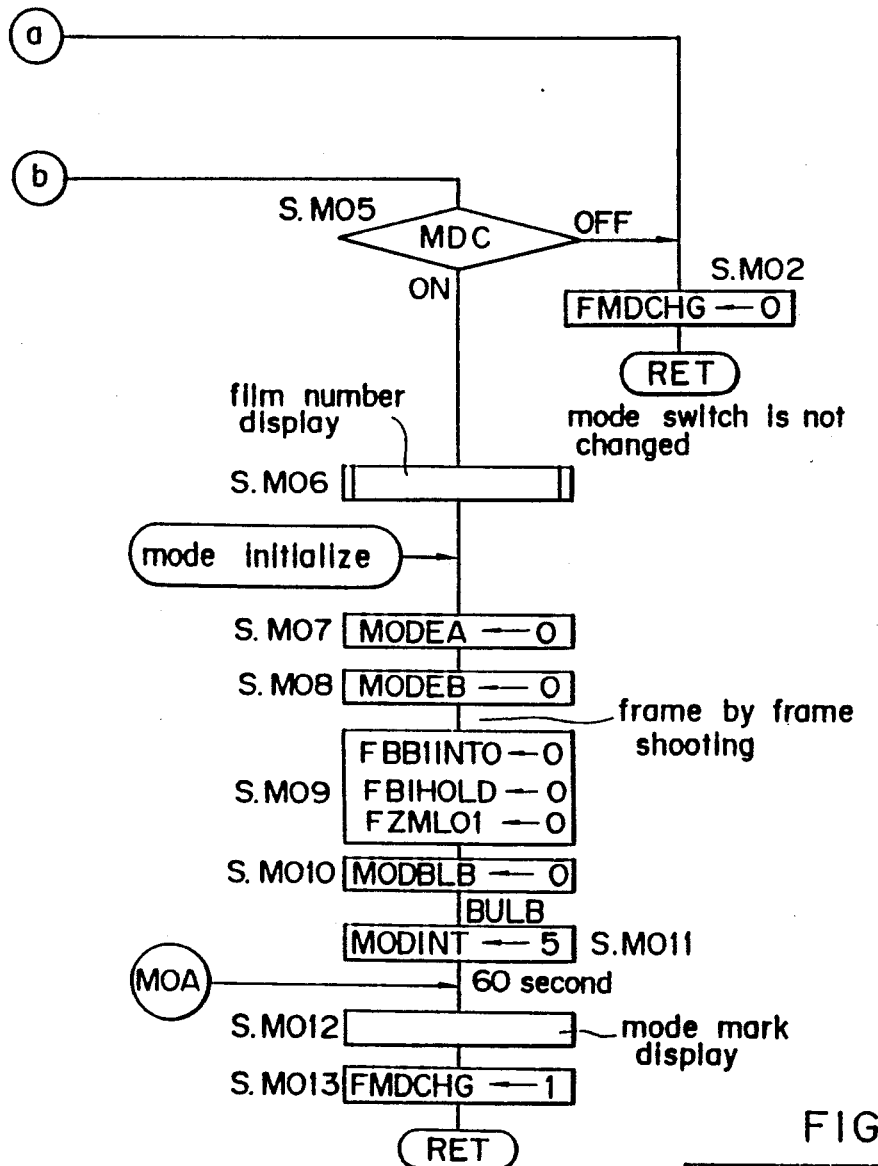

In step MI55 shown in FIG. 15, when FREWEND is set to "0", it goes to the MODE SETTING operation shown in FIG. 25A.

In the mode setting operation, it is determined in step MO1 whether FSWOFF is set to "1" When FSWOFF is set to "0" (when whichever switch is in its ON position), FMDCHG is set to "0" (step MO2). Then it returns to the MAIN flow and goes to step MI58. In step MI58, it is judged whether FMDCHG is set to "0". Therefore, when either of the mode buttons A or B and the clear button C is continuously pushed, it returns to the MAIN flow via step MO2 and step MO2. Also, the mode set by any of the mode buttons (mode switches) A and B and the clear buttons, clear switch) C which is continuously pushed is maintained and in step MI58, it is judged that FMDCHG is set to "0". Then, the steps from step MI61 to the end are executed.

In step MO1, when FSWOFF is set to "1" (when all switches are in the OFF position), it is determined whether the mode button A is in the ON position (step MO3). In step MO3, when the mode button A is in OFF position, it is judged whether the mode button B is in ON position (step MO4). In step MO4, when the mode button B is in the OFF position, it is determined whether the clear button C is in the ON position (step MO5). In step MO5, when the clear button C is in the OFF position, the mode change flag FMDCHG is set to "0" (step MO2), and then processing returns to the MAIN flow. Therefore, when all switches, i.e., photometric switch SWS, release switch SWR, wide switch WIDE, tele switch TELE, mode switches MDA and MDB, clear switch MDC, and macro switch MCRO, are in the OFF position, processing goes through steps MO3~MO5 and step MO2 and then returns to step MI58 of the MAIN flow.

If it is determined in step MO50 that the clear button C is in the ON position. Then, the film number display process is carried out (step MO6).

In step MO7, the counter memory MODEA is set to "0". Then, in step MO8, the contents of MODEB is set to "0". The identification flag FBB1INTO, the display lights-out process via flag FBIHOLD, and the display blinking flag FZML01 are each set to "0" (step MO9). Then processing goes to step MO10 wherein, MODBLB is set to "0" processing them goes to step M011 where MODINT is set to "5". Thereafter, the mode mark is displayed (step M012). Then processing goes to step M013 where FMDCHG is set to "1" before returning to step MI58 of the MAIN flow. Identification flag FBB1INTO is adapted to identify whether the manual shutter time is being set or the interval time is being set. The display lights-out process via flag FBIHOLD is adapted to determine whether the process it should go via the display lights-out process.

Therefore, when the clear button C is turned on, it is changed to the film number display. Also, as the counter memory MODEA is set to "0", the exposure mode becomes "auto". Furthermore, as the counter memory MODEB is set to "0", the taking mode becomes "one frame taking". In addition, as the counter memory MODBLB is set to "0", the manual shutter time becomes "bulb". In addition as the counter memory MODINT is set to "5", the interval time becomes 60 seconds. When the mode is auto and one frame taking, no mode mark is displayed.

Immediately after clear button C is pushed, flag FMDCHG is changed from "0" to "1". Therefore, in the step MI58 of the MAIN flow, it is judged that the flag FMDCHG is "1". By this, the flag FWAITED is set to "1" (step MI59). The loop-out process (step MI60) is carried out and then processing returns to the top of the MAIN flow (step MI1). If the clear button C is continuously kept in the ON position thereafter (i.e., if the clear button C is being pushed), it is determined that the flag FSWOFF is set to "0" when processing goes again to the mode setting process of step MI57 (step M01). Then, the flag FMDCHG is set to "0" (step M02) and processing returns to step MI58 of the MAIN flow. This time it is judged, in step MI58, that the flag FMDCHG is set to "0" and the processes after step MI61 are carried out. In the mode initializing process, the processes of step MO7~MO13 are also carried out.

In step MO4, when the mode switch B is in the ON position (when the mode button B is pushed), it is determined whether the taking mode is an interval (step MO14). If it is judged as Yes when the counter memory MODEB is set to "5" and then, it is judged whether the interval time is being displayed (step M015). When the display is not displaying the interval time, processing jumps to step M021 and the flag FBB1INTO is set to "0". In step M015, when the interval time is being displayed, or in step M014, when the mode is not interval, the content obtained by adding "1" to the preceding content of the counter memory MODEB is treated as the content of this time. For example, if the preceding content of the counter memory MODEB is "2", the content of this time becomes "3" (step M016). Then, of step M017 is carried out.

Therefore, if mode button B is turned on when the taking mode is not interval or if the mode button B is turned ON when the interval time is being displayed, the taking mode is changed.

In step M017, it is determined whether the content of the counter memory MODEB is "6" or more. This determination of step M017 is made for changing the content of the counter memory MODEB to "0" when the content of the counter memory MODEB is "6" or more. The reason is that the taking mode corresponds to "0"~"5" of the content of the counter memory MODEB and there is no taking mode corresponding to "6" or more. That is, if the content of MODEB is "6" or more, it is judged as Yes and then processing goes to step M018. In step M018, the number display process is carried out. And then it goes to step M019. In step M019, the content of the counter memory MODEB is set to "0". Thereafter, the process of step M012 is carried out. Therefore, the processes of step M017~M019 mean that the taking mode is changed to one frame taking.

In step M017, if the content of the counter memory MODEB is "5"0 or less, it is determined whether the mode is an interval (step M020). In step M020, if it is determined that the mode is not an interval, the processes of step M012 and M013 are carried out and hen the processing returns to step MI58. Therefore, the processes of M017, M020, M012 and M013 mean that the taking mode mark is changed within a range from the continuous taking mode to the multiple taking mode.

Figure 27:
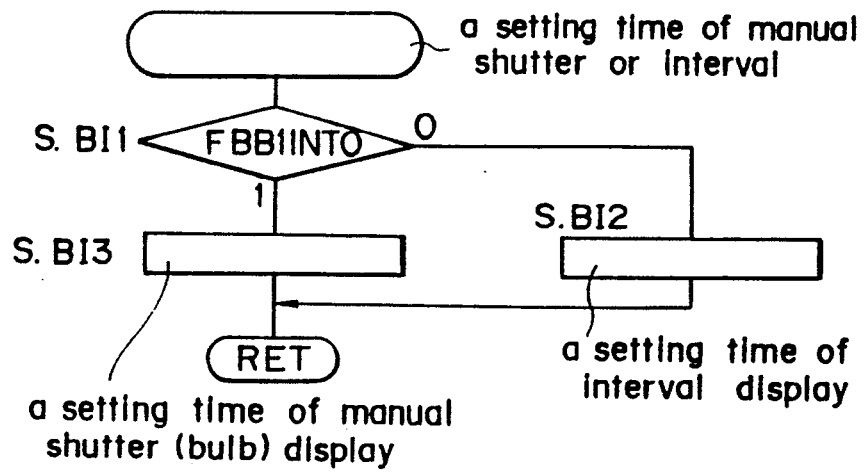
FIG. 27 is a flowchart showing a MANUAL SHUTTER TIME OR INTERVAL TIME DISPLAYING Operation.

In step M020, if the taking mode is judged as an interval, the identification flag FBB1INTO is set to "0" (step M021). Then, processing goes to step M022. In step M022, the manual shutter or interval time display process shown in FIG. 27 is carried out. In the manual shutter or interval time display (see FIG. 27), first, in step BI1, it is determined whether the flag FBB1INTO is set to "0". When the mode button B is in the ON position and the interval time is being set, as the flag FBB1INTO is set to "0", the interval time is displayed (step BI2 and processing goes to step M023. If the mode button B is turned ON when the taking mode is on interval (when it is judged as Yes in step M014) and the display is not displaying the interval time (when something else are being displayed), as processing goes via step M014, M015, M021 and M022, the interval time is likewise displayed.

Figure 26B:
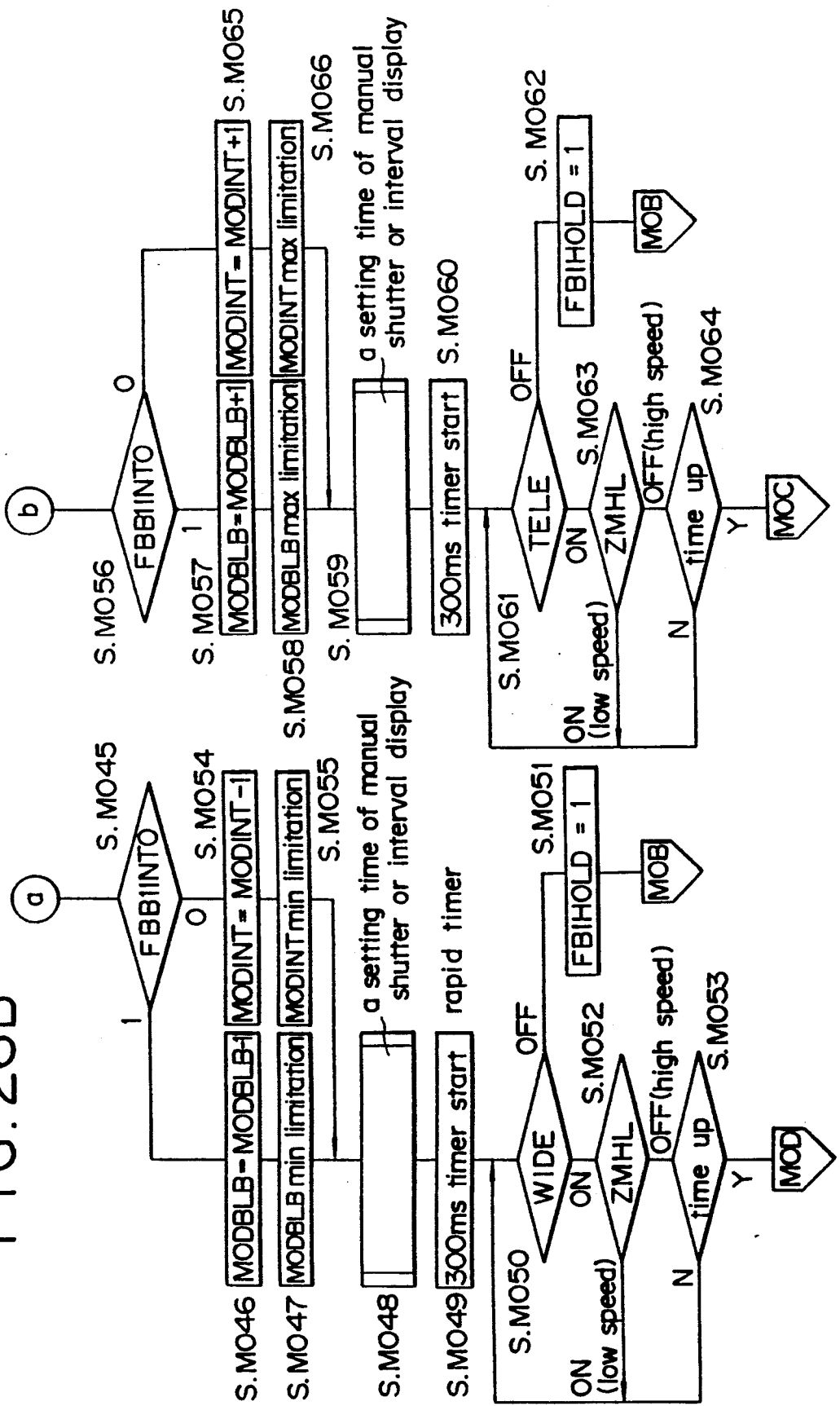

In step M023, the mode mark display process is carried out and the interval mark is displayed on the display. Display blinking flag FZML01 is set to "0". Then a 0.5 second timer is started in order to perform the display blinking process (step M025). Processing then goes to step M034 as shown in FIG. 26A. In step M034, it is determined whether the flag FBB1INTO is set to "0". As the flag FBB1INTO is set to "0" here, processing goes to step M038. Before describing step M034, there will be described a case where the mode button A is turned ON (a case where the mode button A is pushed).

When the mode button A is in the ON position in step M03, it is judged whether the exposure mode is bulb or bulb & stroboscope ON (step M026). In step M026, when the exposure mode is bulb or bulb stroboscope is ON, it is determined whether the display is displaying the manual shutter time (step M027). When the display is not displaying the manual shutter time in step M027, processing jumps to step M033 and the flag FBB1INTO is set to "1". When the display is displaying the manual shutter time in step M027, or when the exposure mode is not bulb or bulb stroboscope ON, the content of the counter memory MODEA, obtained by adding "1" to the preceding content of the counter memory MODEA is treated as the content of this time of the counter memory MODEA. For example, when the content of the counter memory MODEA is "5", the content of this time of the counter memory becomes "6" (step M028).

Processing then goes to step M029. By this, if the mode button A is turned ON when the exposure mode is not bulb or bulb stroboscope is, or when the display is displaying the manual shutter time, the exposure mode is changed.

In step M029, it is determined whether the content of the counter memory MODEA is "63& or more. The determination of step M029 is made for changing the content of the counter memory to "0" when the content of the counter memory MODEA is "6" or more. The reason is that the taking mode corresponds to "0"~"5" of the content of the counter memory MODEA and there is no taking mode corresponding to "6" or more. That is, if the content of MODEA is "6" or more in step M029, it is judged as Yes and the number display process is carried out (step M030) before processing goes to step M031.

In step M031, the content of the counter memory MODEA is set to "0". Then, processing goes to step M012. Therefore, the processes of step M029~M031 mean that the exposure mode is changed to auto. When the content of the counter memory MODEA is "5" or less in step M029, it is determined whether the exposure mode is bulb or bulb stroboscope ON (step M032).

When the exposure mode is not bulb or bulb & stroboscope ON in step M032, the processes of step M012 and M013 are carried out and processing returns to step MI58. Therefore, the processes of step M029, M032, M012 and M013 mean that the exposure mode is changed within a range from the stroboscope ON to the exposure correction.

In step M032, when the exposure mode is bulb or bulb & stroboscope ON, the flag FBB1INTO is set to "1" (step M033). Thereafter, the manual shutter or interval time display, shown in FIG. 27, is carried out in step M022. In the manual shutter or interval time display (step BI1), it is determined whether the flag FBB1INTO is "0". When the mode button A is in the ON position and the manual shutter time is set, as the flag FBB1INTO is set to "1", the manual shutter time is displayed (step B13) and processing returns to step M023. If the mode button A is turned on when the exposure mode is bulb or bulb & stroboscope is ON and the manual shutter time is not being displayed, as processing goes via steps M026, M027, M033 and M022, the manual shutter time is likewise displayed. Then, the mode mark process is carried out in step M023. Thereafter, in step M024, the display blinking flag FZML01 is set to "0", a 0.5 second timer is started (step M025) and processing goes to step M034 as shown in FIG. 26A.

Next, the processes after step M034 will be described.

Suppose that the mode button A is turned ON and the flag FBB1INTO is set to "0". Then, it is judged that the flag FBB1INTO is set to "1" in step M034 and processing goes to step M035. In step M035, it is determined whether the mode button A is in the ON position. When the mode button A is in the OFF position, the blinking of the manual shutter time display is canceled (step M037). Then, the flag FMDCHG is set to "1" (step M039) and processing goes to step MI58 of the MAIN flow. In step MI58, as the flag FMDCHG is set to "1", the display is continuously displaying the one second manual shutter time (see step MI59, MI67 and MI66). Then, the mode button B is turned ON and when the flag FBB1INTO is set to "0", it goes to step M036. When the mode button B is in the OFF position in step M036, the blinking of the interval time display is canceled (step M040) and processing goes to step M039. The flag FMDCHG is set to "1" in step M039 and then the process of step MI58 of the MAIN flow is carried out, In step MI58, as the flag FMDCHG is set to "1", process goes to step MI59. By this, the display keeps displaying the one second interval time (see step MI58, MI67 and MI66).

The blinking of the manual shutter time display and the blinking of the interval time will now be described.

When the mode button A is in the ON position in step M035, or when the mode button B is in the ON position in step M036, the charging stop process is carried out (step M042). The charging stop process is performed in order to avoid the continuation of charging when it goes into the processes after step M042 during the charging. After the process of step M042 is performed, it is determined whether the tele switch TELE is in the ON position (step M043). When the tele switch TELE is in the ON position, it is determined whether the flag PBB1INTO is set to "1" (step M056). When the tele switch TELE is in the OFF position, it is determined whether the wide switch WIDE is in the ON position (step M044).

Figure 28:
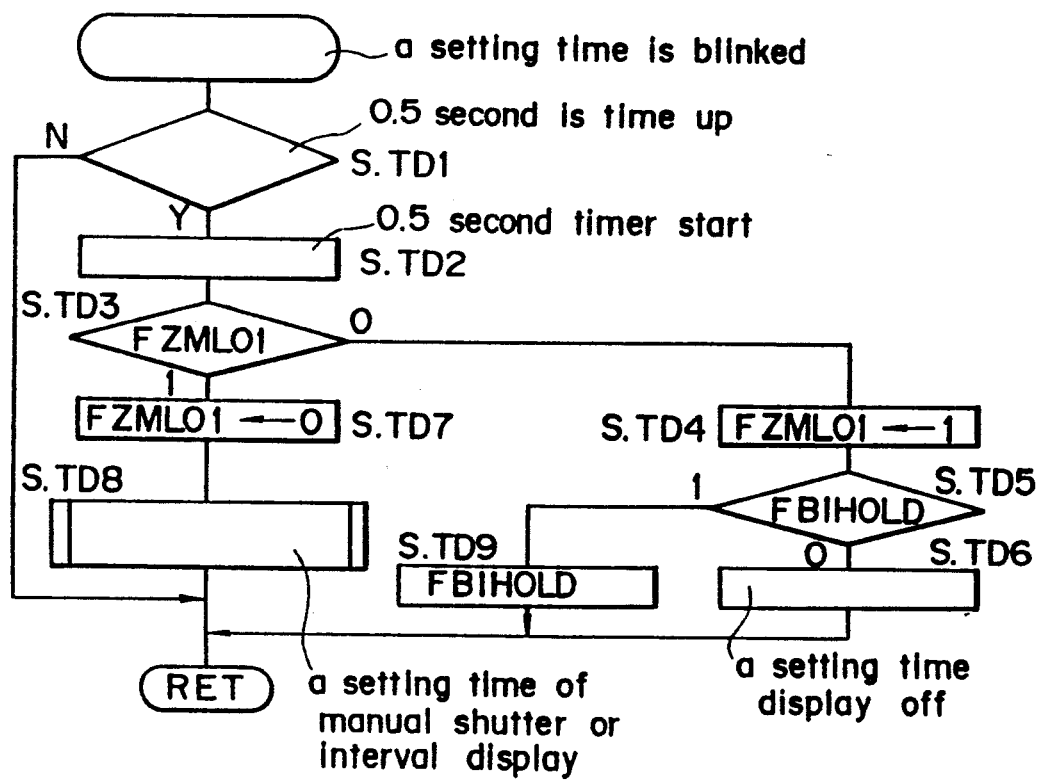
FIG. 28 is a flowchart showing a BLINK TIME DISPLAYING Operation.

When the wide switch WIDE is in he OFF position in step M044, the time display blinking process shown in FIG. 28 is carried out (step M044'). In the time display blinking process, it is determined whether the 0.5 second timer is timed up. When the 0.5 second timer is not timed up, processing returns to step M034 and the processes after step M034 are carried out. When the mode button A or the mode button B is kept depressed, processing comes back again to step TD1 via step M043, M044, and M044'. When the 0.5 second timer is timed up in step TD1, the 0.5 second timer is started again in step TD2. Then, it is determined flag FZML01 is set to "0" (step TD3).

At first, as the flag FZML01 is set to "0" in step M024, the flag FZML01 is set to "1" (it goes to step TD4) before going to step TD5. To determine whether the flag FBIHOLD is set to "0". At first, as the flag FBIHOLD is set to "0", the display does not display the time (step TD6). Processing again reaches step TD1 where the display keeps displaying no time until the 0.5 second timer is timed up. When the 0.5 second timer is timed up, processing goes to step TD2 to start the 0.5 second timer again.

Thereafter, processing goes to step TD3 where it is determined whether the flag FZML01 is set to "0". As the flag FZML01 was set to "0" when the processing goes via step TD4, step TD5 and TD6, it goes to step TD7 this time. In step TD7, the flag FZML01 is set to "0", and then it goes to step TD8. In step TD8, the display B indicates the manual shutter or interval time. Therefore, when the mode button A or the mode button B is kept depressed, the manual shutter or interval time is blinked at a rate 1Hz.

In step M044, when the wide switch WIDE is in the ON position, processing goes to step M045. Therefore, the time display blinking process is not carried out, and the display does not display the blinking of the manual shutter or interval time. In step M045, it is determined whether the flag FBB1INTO is set to "1". When the flag FBB1INTO is set to "1" in step M045, a value is obtained by deducting "1" from the preceding content of the counter memory MODBLB is treated as the content of this time of the counter memory MODBLB (step MO46). For example, when the preceding content of the counter memory MODBLB is "6", the content of the counter memory MODBLB becomes "5". Thereafter, a process of this counter memory MODBLB min. is carried out (step M047). The limiting counter memory MODBLBmin is a process for setting the content of the counter memory MODBLB to "0" when the MODBLB is less than "0". The reason is that there is no manual shutter time corresponding to those less than "0".

After step M047 is performed, the manual shutter or interval time display process shown in FIG. 27 is carried out in step M048. After the manual shutter or interval time display process is finished, a 300 ms timer is started (step M049). Thereafter, a determination is made as to whether the wide switch WIDE is in the ON position (step M050). When the wide switch WIDE is in the OFF position, the flag FBIHOLD is set to "1" (step M051) and the processes after step M034 are carried out. When the wide switch WIDE is in the ON position, it is judged whether the speed switch-over switch ZMHL is in the ON position (step MOS52).

By this, it is determined whether the switching of the display of the manual shutter time or interval setting time is changed step by step or the same is changed continuously.

That is, when the zoom lever is in a state corresponding to the direction where the zoom lens is moved towards the wide position at a high speed by the zoom lens lever (when the zoom lever is largely moved from the center position), it is judged whether the 300 ms timer has timed up (step M053).

This loop, comprising step M050, step M052 and step M053 is repeated until the 300 ms timer has been reached. When the 300 ms timer is reached in step M053, processing goes to step M044, where the steps M044~M053 are repeated. By this, the content of the counter memory MODBLB is subtracted every 300 ms. That is, the manual shutter time or interval time is continuously changed.

When the zoom lever is in a state corresponding to the direction where the zoom lens is moved towards the wide position at a low speed by the zoom lever (when the zoom lever is moved a little from the center position), the loop comprising steps M050 and M052 is repeated until the wide switch is turned OFF in step M050. Therefore, although the content of the counter memory MODBLB is changed immediately after the wide switch WIDE is brought to the ON position from the OFF position, the content of the counter memory MODBLB is not changed thereafter. Therefore, if the zoom lever 10 is lightly operated to repeat the ON and OFF operation of the wide switch WIDE, while the mode button A or mode button B is depressed, the manual shutter time is changed step by step.

In step M045, when the flag FBBINTO is set to "0", the content of the counter memory MODINT obtained by deducing "1" from the preceding content of the counter memory MODINT (step M054). Then, a limit process of the MODINTmin is carried out in step M055. The MODINTin process sets the content of the counter memory MODINT to "0" when the content of the counter memory MODINT is "0" or less. The reason is that there is no interval time corresponding to "0" or less. The processes of step M048~M053 are continuously carried out. Because the deduction process of the interval time, is carried out in the same manner as the deduction process of the manual shutter time, the detail thereof will be omitted.

When the mode button A or the mode button B is kept depressed to change the manual shutter time or interval time and the wide switch WIDE is turned OFF, the flag FBIHOLD is set to "1" (step M051) and as long as the mode button A or the mode button B is turned OFF, the processes of step M043, M044 and M044' are executed and the process reaches the time display blinking process. Since the process judges that the flag FBIHOLD is set to "1" in step TD5, the process goes to step TD9. Therefore, immediately after a desired manual shutter or interval time is finally obtained, the finally obtained manual shutter time or interval time remains displayed on the display for a predetermined time. That is, the display does not display the blinking of the manual shutter or interval time immediately. If the mode button A or the mode button B is kept depressed thereafter, the display displays the blinking of the manual shutter time or the interval time. In step TD9, the flag FBIHOLD is set to "0".

In step M043, when the tele switch TELE is in the ON position, processing goes to step M056. When the flag FBB1INTO is set to "1", an adding process is carried out such that a new value is obtained by adding "1" to the preceding content of the counter memory MODBLB (step M057). Afterwards, a the limit setting process MODBLBmax is carried out (step M058), and the process goes to the manual shutter or interval time display to display the manual shutter or interval time. Thereafter processing goes to step M060 to start the 300 ms timer before going to step M061 to judge whether the tele switch TELE is in the ON position. When the tele switch TELE is in the ON position, processing goes to step M063 to judge whether the velocity switch-over switch ZMHL is in the ON position. When the zoom lever is in a state corresponding to the direction where the zoom lens is moved towards the tele position at a low speed by the zoom lever (when the zoom lever is moved a little from the center position), the loop comprising step M061 and step M063 is repeated. When the zoom lever is in a state corresponding to the direction where the zoom lens is moved towards the tele position at a high speed by the zoom lever, processing goes to step M064 to judge whether the 300 ms timer is timed up. The processes of step M061~M064 are repeated until the 300 ms timer is timed up. When the 300 ms timer is timed up in step M064, the loop after step M043 and M056 is repeated via step M043. As the process when the tele switch TELE is in the ON position is the same as the process when the wide switch WIDE is in the ON position except that the manual shutter or interval time is subjected to a reduction process when the wide switch WIDE is in the ON position but the same is subjected to an addition process when the tele switch TELE is in the ON position, the detailed description thereof will be omitted.

AEAF(AUTO EXPOSURE AND AUTO FOCUS) CONTROL Operation

Figure 29A:
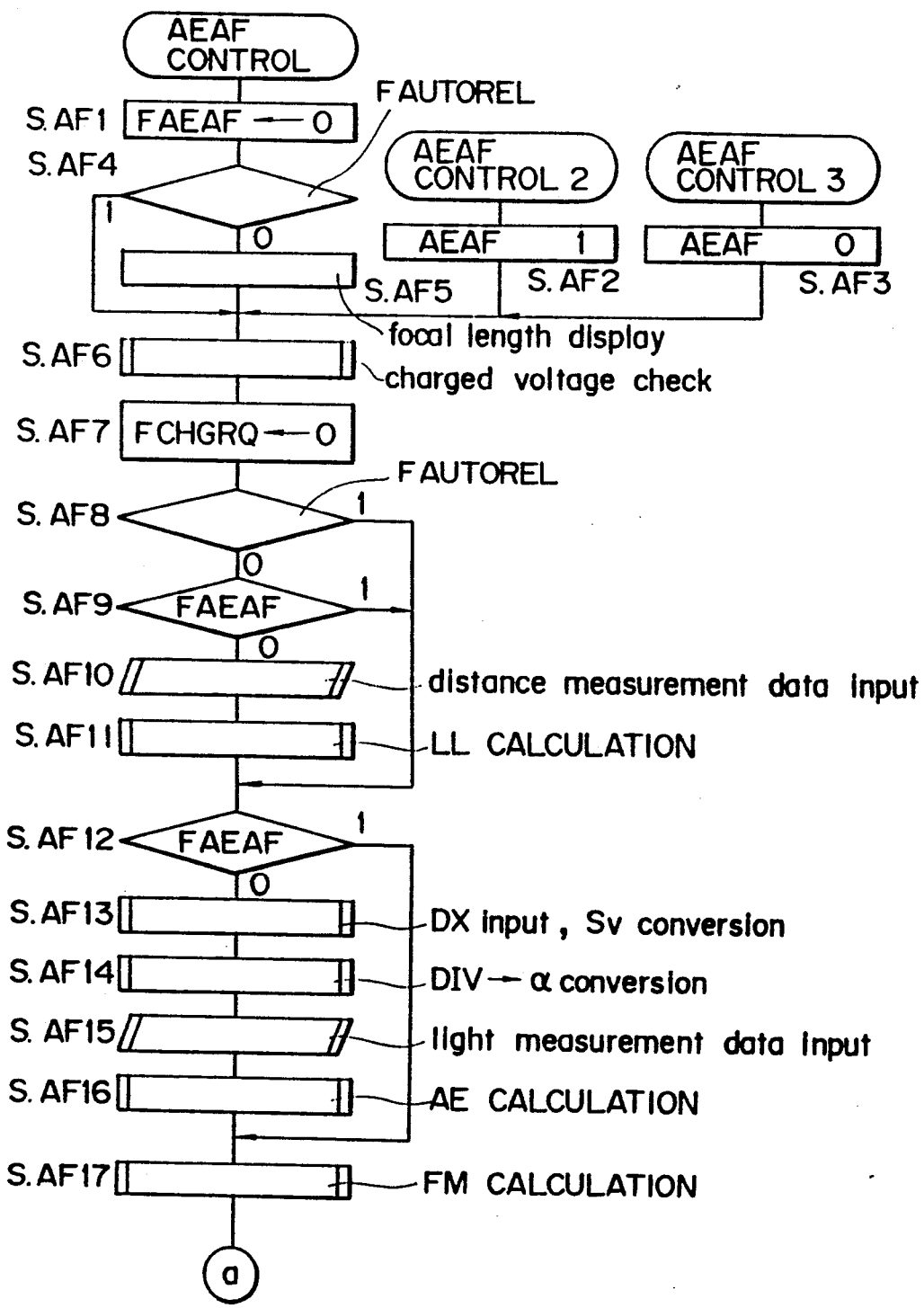
FIG. 29 comprising FIGS. 29A and 29B, FIG. 30 comprising
Figure 29B:
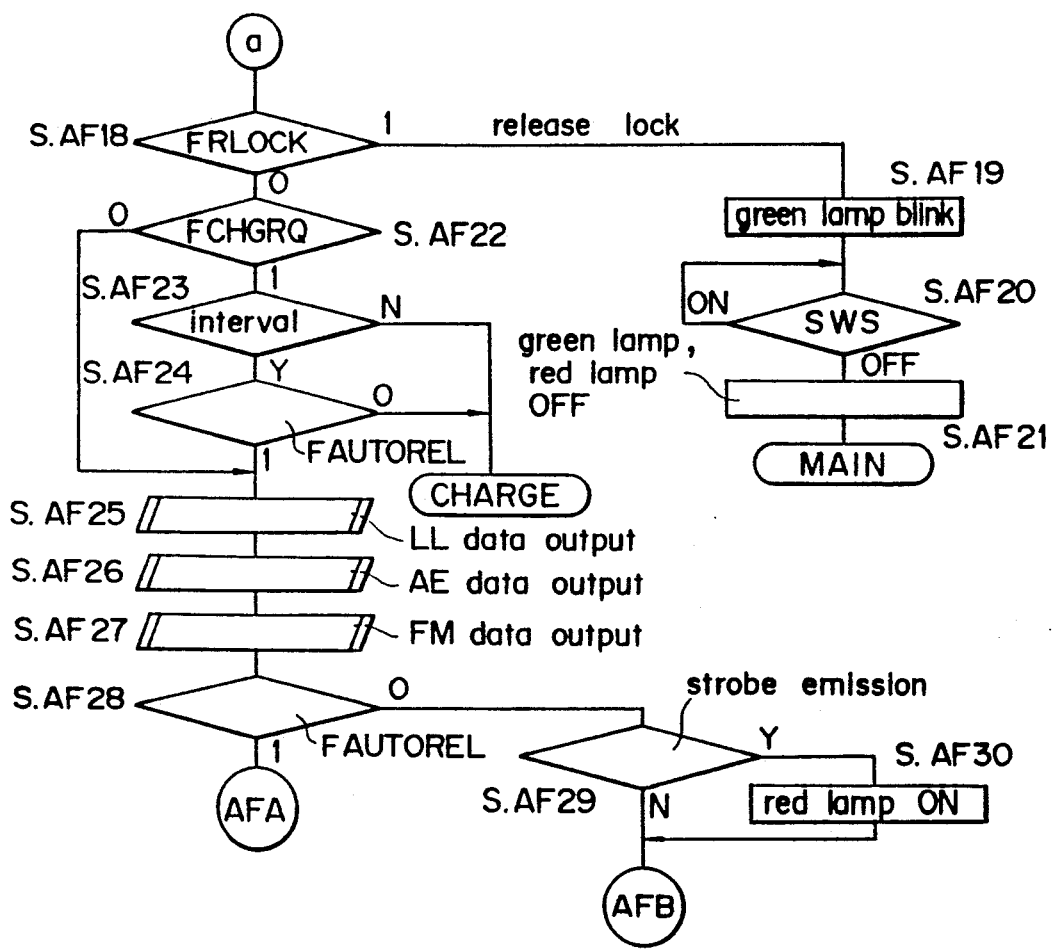
Figure 29:
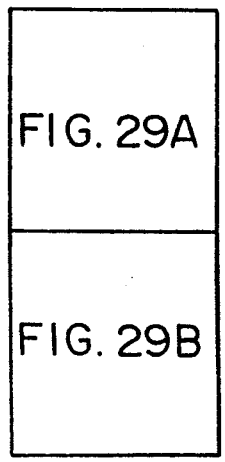
Figure 30B:
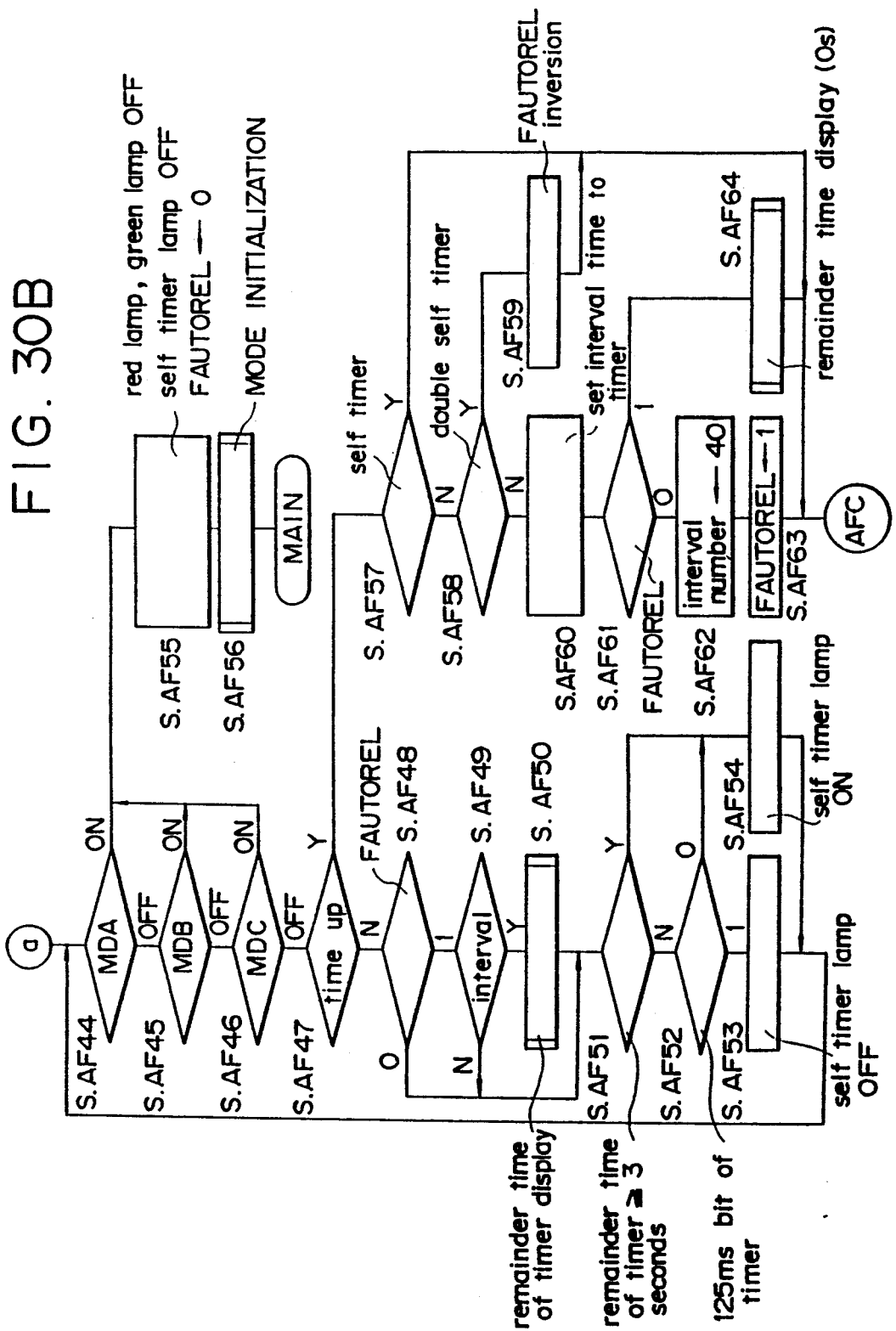
Figure 31:
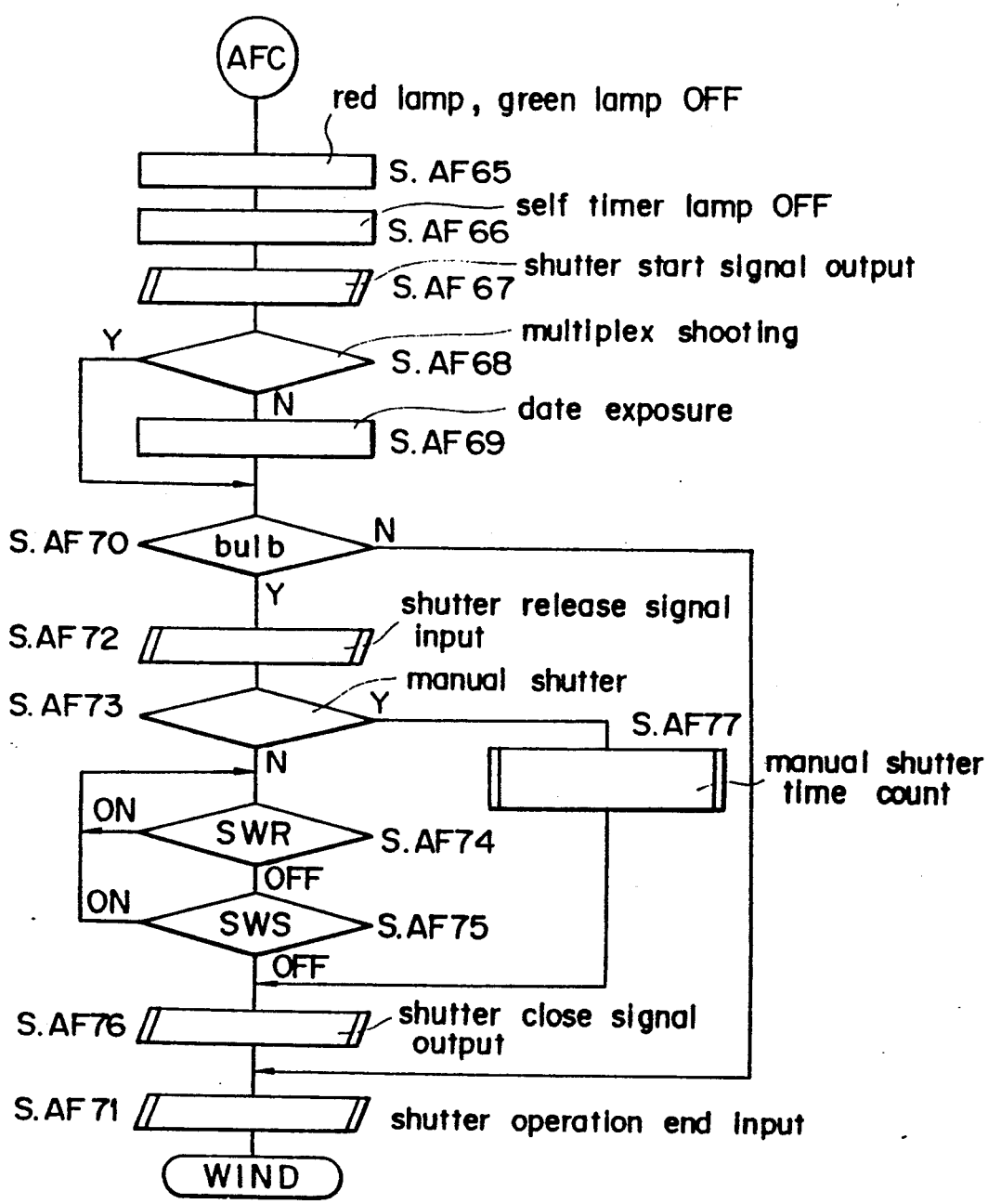

FIGS. 29 to 31 show the flowcharts for the AEAF CONTROL Operation that diverges from the MAIN Operation at step MI65.

This operation is executed when a photometric switch SWS changes from OFF to ON, and a combination of the modes is correct. Also, this operation is executed from a terminal of AEAF CONTROL 2 after the operation temporarily diverges a CHARGE operation during this operation, from terminal of AEAF CONTROL 3 after winding in a continuous photographing mode.

In steps AF1 to AF3, when the operation diverges from a midway of AEAF CONTROL Operation to CHARGE operation and hen returns again to this operation, as the photometry operation and the distance measurement operation are already finished, as will be described hereinafter, AEAF jump flag FAEAF is represented by a 1 in order to jump these operations. Otherwise the flag is represented by a 0.

When the operation diverges from the MAIN Operation, the operation follows the state of the auto release flag FAUTOREL in the steps AF4 and AF5. If the auto release flag FAUTROREL is 0, the focal length is displayed. This flag is set to 1 at the time when the second shooting downward in interval mode or the second shooting in double self mode are executed. In these cases, the photographing is automatically executed even if the photometric switch SWS and the release switch SWR are in the OFF position.

The voltage checking operation in the step AF6 measuring the charged voltage of a strobe condenser. When the voltage is a 270 V or more, 270 V charged flag FFCH270 is represented by 1, and DGV is set by dividing the voltage into three stages with reference to 315 V and 285 V. The strobe condenser is full charge at a voltage of 330 V, and the guide number of the strobe is determined in accordance with a full charge condition. On the other hand, this camera is controlled such that the strobe is emitted with 270 V or more, even if the condenser is not fully charged.

Therefore, when the voltage does not reach 315 V, it is necessary to set a lower the guide number because otherwise, the exposure becomes under exposure. DGV is a parameter indicating the lowering of the guide number due to a fall of the strobe charged voltage. DGV is set to 0/4 at a voltage of 315 V or more, ¼ at 285 V ~ 315 V and 2/4 at 285 V or less.

In the step AF7, the charge request flag FCHGRQ, which is established through an FM calculation, as will be described hereinafter is set to 0.

Steps AF8 and AF9 are performed to determine the conditions of the FAUTOREL flags. When both flag and FAEAF flag are 0, steps AF10 and AF11 are executed.

This condition means not to be the interval mode or second shooting of double self timer mode, and the AEAF CONTROL Operation diverges from the MAIN Operation or the WIND operation. In step AF10, the distance measurement data from the set CPU is inputted, and the LENS LATCH (LL) CALCULATION subroutine (see FIG. 32) is executed (step AF11). The LL CALCULATION subroutine is an operation for determining an amount to move the taking lens to focus the taking lens according to the distance measurement data.

When at least one of these flags is equal to 1, steps AF10, AF11 are skipped. This condition means that the camera is in the interval mode or second shooting of the double self timer mode.

In this condition, LL data which were obtained in the preceding LL CALCULATION subroutine, are directly used. Therefore, when the interval photographing is executed, the focus status is the same as the first shooting. When the interval photographing is executed, the photographer is usually away from the camera. For example, when a slightly moving object is photographed, if the distance measurement is performed every time the photographing operation is performed, it becomes out-focus when the object is moved away from the center of the screen. The reason is that the auto-focus operation is executed by measuring a distance to the object positioned in the center of the screen.

In steps AF12~AF16, all procedures relating to photometry are carried out, except for a case where the routine comes back to the AEAF operation from a temporarily diverged CHARGE operation. In step AF13, the DX code of the film that is placed in the camera is input and converted to sensitivity information Sv.

Then the division code DIV is alpha-converted in step AF14 for use in a FM (FLASHMATIC) CALCULATION subroutine to be discussed below, wherein the alpha value comprises an amount of variation in a Full-Open Aperture F-number of the zoom lens positioned at the specified focal length position, with respect to the Full-Open Aperture F-number of the zoom lens positioned at the WIDE extremity.

In step AF15, photometry data is obtained from the sub CPU, while in step AF16, an AE (AUTO EXPOSURE) CALCULATION subroutine (see FIG. 33) is called and AE data is calculated.

Figure 34:
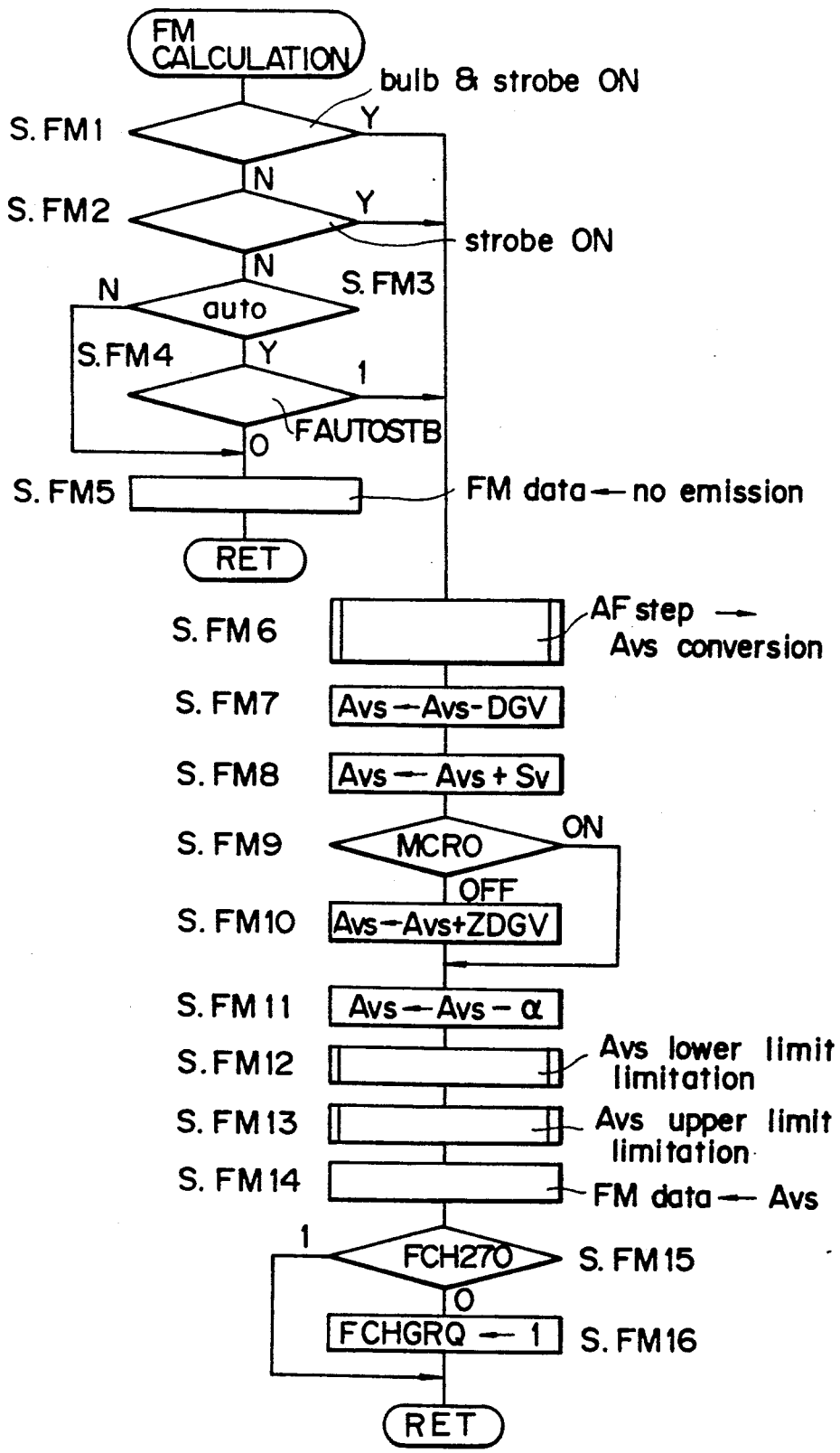
FIG. 34 is a flowchart showing a FM(FLASH MATIC CALCULATION) subroutine.

In Step AF17 the FM(FLASHMATIC) CALCULATION subroutine shown in FIG. 34 is called and the FM data is set. When the routine comes back to this operation from the temporarily diverted CHARGE operation, the AE CALCULATION subroutine is skipped. However, as there is a possibility that DGV has changed due to charging, the FM CALCULATION is executed again.

After the FM CALCULATION subroutine is completed, step AF18 is executed to decide the state of the release lock, with reference to the FRLOCK flag. If flag FRLOCK is set to 1, steps AF19-21 are executed. The release lock is set in such cases as that the lens is located in the zoom area and the object is too near and that the lens is located in a macroposition and the object is too far. In these cases, as it is difficult to obtain a well-focused photograph, a green lump is blinked to give a warning to that effect in step AF19~AF21. After the photometric switch SWS is turned OFF. the red lamp and the green lamp are turned OFF before returning to the MAIN Operation.

flag FRLOCK is set to 0, in step AF18 a determination is made as to whether processing is to be diverged for the CHARGE Operation. In step AF22-AF24, when the charge voltage of the strobe condenser does not reach a predetermined value, and therefore a charge is demanded, the routine is diverged to the CHARGE Operation of FIG. 35, under the conditions that the operating mode is not the interval mode or even if the mode is the interval mode, the photographing operation is for the first shooting. That is, in the second shooting downward of the interval photographing, even when the charge voltage does not reach the predetermined value, the strobe is emitted by only the charged voltage and the following release sequence is executed.

Figure 38:
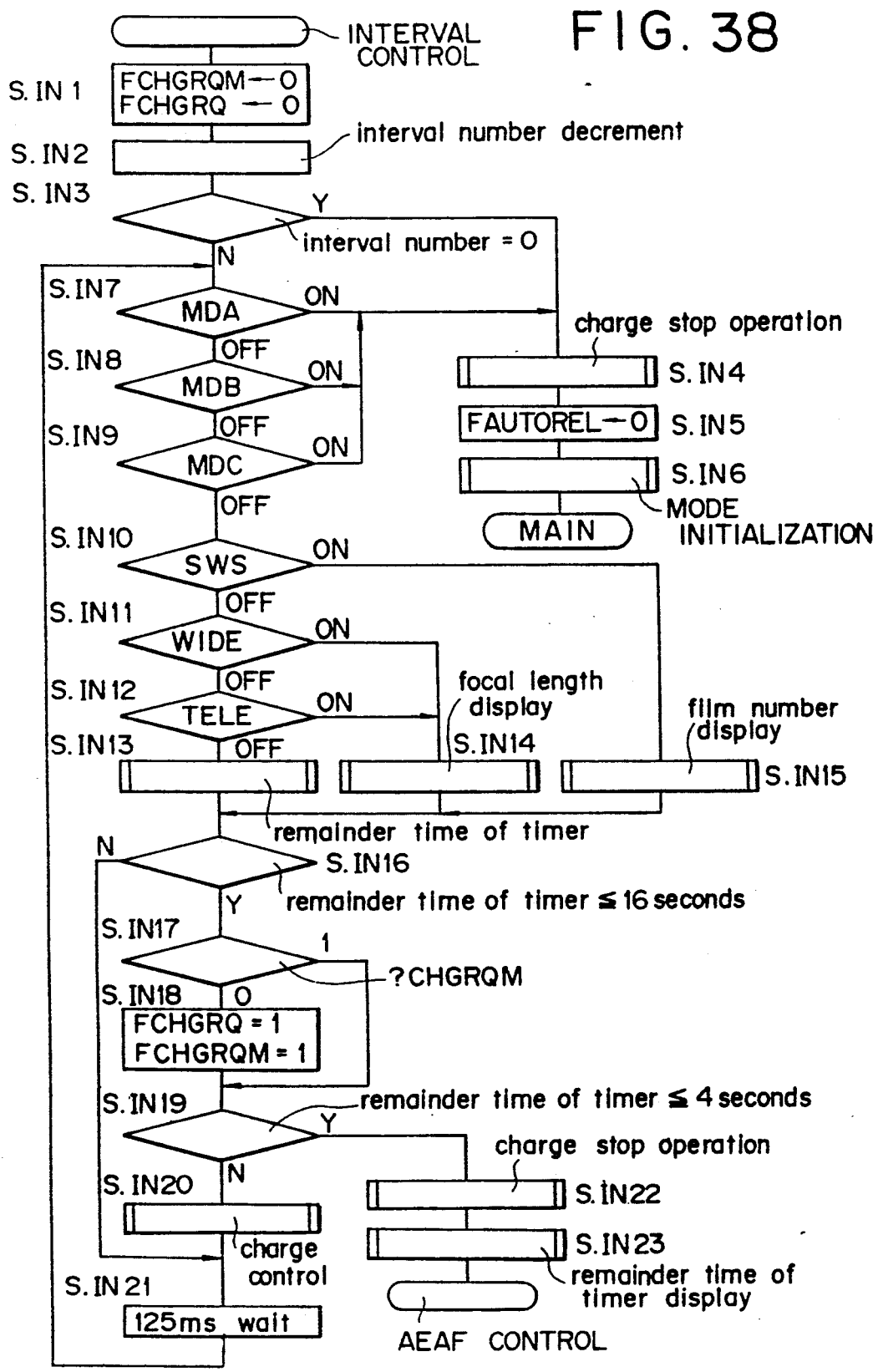
FIG. 38 is a flowchart showing an INTERVAL CONTROL Operation.

In the INTERVAL CONTROL Operation, as is shown in FIG. 38, a charge control is effected every time one photograph is taken. The reason is that when the charge voltage does not reach the predetermined voltage in this control operation, the voltage is not to be increased, even if the charge control is executed again.

In steps AF25-AF27, the lens latch (LL) data is outputted to the sub CPU, automatic exposure (AE) data for the shutter control is supplied to the sub CPU and flashmatic (FM) data to be used for the strobe emission timing is provided to the sub CPU.

When flag FAUTOREL is set to 1 (automatic taking mode), a determination of the lamp indication and status of the photometric switch and release switch are skipped, and processing jumps to a terminal AFA in FIG. 30. When flag FAUTOREL is set to 0 (normal taking mode), in case the strobe is flashed based upon FM data in steps AF29 and AF30, the red lamp is lit up and the process moves to step AF31 showing in FIG. 30A;

Step AF31 is performed to determine whether the green lamp indicator should blink or be continuously turned ON with reference to flag FGLMPEL, which was set in the LL CALCULATION subroutine. If flag FGLMPEL, is set to 0, the green lamp indicator is continuously turned ON (step AF32). Otherwise, the green lamp D blinks (step AF33).

The activation of the green lamp means one can take a photograph, while the blinking thereof acts as a warning.

In steps AF34 and AF35, the process waits for the release switch SWR to be turned on under the condition that the photometric switch SWS is kept in the ON position. When the SWS is turned OFF, that is, when the finger is removed from the shutter button, the red lamp and green lamp are turned (step AF34a) and the control operation is moved to the MAIN Operation. When the release switch SWR is turned ON, the control operation proceeds to step AF36.

In steps AF36~AF43, the three second timer is started when the first shooting of the interval photographing occurs. Similarily, a ten second timer is started when the first shooting is made in the self timer mode, or double self timer mode, and a five second timer is started when the second shooting is made in the double self timer mode. In the case of the second shooting downward of the interval photographing, as the timer is operated in accordance with the content of MODEB, as mentioned above, it directly goes to the time count operation of step AF44. When the mode is neither the interval mode nor the self timer mode, processing jumps to step AF65, shown in FIG. 31.

Steps AF44~AF54 constitute a loop for waiting for the above-mentioned timer to be timed up. Besides the time-up, the operation can be escaped from the loop by means of the operation of a mode button. In this case, the red and green lamp and the self timer lamp are turned OFF in steps AF55 and AF56 and the auto release flag FAUTOREL is cleared. After calling the MODE INITIALIZATION operation of FIG. 25 (step AF56), processing jumps to the MAIN Operation. In the second shooting downward of the interval mode, the remaining time of the timer is displayed.

When the remaining time of the timer becomes three seconds or less, the self timer lamp blends at a rate of 4Hz.

When the time is up, in the case of the self timer, processing goes to the terminal AFC of FIG. 31 and in the case of the double, it goes to step AF65 of FIG. 31 after the flag FAUTOREL is inverted (in AF59) in the case of the double self, timer mode the flag FAUTOREL is set from 0 to 1 when the first shooting is made and returned from 1 to 0 when the second shooting is made and the automatic photographing made is released.

In the case of the interval mode, the interval time established in steps AF60~AF64 is set by the timer, and the maximum value of the number of taking frames is set to 40 frames when the first shooting is made and the auto release flag FAUTOREL is set to 1 in order to automatically execute the second shutting downward. When the second shooting downward is made, the remaining time display is set to "0". Processing then goes to step AF65. Step AF64 is performed in order to prevent the display from indicating numerical figures other than 0 when the to time is up. If this procedure did not exist, the display would not be set to "0" when the timer is up. For example, if we have a 100 second timer, the timer changes as follows "100", "99", "98". . . . "1", "100", "99", . . . However, it is desirable that the display be set to indicate "0" when the shutter is released. Therefore, step AF64 is included to forceably set the display to indicate "0".

In steps AF65~AF67, the lamps are all turned off before the exposure is executed and he shutter start signal is outputted to a sub CPU. In steps AF68 and AF69, a date exposure is prohibited when multiple photographing is effected.

Figure 37:
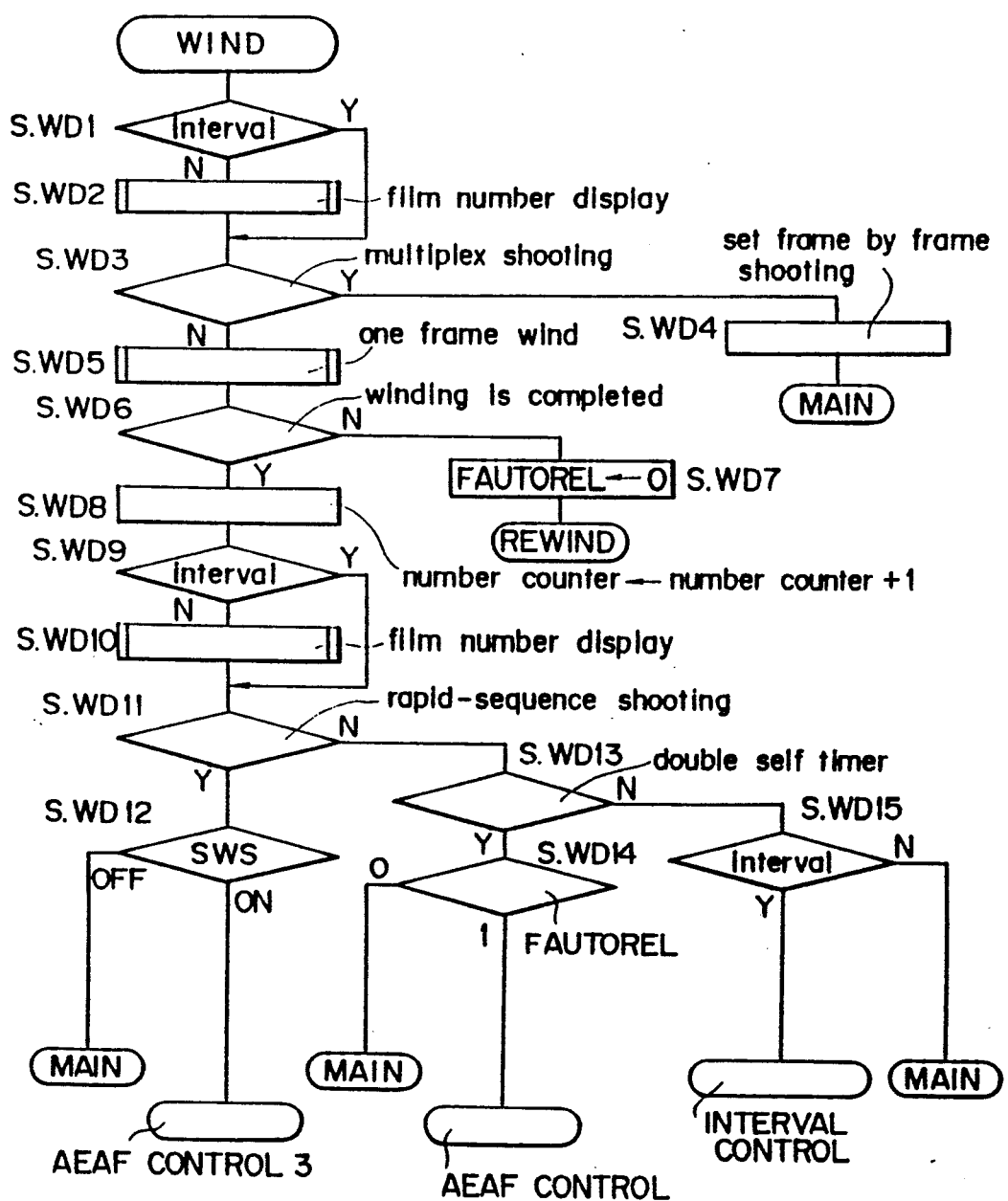
FIG. 37 is a flowchart showing WIND Operation.

If the mode is not the bulb mode, the operation diverges from step AF70 and the input of a shutter operation finish signal from the sub CPU is confirmed in step AF71. processing then proceeds to the WIND Operation of FIG. 37.

Figure 36:
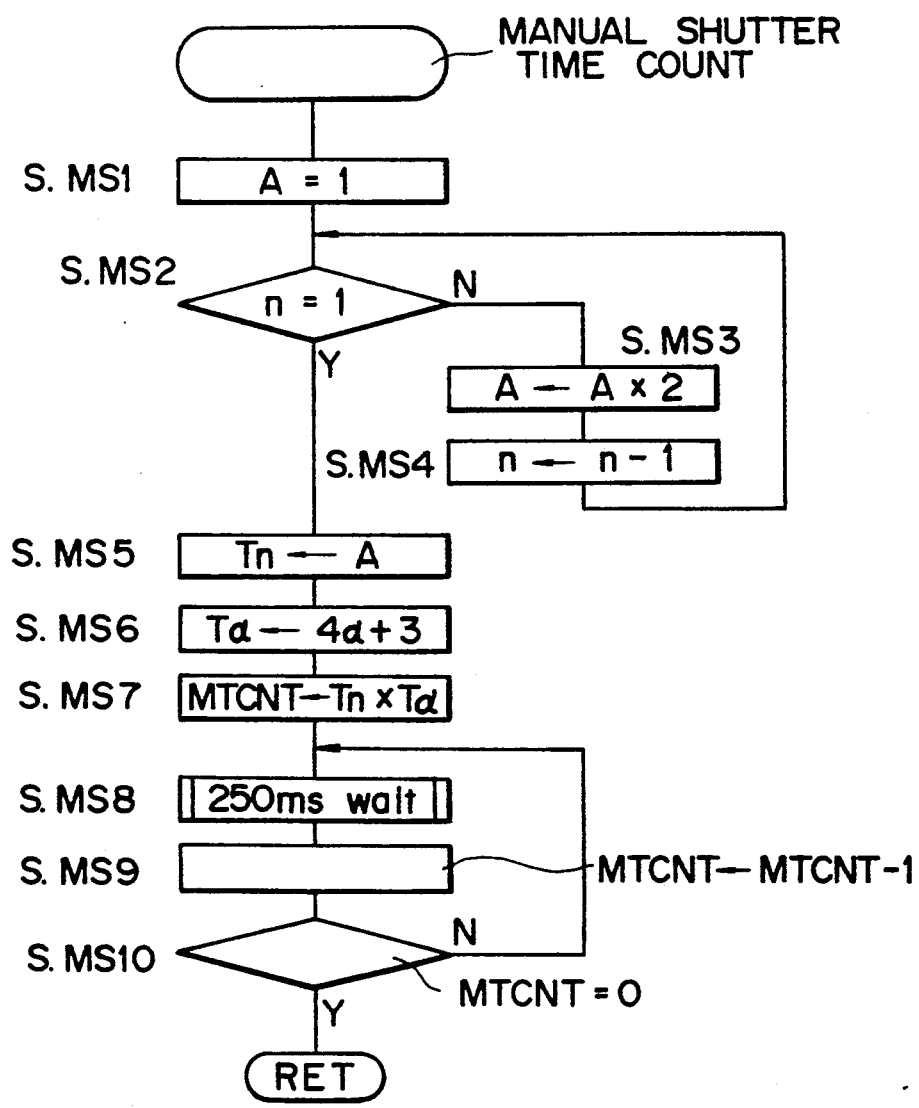
FIG. 36 is a flowchart showing MANUAL SHUTTER TIME COUNT Operation.

When the mode is the bulb mode, the input of the shutter start signal from the sub CPU is confirmed in step AF72 and it is determined in step AF37 whether the photographing is the bulb exposure photographing or the manual shutter photographing. If it is the bulb exposure photographing, processing waits in steps AF74 and AF75 until the photographer 0 finger is removed from the shutter button and both the photometric switch SWS and release switch SWR are turned OFF. Then, a shutter close signal is outputted in step AF76. If it is the manual shutter, the MANUAL SHUTTER TIME COUNT subroutine of FIG. 36 is called in step AF77 and a shutter operation end signal is output after counting operation is finished.

LL(LENS LATCH) CALCULATION subroutine

Figure 32:
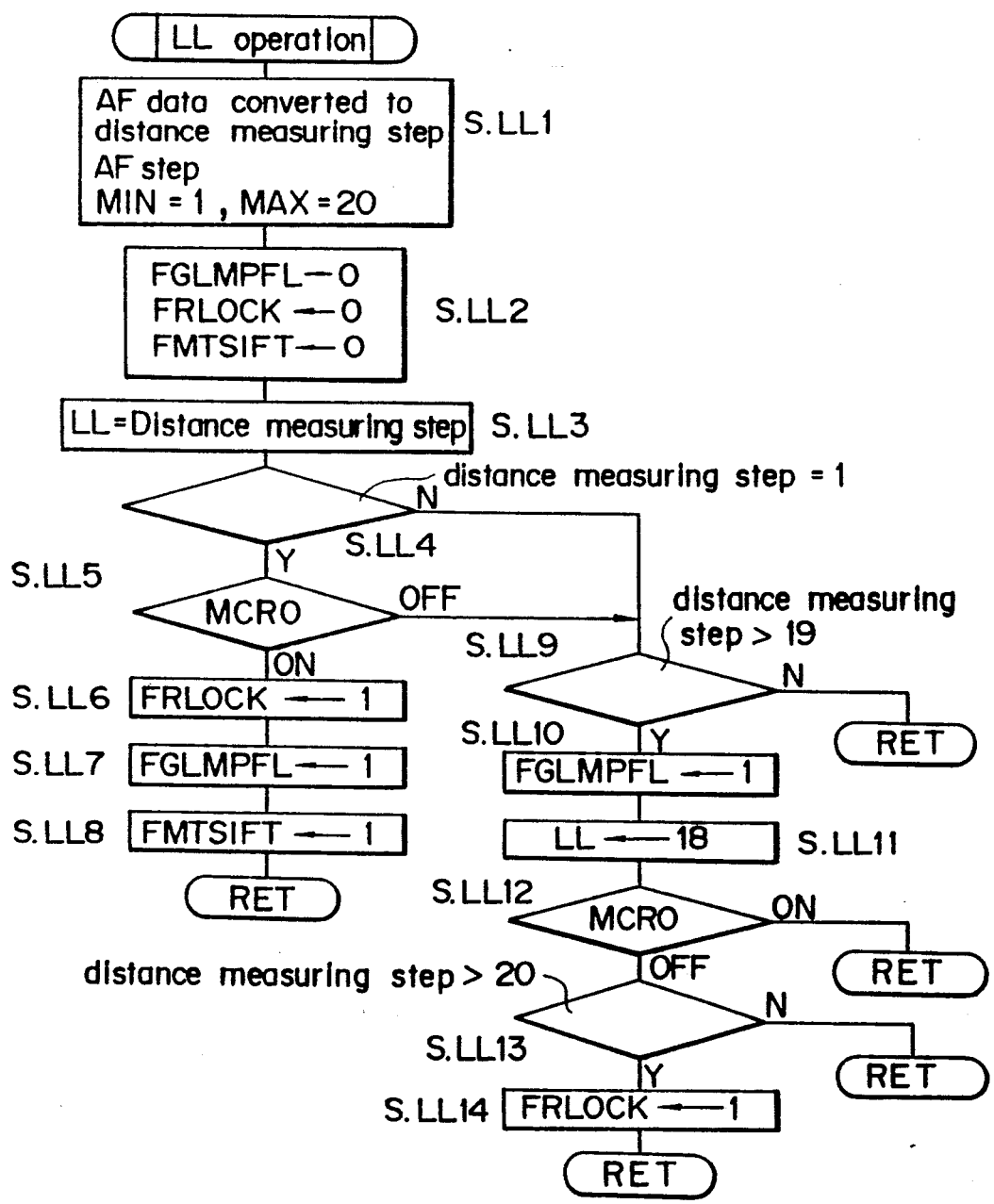
FIG. 32 is a flowchart showing all (LENS LATCH) CALCULATION subroutine.

FIG. 32 shows a flowchart of the LL CALCULATION subroutine that is called from the AEAF CONTROL Operation at step AF11.

In the L CALCULATION subroutine, AF data (distance-measurement-information) is converted to the distance measurement step in step LL1, with reference to TABLE 4. Then, a limit processing, which limits the range for the distance measurement step between "1 and 20" is performed. In step LL2, flag FGLMPFL, which judges if the green lamp indicator D should blink, is set to 0. Flag FMTSIFT, which is the flag to determine if the taking lens should be shifted from the macro extremity to the tele extremity, is set to 0.

When flag FGLMPFL equals 1, the green lamp indicator D blinks. Flag FRLOCK being equal to means the release to lock. Having flag FMTSIFT equal to 1 means the operation of the lens should shift from the macro extremity to the tele extremity.

Then, step LL3 is executed to set a temporary lens latch LL value that is equal to the distance measurement step value so that the number of the lens latch steps corresponding to the distance measurement steps can be obtained.

In step LL4, a determination is made as to whether the distance measurement stop equals "1". When the distance measurement equals "1", step LL5 is performed to determine if the macro switch MCRO is ON. When the distance measurement step is equal to "1" and the macro switch is ON, flags FRLOCK, FGLMPFL and FMTSIFT are each set to 1 (steps LL6–LL8) before the LL CALCULATION subroutine exits and returns to step AF12 of the AEAF CONTROL Operation. In this condition, the release lock is applied, even f the shutter button is pressed. When photometric switch SWS is pressing the shutter button 15, the lens is shifted from the macro extremity to the tele extremity. Then, processing returns to the AEAF CONTROL Operation.

When the distance measurement step is not equal to "1" or the macro switch MCRO is OFF, even if the distance measurement step is equal "1", step LL9 is performed to determine whether the distance measurement step is more than "19".

When the distance measurement step is less than "19", the subroutine exits and returns to the AEAF CONTROL Operation. In either the macro mode or the zoom mode, when the distance measurement step is more than "2" and less than "19", the processing returns to the AEAF CONTROL Operation. Therefore, when the distance measurement step is "1" and the zoom mode is set, the release lock is not applied.

not applied, even when a subject is too close for an in-focus picture to be taken.

TABLE 4

| STEP | CHANGING DISTANCE ZOOM | CHANGING DISTANCE MACRO | ZOOM LENS LATCH | ZOOM FOCUS POINT | MACRO LENS LATCH | MACRO FOCUS POINT |
|---|---|---|---|---|---|---|
| 1 | | | 1 | 10.00 m | | WARNING |
| | 6.00 m | 1.00 m | | | | |
| 2 | | | 2 | 5.10 m | 2 | 0.97 m |
| | 4.50 | 0.94 m | | | | |
| 3 | . | . | 3 | | 3 | . |
| | . | . | . | | | |
| | . | . | . | | | |
| 16 | | | 16 | | 16 | |
| | 1.12 m | 0.64 m | | | | |
| 17 | | | 17 | 1.09 m | 17 | 0.63 m |
| | 1.06 m | 0.62 m | | | | |
| 18 | | | 18 | 1.03 m | 18 | 0.61 m |
| | 1.00 m | 0.60 m | | | | |
| 19 | | | 18 | 1.03 m | 18 | 0.61 m |
| | 0.90 m | 0.58 m | | (WARNING) | | (WARNING) |
| 20 | | | LOCK | | 18 | 0.61 m |
| | 0.50 m | 0.40 m | | | | (WARNING) |

When the distance measurement step is more than "19", steps LL10 and LL11 are executed to set flag FGLMPFL to 1 and the lens latch (LL) step to "18". Because only eighteen steps (from "1" to "18") are provided with the lens latch steps, step LL12 is performed to determine whether the macro switch MCRO is ON. If the result of the test is affirmative, the subroutine quits and processing returns to the point in the AEAF CONTROL Operation from which the LL CALCULATION subroutine was called. This is because it is desirable to permit a photograph to be taken, even when a subject is too close for an in-focus picture. However, as flag FGLMPFL has been set to 1, the green lamp indicator D will blink to alert the photographer of this condition.

If the macro switch MCRO is OFF (in step LL12), a test is made of the distance measurement step to determine if it is greater than "20" (step LL13). If it is less than "20", processing returns to the AEAF CONTROL Operation. Hence, when the distance measurement step is "19" in the zoom mode, the green lamp indicator D blinks to warm the operator to switch to the macro mode. However, photographing can be performed by pressing the shutter button 15.

IN step LL14, when the distance measurement step is more than "20", flag FRLOCK is set to 1 before processing returns to the AEAF CONTROL Operation. When the distance measurement step is more than "20", an in-focus photograph cannot be obtained, even if the photograph is taken in the zoom mode. Therefore, the camera is programmed to prevent the taking of such a picture, even if the shutter button is pressed. Accordingly, when the subroutine executes steps LL13 and LL14, the release lock is applied, and the green lamp indicator D blinks. When the LL CALCULATION subroutine is completed, processing returns to the AEAF CONTROL subroutine to perform step AF6.

In the normal photographing mode(zoom mode), even though the release lock is applied, the operator can take a picture if the macro switch set to ON. However, in the macro mode, if the release lock is applied. The operator can not take a picture in any way. It is desirable to permit a photograph to be taken under the above condition if the operator wishes to. Therefore, when the macro switch MCRO is set to ON, the release lock is

AE (AUTO EXPOSURE) CALCULATION subroutine

Figure 33A:
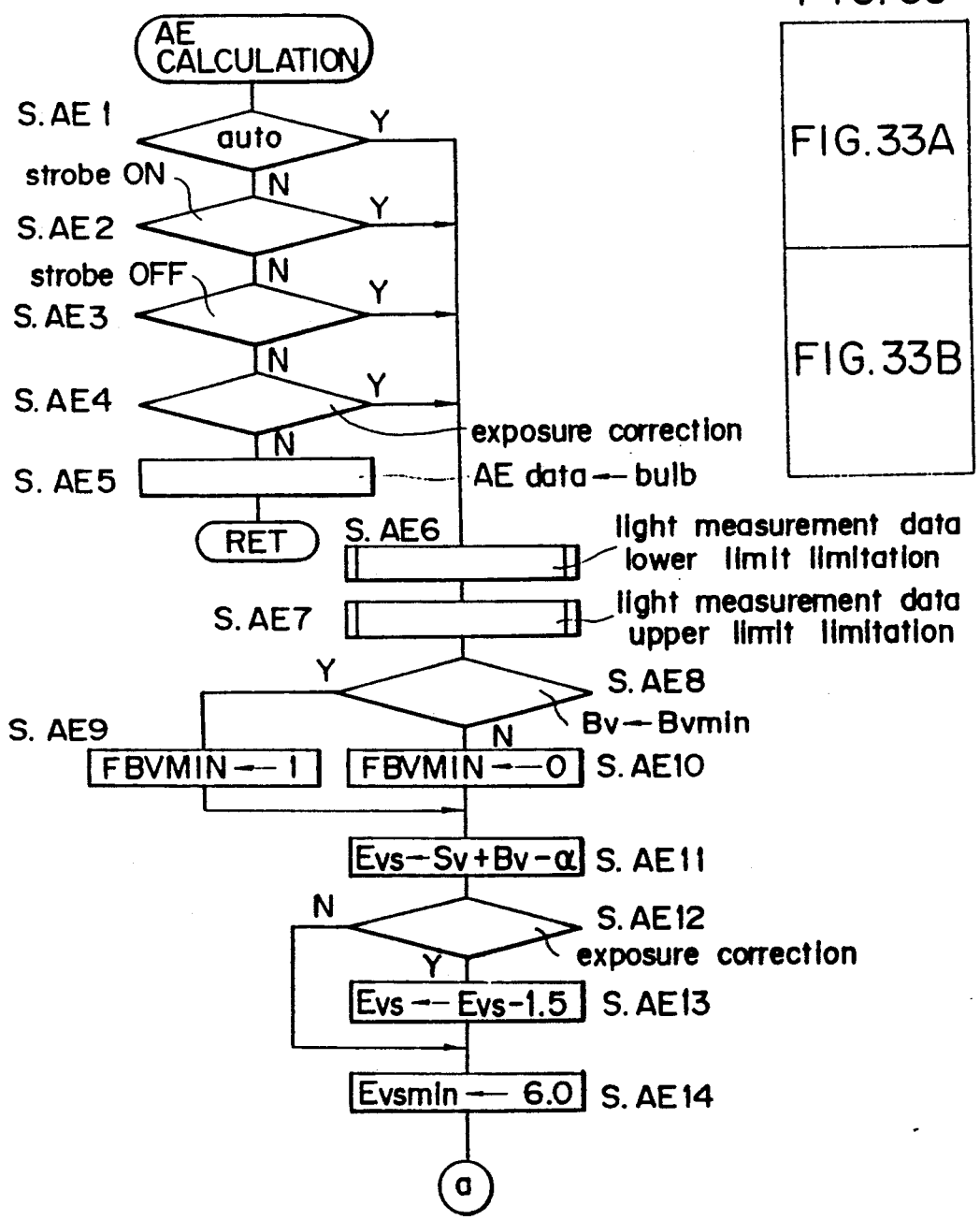
FIGS. 33A and 33B is a flowchart showing an AE(AUTO EXPOSURE CALCULATION) subroutine.
Figure 33B:
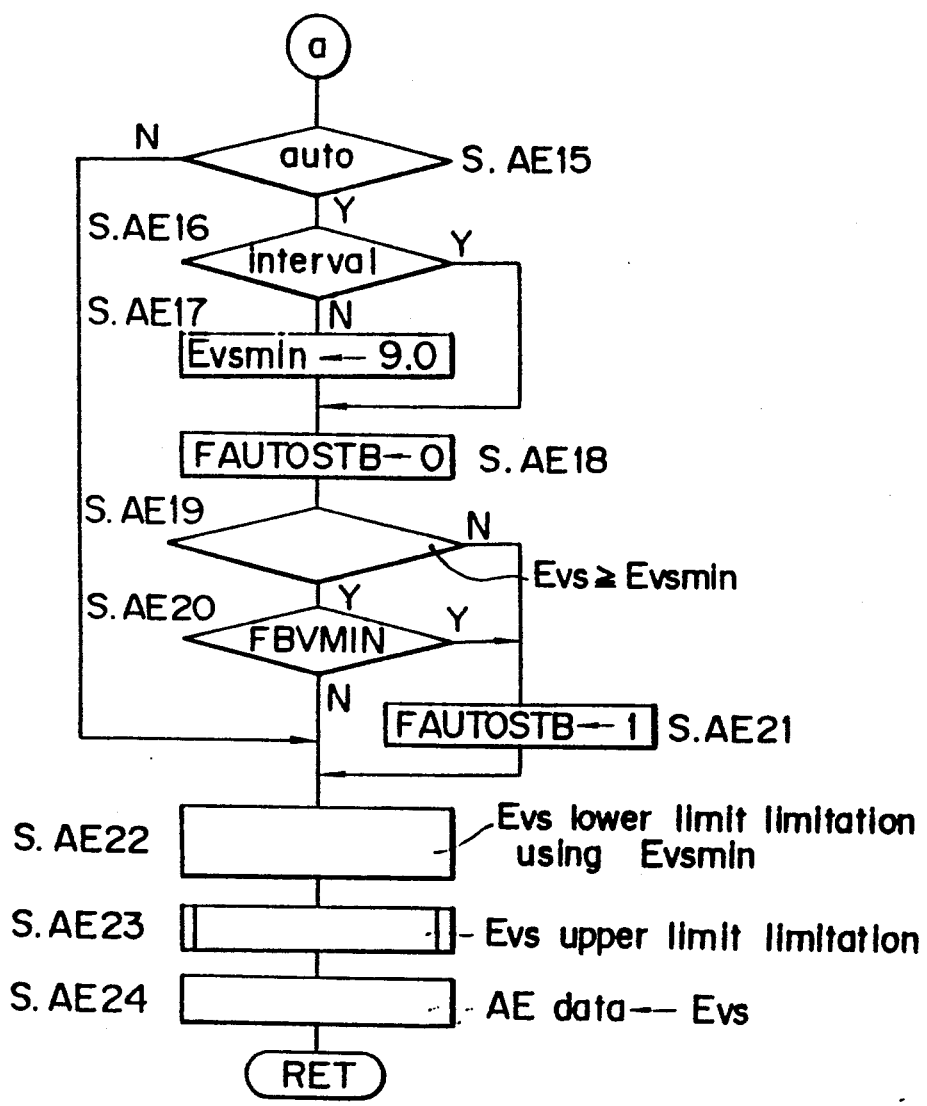

FIG. 33 shows the AE CALCULATION subroutine call in step AF16 of the AEAF CONTROL Operation.

This operation establishes AE data to be outputted to the sub CPU.

In steps AE1~AE4, the exposure mode shown in FIG. 8 is determined. If it includes a bulb, the bulb is established to AE data in step AE5 and then the processing returns to AEAF the CONTROL Operation.

If it is a mode other than the bulb mode, the upper limit and the lower limit of the photometry value are limited in steps AE6 and AE7. In steps AE8~AE10, when the photometry value Bv is equal to the lower value limit, a photometry value lower limit flag FBVMIN is set to 1, but if Br is not equal to the lower value limit, it is set to zero.

In step AE11, the exposure value Evs is calculated from the film sensitivity information Sv, photometry data Bv, and correction value $\alpha$ of the Full-Open Aperture F-number, according to the change of the focal length from the WIDE extremity.

In steps AE12 and AE13, when the camera is in the exposure correction mode, a correction is made in order to obtain a brighter exposure, by deducting 1.5 from the calculated exposure value Evs.

As described in the foregoing, as the interval photographing is usually effected in the state where the camera is fixed to a tripod, etc., there is no fear of a hand shake, even if a slower shutter than that of a normal taking mode is effective.

Therefore, in steps AE14~AE17, the lower limit exposure value Evsmin is set to 6.0 when the exposure mode is other than the auto mode, or when the exposure mode is the auto and the taking mode is the interval. Similarly, Evsmin is set to 9.0 when the exposure mode is auto and the taking mode is other than the interval mode.

If the exposure value Evs is smaller than the exposure lower limit value Evsmin in step AE18~AE21, when the exposure mode is the auto mode or the photometric value is limited at its lowest limit, the automatic strobe emission flag FAUTOSTB is set to 1, so as to emit the strobe light.

Accordingly, if it is not established to the interval mode, the lower limit of the shutter speed is lowered automatically and the chance for emitting the strobe becomes small.

In steps AE22~AE24, the upper and lower limits of the exposure value Evs are limited and the same is returned to AEAF CONTROL Operation by serving the same as AE data.

FM (FLASHMATIC) CALCULATION Subroutine

FIG. 34 shows the FM CALCULATION subroutine called in step AF17 of the AEAF CONTROL Operation.

This operation decides the emission or nonemission of the strobe and the aperture value Avs when the strobe is emitted.

In steps FM1~FM5, the exposure mode returns the FM data to the AEAF CONTROL Operation as "strobe-no emission" when in the strobe OFF mode, exposure compensation mode, and bulb mode, or when in auto mode and the flag FAUTOSTB is set to 0 in the AE CALCULATION subroutine.

In cases other than the above, the aperture value AVs is found from the distance measurement data and the reference guide number in step FM6 and then the aperture value Avs is corrected in view of the information of the charged voltage DGV in step FM7 the reason is that as the guide number is established with reference to the full charge time of the strobe condenser, unless the guide number is lowered when the exposure is low, the exposure becomes under-exposed.

In step FM8, the aperture value Avs is added with the film sensitivity information Sv and in steps FM9 and FM10, the changing amount ZGDV, caused by zooming of the strobe itself, is added when it is in the zoom area. The reason is that a light projecting angle of the strobe 6 is changed according to an angle of view which is changed by the zooming of the taking lens.

Furthermore, in FM11, the changing amount α of the Full-open Aperture F-number based on the focal length of the lens is deducted from the aperture value Avs.

In steps FM12~FM14, the upper limit and the lower limit of the aperture value Avs are limited and the charge request flag FCHGRQ is set to 1, based on the result of the voltage check operation called in step AF6 of the AEAF CONTROL Operation when the voltage of the strobe condenser is 270 V or less. Processing is then returned to the point from which this subroutine was called.

CHARGE OPERATION

Figure 35:
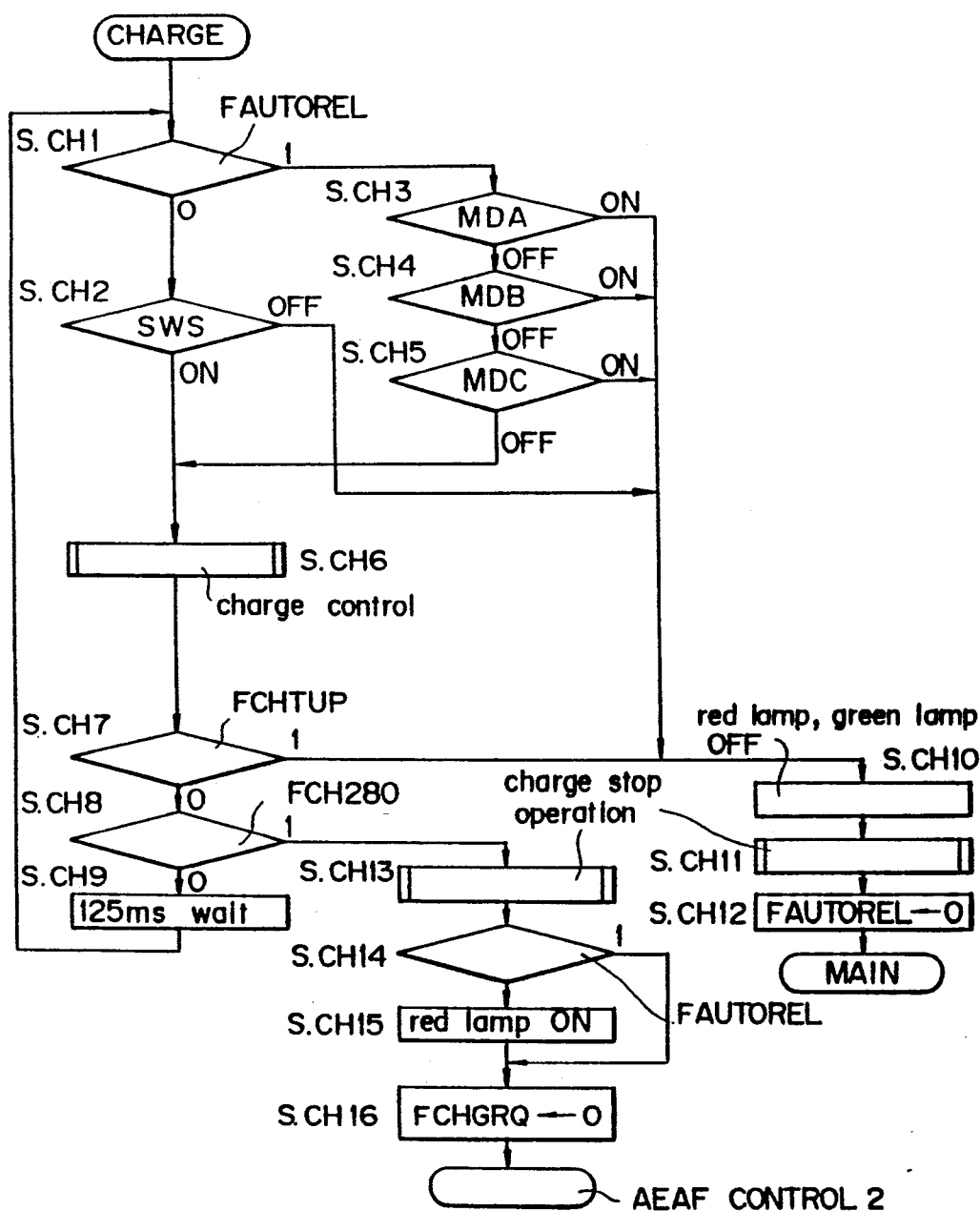
FIG. 35 is a flowchart showing a CHARGE Operation.

FIG. 35 shows the charging operation that diverges from steps AF23 and AF24 of the AEAF CONTROL Operation.

Steps CH1~CH9 form a loop for repeatedly executing the charging control at a cycle of 125 ms. The operation can be escaped from the loop when it is determined that the time is up or the strobe is to be charged to a voltage of 280 V or more from the charge time up flag FCHTUP and 280 V charged flag FCH280 erected during the charge control operation in step CH6.

In the case of an automatic photograph in an interval mode, etc., processing can be escaped to step CH10 by turning on a selected one of the mode switches (mode button A, mode button B and clear button C, when the mode is not an automatic photograph processing can be escaped when the operator's finger is removed from the shutter button.

Even when the charged voltage does not reach 280 V within a predetermined time and the timer is up, processing can can be escaped from the charging operation. In such a case, escape, the red and green lamps are turned OFF (steps CH10~CH12) and a charging stop operation is effected. Thereafter, processing jumps to the MAIN Operation.

When the charged voltage reaches 280 V before the timer is up, processing goes to steps CH14~CH16, via step CH13 where the red lamp is illuminated 18 when the mode is not the automatic photographing mode, so as to indicate that the preparation for a strobe emission is over. After charge request flag FCHGRQ is cleared, processing jumps to the AEAF control 2. When processing enters to the AEAF control from this operation, as described above, the photometry, distance measurement, etc. are omitted and calculation is effected using the preceding data.

The voltage checking at the time when the charging is undergoing is effected with reference to 280 V and the voltage checking after charging operation is effected with reference to 270 V. The reason is that a voltage drop, due to the stopping of the charging operation, noise, etc. are taken into consideration.

MANUAL SHUTTER TIME COUNT subroutine

FIG. 36 shows the MANUAL SHUTTER TIME COUNT subroutine called in step AF77 of the AEAF CONTROL Operation.

When the manual shutter is established, the shutter speed can be changed in accordance with the correlation of Table 2. At this time, as the aperture is controlled in such a manner as to be full opened, the exposure is decided by the shutter speed and the Full-open Aperture F-number.

However, such established shutter speed is decided with reference to the Full-open Aperture F-number when the taking lens is set to the WIDE extremity, and when the focal length of the lens is changed, the same exposure cannot be obtained at the same shutter speed.

In view of the above, therefore, in this camera, the shutter speed, which has been established with reference to the WIDE extremity is controlled such that the shutter speed is again established in accordance with the focal length of the lens in order to obtain the same exposure.

The correlation of the re-establishment is as shown in FIG. 5. In the Table, α denotes the changing amount of the Full-open Aperture F-number, and D1 denotes the content n(1~7) of the MODBLB, and D2 denotes the display on the LCD panel.

TABLE 5

| D1 | D2 | WIDE ← | | | α → | | UNIT:SECOND TELE/MACRO | |
|----|----|----|----|----|----|----|----|----|
|    |    | 1/4 | 2/4 | 3/4 | 4/4 | 5/4 | 6/4 | 7/4 |
| 1 | 1 | 1 | 1.25 | 1.5 | 1.75 | 2 | 2.25 | 2.5 |
| 2 | 2 | 2 | 2.5 | 3 | 3.5 | 4 | 4.5 | 5 |
| 3 | 4 | 4 | 5 | 6 | 7 | 8 | 9 | 10 |
| 4 | 8 | 8 | 10 | 12 | 14 | 16 | 18 | 20 |
| 5 | 15 | 16 | 20 | 24 | 28 | 32 | 36 | 40 |
| 6 | 30 | 32 | 40 | 48 | 56 | 64 | 72 | 80 |
| 7 | 60 | 64 | 80 | 96 | 112 | 128 | 144 | 160 |

The shutter speed shown in Table 5 is decided in accordance with the following relation:

$$\text{shutter speed} = 0.25 \times 2(n-1) \times (4\alpha + 3)$$

The flowchart of FIG. 36 counts this shutter speed.

In FIG. 36, steps MS1~MS5 are a procedure for finding 2(n−1) and putting the same into Tn. A product of Tn, found by this and Tα found in step MS6 is found in step MS7, and this value is set in the counter MTCNT.

Steps MS8~MS10 are a loop for deducting the value of the counter MTCNT at a cycle of 250 ms. By counting until MTCNT becomes equal to 0, the shutter speed decided by the above relation can be counted.

In this way, as the shutter speed is re-established such that the exposure value becomes constant, even if the focal length is changed, it is not necessary to re-establish the shutter speed every time the focal length is changed.

WIND OPERATION

FIG. 37 shows a wind operation to which processing goes after the AEAF CONTROL Operation is finished.

The wind operation is a procedure for winding the film by one frame after the photographing operation is finished. When processing begins the wind operation, the frame number is displayed on the LCD panel, excluding the interval mode in steps WD1 and WD2. In the case of a multiple photographing operation, the operation diverges from step WD3 to step WD4, where the taking mode is returned to the one frame taking mode. Processing then jumps to the MAIN Operation. That is, the multiple photographing operation is cleared per each shooting.

When the taking mode is other than the multiple photographing mode, one frame is wound in step WD5. If the winding operation is not finished within a predetermined time, processing diverges from step WD6 to step WD7 where the auto release flag FAUTOREL is cleared before processing goes to the wind operation, as described above.

When the winding operation is finished, the frame number counter is incremented in step WD8, and a new number is displayed in steps WD9 and WD10 when the mode is not the interval mode. In this way, the frame number is not displayed when the mode is the interval mode. Rather, a remaining time available until the releasing operation is displayed during the interval photographing operation, as will be described hereinafter.

In steps WD11~WD15, a diverging destination after the winding operation is decided in accordance with the established photographing mode.

When the camera is in a continuous photographing mode and the shutter button is kept depressed, processing jumps to AEAF control 3 of FIG. 29 to continue the exposing sequence. If the shutter button is not depressed processing jumps to the MAIN Operation.

Next, when the camera is in the double self mode, processing jumps the AEAF control at the point in time when the first shooting is finished. Processing then jumps to the MAIN Operation when the second shooting is finished.

When in the interval mode, processing jump to the INTERVAL CONTROL Operation of FIG. 38, and jumps to the MAIN Operation when in any other mode, that is, when in the frame shooting mode or self timer mode.

INTERVAL CONTROL Operation

FIG. 38 shows the INTERVAL CONTROL Operation to which the processing moves from step WD15 of the above-mentioned WIDE Operation. This operation is a procedure for waiting while counting time until the second shooting downward arrives when the photographing mode is set to the INTERVAL mode. When the camera is set to any mode other than INTERVAL, the operation is usually looped within MAIN Operation. However, when is in the INTERVAL mode, it is looped between the AEAF CONTROL Operation and the INTERVAL CONTROL Operation without going through the MAIN Operation.

When it enters into this operation, both the charge request FCHGRQ and charge request flag memory flag FCHGRQM are cleared in step IN1.

Figure 25:
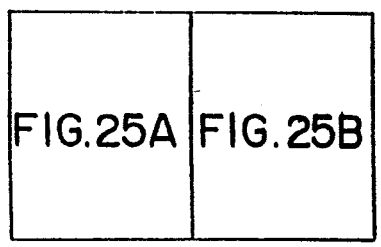

In steps IN2 and IN3, the INTERVAL number is decreased and a determination is made as to whether it becomes equal to 0. The initial value of this count is 40 as set in step AF62 of the AEAF CONTROL Operation. When the 40 frames are finished, it executes the charge stop operation and the auto release flag FAUTOREL is cleared in steps IN4~IN6. Thereafter the MODE INITIALIZING Operation of FIG. 25 is called, and processing jumps to the MAIN Operation.

When the count number is not equal to zero frames, processing loops through steps IN7~IN21, at a cycle of 125 ms and waits for the next photographing operation. In the meantime, when either the mode switch or the clear switch is turned ON, it initializes the mode and jumps to the MAIN Operation.

When in this loop, the deduction display of the timer is normally performed. However, when the photometric switch SWS is turned ON, the frame number is displayed. when the wide switch of the zoom is turned ON the focal length is displayed.

When the remaining time becomes 16 seconds or less, both FCHGRQ and FCHGRQM are set to 1 in step IN18. This timer is set and started in step AF60 of the AEAF CONTROL Operation.

In the charge control operation in step IN20, the charging operation is effected when FCHGRQ is 1 and skipped when it is 0. This flag is cleared when the charging operation is finished.

Therefore, when it circles around the loop of steps IN17~IN20, the charging operation is forcefully started in the first loop. When a sufficient charge is detected, the charging operation is stopped and the CHARGE CONTROL Operation is skipped from the next loop.

When the remaining time becomes within 4 seconds, processing diverges from step IN19, the charging operation is stopped and the remaining time of the timer is displayed in steps IN22 and IN23. Then, processing jumps to the AEAF CONTROL Operation of FIG. 29 and waits for the time-up in steps AF44~AF54 of that procedure.

What is claimed is:

1. An electronically controlled camera having a zoom function for changing a focal length of a taking lens and a manual function able to select a shutter speed by a manual operation when said camera is in a manual mode, said electronically controlled camera further having a shutter speed automatic changing apparatus for automatically changing said shutter speed in a direction for reducing a changing amount of a Full-open Aperture F-number which is changed in accordance with the change of the focal length of said lens so that an exposure value becomes equal to a predetermined value in accordance with a reference shutter speed at a time when said reference shutter speed is selected in said manual mode and said focal length of said lens is changed by said zoom function.

2. An electronically controlled camera according to claim 1, wherein said shutter speed automatic changing apparatus includes:
   means for detecting said focal length of a zoom lens;
   means for calculating said changing amount of said Full-open Aperture F-number of said zoom lens from said focal length;
   means for calculating said shutter speed from said changing amount of said Full-open Aperture F-number; and
   means for changing said reference shutter speed to said shutter speed calculated by said shutter speed calculating means.

3. An electronically controlled camera according to claim 2, wherein said focal length detecting means includes a cam plate mounted on a cam barrel for driving said zoom lens.

4. An electronically controlled camera according to claim 1, wherein said reference shutter speed is established with reference to said Full-open Aperture F-number when said zoom lens is located in a wide end.

5. An electronically controlled camera according to claim 2, wherein said reference shutter speed is established with reference to said Full-open Aperture F-number when said zoom lens is located in a wide end.

6. The electronically controlled camera of claim 1, wherein said camera comprising a lens shutter camera.

7. The electronically controlled camera according to claim 1, said camera comprising a bulb mode, and wherein manual setting of a shutter speed is effective in said bulb mode.

8. An electronically controlled camera having a zooming function and a manual operation function for selecting a shutter speed by a manual operation, said camera comprising:
   means for manually setting a shutter speed as a reference value with respect to a predetermined focal length;
   means for memorizing at least one correction value for said shutter speed, said correction value corresponding to the difference between said predetermined focal length and a current focal length; and
   means for changing said shutter speed, set by said manual setting means, based on said correction value from said memorizing means.

9. An electronically controlled camera comprising:
   means for manually setting a shutter speed; and
   means for changing said shutter speed in accordance with a current focal length, so that an exposure value for which said shutter speed is set by said setting means, for a predetermined focal length, is equal to the exposure value for said current focal length.

10. An electronically controlled camera comprising:
   means for manually setting a shutter speed; and
   means for changing said shutter speed in accordance with the setting of a focal length.

* * * * *

UNITED STATES PATENT AND TRADEMARK OFFICE
CERTIFICATE OF CORRECTION

PATENT NO. : 5,146,259
DATED : September 8, 1992
INVENTOR(S) : T. KOBAYASHI et al.

It is certified that error appears in the above-indentified patent and that said Letters Patent is hereby corrected as shown below:

At column 35, line 24 (claim 4, line 4) change "in" to ---at---.

Signed and Sealed this

Seventeenth Day of October, 1995

BRUCE LEHMAN

Attest:

Attesting Officer

Commissioner of Patents and Trademarks